US010910388B2

(12) United States Patent
Fukuda et al.

(10) Patent No.: US 10,910,388 B2
(45) Date of Patent: Feb. 2, 2021

(54) SEMICONDUCTOR STORAGE DEVICE

(71) Applicant: Toshiba Memory Corporation, Tokyo (JP)

(72) Inventors: Natsuki Fukuda, Yokkaichi Mie (JP); Satoshi Nagashima, Yokkaichi Mie (JP); Tetsu Morooka, Yokkaichi Mie (JP); Noritaka Ishihara, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 16 days.

(21) Appl. No.: 16/518,030

(22) Filed: Jul. 22, 2019

(65) Prior Publication Data

US 2020/0286902 A1    Sep. 10, 2020

(30) Foreign Application Priority Data

Mar. 8, 2019 (JP) ................................. 2019-043121

(51) Int. Cl.
| | |
|---|---|
| *H01L 27/11524* | (2017.01) |
| *H01L 27/11556* | (2017.01) |
| *H01L 27/1157* | (2017.01) |
| *H01L 27/11582* | (2017.01) |
| *H01L 29/06* | (2006.01) |
| *H01L 21/311* | (2006.01) |
| *H01L 21/764* | (2006.01) |
| *H01L 21/28* | (2006.01) |

(52) U.S. Cl.
CPC ... *H01L 27/11524* (2013.01); *H01L 21/31111* (2013.01); *H01L 21/31144* (2013.01); *H01L 21/764* (2013.01); *H01L 27/1157* (2013.01); *H01L 27/11556* (2013.01); *H01L 27/11582* (2013.01); *H01L 29/0649* (2013.01); *H01L 29/40114* (2019.08); *H01L 29/40117* (2019.08)

(58) Field of Classification Search
None
See application file for complete search history.

(56) References Cited

U.S. PATENT DOCUMENTS

| | | | |
|---|---|---|---|
| 8,338,876 | B2 | 12/2012 | Kito et al. |
| 8,722,525 | B2 | 5/2014 | Sinha |
| 8,766,446 | B2 | 7/2014 | Kuge et al. |
| 9,177,966 | B1 | 11/2015 | Rabkin et al. |
| 9,484,353 | B1 | 11/2016 | Lai et al. |
| 2012/0231593 | A1 | 9/2012 | Joo et al. |
| 2016/0336336 | A1 | 11/2016 | Nagashima et al. |
| 2020/0286902 | A1* | 9/2020 | Fukuda ............. H01L 29/40117 |

* cited by examiner

*Primary Examiner* — Robert K Carpenter
(74) *Attorney, Agent, or Firm* — Foley & Lardner LLP

(57) ABSTRACT

According to one embodiment, a semiconductor storage device includes a first charge storage part, a first insulating part, a second charge storage part, a second insulating part, a first select transistor, and a hollow part. The first charge storage part is at a first position separated from a surface of a substrate by a first distance in a third direction. The first select transistor is at a second position separated from the surface of the substrate by a second distance in the third direction. The second distance is greater than the first distance. The hollow part is up to a third position in the third direction separated from the surface of the substrate by a third distance in the third direction. The third distance is greater than or equal to the first distance and shorter than or equal to the second distance.

20 Claims, 57 Drawing Sheets

SEMICONDUCTOR STORAGE DEVICE

CROSS-REFERENCE TO RELATED APPLICATION

This application is based upon and claims the benefit of priority from Japanese Patent Application No. 2019-043121, filed Mar. 8, 2019; the entire contents of which are incorporated herein by reference.

FIELD

Embodiments described herein relate generally to a semiconductor storage device.

BACKGROUND

Semiconductor storage devices, each of which includes a laminate in which insulating films and word lines are alternately laminated and semiconductor pillars that pass through the laminate body, are proposed. Incidentally, a further improvement in electrical characteristics of the semiconductor storage devices is expected.

DETAILED DESCRIPTION OF THE INVENTION

Figure 1:
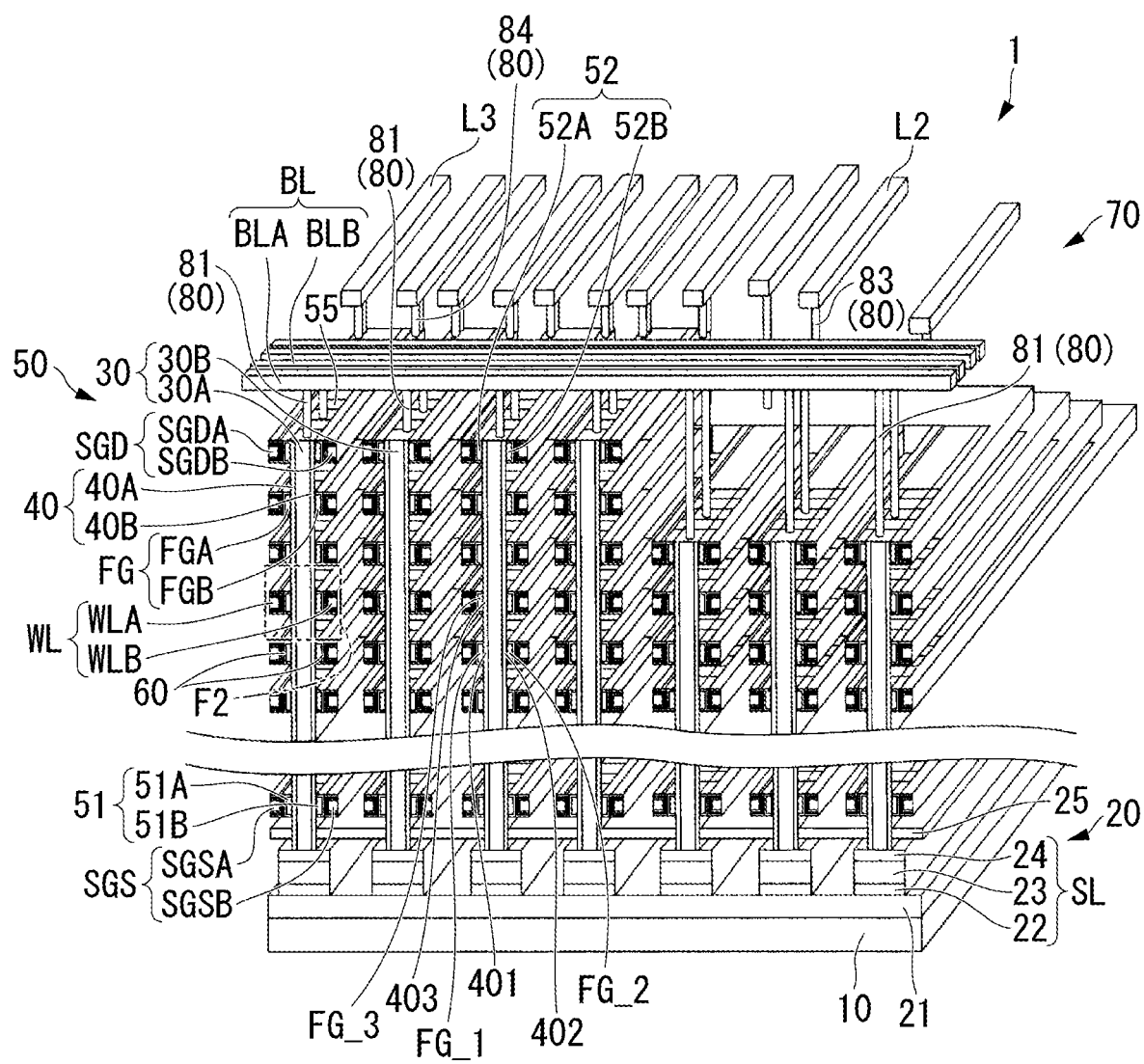
FIG. 1 is a perspective view illustrating a constitution of a semiconductor storage device of a first embodiment.
Figure 1:
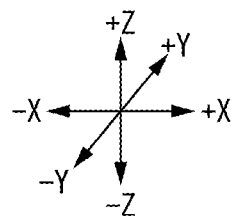

According to one embodiment, a semiconductor storage device includes a substrate, a first interconnection, a second interconnection, a first channel part, a second channel part, a first charge storage part, a first insulating part, a second charge storage part, a second insulating part, a first select transistor, a second select transistor, and a hollow part. The first interconnection extends in a first direction. The second interconnection extends in the first direction. The second interconnection is adjacent to the first interconnection in a second direction. The second direction intersects the first direction. The first channel part is between the first interconnection and the second interconnection. The first channel part extends in a third direction. The third direction intersects the first direction and the second direction. The second channel part is between the first interconnection and the second interconnection. The second channel part is adjacent to the first channel part in the second direction. The second channel part extending in the third direction. The first charge storage part is at a first position separated from a surface of the substrate by a first distance in the third direction. The first charge storage part is between the first interconnection and the first channel part. The first insulating part is between the first charge storage part and the first channel part. The second charge storage part is between the second interconnection and the second channel part. The second insulating part is between the second charge storage part and the second channel part. The first select transistor is at a second position separated from the surface of the substrate by a second distance in the third direction. The second distance is greater than the first distance. The second select transistor is above the second charge storage part in the third direction. The hollow part is between the first channel part and the second channel part. The hollow part is up to a third position separated from the surface of the substrate by a third distance in the third direction. The third distance is greater than or equal to the first distance and shorter than or equal to the second distance.

Hereinafter, semiconductor storage devices of the embodiments will be described with reference to the drawings. In the following description, the same reference signs are given to components having the same or similar function. Duplicate description of these components may be omitted. The drawings are schematic or conceptual, and a relationship between a thickness and a width of each portion, ratios of sizes between portions, etc. are not necessarily the same as the reality.

In this specification, the term "connect" is not limited to a case of physical connection, and also includes a case of electrical connection. That is, the term "connect" is not limited to a case where two members are in contact with each other each other, and also includes a case where another member is interposed between the two members. The term "face" is not limited to a case where two members are directly opposite to each other, and also includes a case where another member is interposed between the two members. Further, the term "face" also includes a case where parts of two members are opposite to each other. The phrase "XX is above YY" is not limited to a case where XX is in contact with YY, and also includes a case where another member is interposed between XX and YY. The terms "ring shape" and "annulation shape" are not limited to a circular ring shape, and also includes a rectangular ring shape. In this specification, the term "adjacent to" is not limited to a case where two members are in contact with each other, and also includes a case where another member is interposed between the two members.

Further, an +X direction, an −X direction, a +Y direction, a −Y direction, a +Z direction, and a −Z direction will be defined in advance. The +X direction, the −X direction, the +Y direction, and the −Y direction are directions that are parallel to a surface of a silicon substrate 10 (to be described below). The +X direction is a direction in which bit lines BL (to be described below) extend. The −X direction is a direction opposite to the +X direction. When the +X direction and the −X direction are not distinguished, they are referred to simply as "X direction." The +Y direction and the −Y direction are directions that intersect (e.g., are substantially orthogonal to) the X direction. The +Y direction is a direction in which word lines WL (to be described below) extend. The −Y direction is a direction opposite to the +Y direction. When the +Y direction and the −Y direction are not distinguished, they are referred to simply as "Y direction." The +Z direction and the −Z direction are directions that intersect (e.g., are substantially orthogonal to) the X direction and the Y direction, and are a thickness direction of the silicon substrate 10. The +Z direction is a direction that is directed to a laminate 50 (to be described below) from the silicon substrate 10. The −Z direction is a direction opposite to the +Z direction. When the +Z direction and the −Z direction are not distinguished, they are referred to simply as "Z direction." In this specification, the "+Z direction" may be referred to "up," and the "−Z direction" may be referred to "down." However, these expressions are for the sake of convenience, and do not regulate a gravitational direction. The +Y direction is an example of the "first direction." The +X direction is an example of the "second direction." The +Z direction is an example of the "third direction."

First Embodiment

<1. Overall Constitution of Semiconductor Storage Device>

First, an overall constitution of a semiconductor storage device 1 of a first embodiment will be described. The semiconductor storage device 1 is a non-volatile semiconductor storage device, for example, a NAND type flash memory.

FIG. 1 is a perspective view illustrating a constitution of a semiconductor storage device 1. The semiconductor storage device 1 includes, for example, a silicon substrate 10, a lower structure 20, a plurality of pillars (columnar members) 30, tunnel insulating films 40, a laminate 50, an upper structure 70, and a plurality of contacts 80.

The silicon substrate 10 is a substrate that is a base of the semiconductor storage device 1. At least a part of the silicon substrate 10 is formed in a plate shape that is parallel to the X direction and the Y direction. The silicon substrate 10 is formed of, for example, a semiconductor material including silicon (Si). The silicon substrate 10 is an example of the "substrate."

The lower structure 20 is provided above the silicon substrate 10. The lower structure 20 include, for example, a lower insulating film 21, a plurality of source lines SL, an upper insulating film 25, and an insulating member 26 (see FIG. 3). The lower insulating film 21 is provided above the silicon substrate 10. The plurality of source lines SL are provided above the lower insulating film 21. The plurality of source lines SL are adjacent to one another in the X direction, and each extend in the Y direction. The source lines SL are each formed of, for example, a conductive layer 22 provided above the lower insulating film 21, an interconnection layer 23 provided on the conductive layer 22, and a conductive layer 24 provided on the interconnection layer 23. The upper insulating film 25 is provided above the plurality of source lines SL. The insulating member 26 is provided between the source lines SL and the upper insulating film 25 and between the lower insulating film 21 and the upper insulating film 25.

Next, the plurality of pillars 30, the tunnel insulating films 40, and the laminate 50 will be described.

The plurality of pillars 30 are provided on the source lines SL, and each extend in the Z direction. The plurality of pillars 30 are provided away from one another in the X direction and the Y direction. For example, when viewed in the Z direction, the plurality of pillars 30 are arranged in a matrix in the X direction and the Y direction. Each pillar 30 includes a semiconductor material such as amorphous silicon (a-Si). For this reason, the pillars 30 may be referred to as silicon pillars. Lower ends of the pillars 30 pass through the upper insulating film 25 of the lower structure 20, and are connected to the source lines SL. A structure of each pillar 30 will be described below in detail.

The tunnel insulating films 40 are at least provided along lateral surfaces of the pillars 30 in the −X direction and the +X direction. In the present embodiment, the tunnel insulating films 40 are formed in a ring shape that surrounds lateral surfaces of the pillars 30 in the −X direction, the +X direction, the −Y direction, and the +Y direction. The tunnel insulating films 40 extend in the Z direction, for example, over entire lengths (whole heights) of the pillars 30 in the Z direction.

The tunnel insulating films 40 are films which typically have insulation properties but through which a tunneling current flows when a prescribed voltage within a range of a driving voltage of the semiconductor storage device 1 is applied. The tunnel insulating films 40 are formed of, for example, silicon oxide. Hereinafter, portions of the tunnel insulating films 40 which are provided on sides of the pillars 30 in the −X direction are referred to as "first tunnel insulating films 40A," and portions of the tunnel insulating films 40 which are provided on sides of the pillars 30 in the +X direction are referred to as "second tunnel insulating films 40B." The first tunnel insulating films 40A are provided between a plurality of first floating gate electrodes FGA (to be described below) arranged in the Z direction and first channel parts 31A (to be described below). The second tunnel insulating films 40B are provided between a plurality of second floating gate electrodes FGB (to be described below) arranged in the Z direction and second channel parts 31B (to be described below).

The laminate 50 is provided above the lower structure 20. The laminate 50 includes, for example, a plurality of floating gate electrodes FG, a plurality of word lines WL, a plurality of source-side select gate electrodes 51, a plurality of source-side select gate lines SGS, a plurality of drain-side select gate electrodes 52, a plurality of drain-side select gate lines SGD, a plurality of block insulating films 60, insulating films (interlayer insulating films) 54 (see FIG. 3), insulating members 55, and insulating members 56 (see FIG. 34).

The floating gate electrodes FG are electrode films that are provided at sides of the pillars 30. The plurality of floating gate electrodes FG include the plurality of first floating gate electrodes FGA that are located on the sides of the pillars 30 in the −X direction, and the plurality of second floating gate electrodes FGB that are located on the sides of the pillars 30 in the +X direction. The plurality of first floating gate electrodes FGA are provided away from one another in the Z direction. The first floating gate electrodes FGA are located on sides opposite to the pillars 30 with respect to the first tunnel insulating films 40A. Similarly, the plurality of second floating gate electrodes FGB are provided away from one another in the Z direction. The second floating gate electrodes FGB are located on sides opposite to the pillars 30 with respect to the second tunnel insulating films 40B. The floating gate electrodes FG are films that have a capacity to store electric charge. The floating gate electrodes FG are formed of, for example, polysilicon. Each floating gate electrode FG is an example of a "charge storage part."

The word lines WL are interconnections that are provided at the sides of the pillars 30. The plurality of word lines WL include a plurality of first word lines WLA that are located on the sides of the pillars 30 in the −X direction, and a plurality of second word lines WLB that are located on the sides of the pillars 30 in the +X direction. The plurality of first word lines WLA are provided away from one another in the Z direction. Similarly, the plurality of second word lines WLB are provided away from one another in the Z direction. The first word lines WLA and the second word lines WLB are adjacent to each other in the X direction, and extend in the Y direction. The first word lines WLA are located on sides opposite to the pillars 30 with respect to the first floating gate electrodes FGA. The second word lines WLB are located on sides opposite to the pillars 30 with respect to the second floating gate electrodes FGB. In other words, the first floating gate electrodes FGA are provided between the first word lines WLA and the pillars 30. The second floating gate electrodes FGB are provided between the second word lines WLB and the pillars 30. The first word lines WLA and the second word lines WLB are led out, for example, in directions opposite to each other in the Y direction, and are controlled independently of each other.

In a case where the word lines WL inject electrons into the floating gate electrodes FG and pull the electrons injected into the floating gate electrodes FG out of the floating gate electrodes FG, voltages are applied by a drive circuit (not shown), and a prescribed voltages are applied to the floating gate electrodes FG connected to the word lines WL. The first floating gate electrodes FGA change a stored state of electrons in a case where voltages are applied by the first word lines WLA. On the other hand, the second floating gate electrodes FGB change a stored state of electrons in a case where voltages are applied by the second word lines WLB. A constitution of the word lines WL will be described below in detail.

The above constitution can be expressed as follows (see FIG. 1). That is, one of the plurality of first floating gate electrodes FGA which corresponds to a certain pillar 30 is referred to as "floating gate electrode FG_1." The second floating gate electrode FGB disposed at the same position as the "floating gate electrode FG_1" in the Z direction is referred to as "floating gate electrode FG_2." The single first floating gate electrode FGA provided at a position away from the floating gate electrode FG_1 in the Z direction is referred to as "floating gate electrode FG_3." The floating gate electrode FG_1 is an example of a "first charge storage part." The floating gate electrode FG_2 is an example of a "second charge storage part." The floating gate electrode FG_3 is an example of a "third charge storage part." Further, the first word line WLA connected to the floating gate electrode FG_1 is an example of a "first interconnection." The second word line WLB connected to the floating gate electrode FG_2 is an example of a "second interconnection." The first word line WLA connected to the floating gate electrode FG_3 is an example of a "third interconnection."

Each tunnel insulating film 40 includes, at least, a first portion 401 located between the floating gate electrode FG_1 and the pillar 30, a second portion 402 located between the floating gate electrode FG_2 and the pillar 30, and a third portion 403 located between the floating gate electrode FG_3 and the pillar 30. The first portion 401 is an example of a "first insulating part," and is an example of a "first insulating material." The second portion 402 is an example of a "second insulating part," and is an example of a "second insulating material."

The source-side select gate electrodes 51 are electrode films that are provided at the sides of the pillars 30. The plurality of source-side select gate electrodes 51 include first source-side select gate electrodes 51A located on the sides of the pillars 30 in the −X direction, and second source-side select gate electrodes 51B located on the sides of the pillars 30 in the +X direction. The first source-side select gate electrodes 51A are located on sides opposite to the pillars 30 with respect to the first tunnel insulating films 40A. The second source-side select gate electrodes 51B are located on sides opposite to the pillars 30 with respect to the second tunnel insulating films 40B. The source-side select gate electrodes 51 are provided between the silicon substrate 10 and the floating gate electrodes FG that are closest to the silicon substrate 10 among the plurality of floating gate electrodes FG corresponding to the same pillars 30.

The source-side select gate lines SGS are interconnections that are provided at the sides of the pillars 30. The plurality of source-side select gate lines SGS include first source-side select gate lines SGSA located on the sides of the pillars 30 in the −X direction, and second source-side select gate lines SGSB located on the sides of the +X direction. The first source-side select gate lines SGSA are located on sides opposite to the pillars 30 with respect to the first source-side select gate electrodes 51A. The second source-side select gate lines SGSB are located on sides opposite to the pillars 30 with respect to the second source-side select gate electrodes 51B. The source-side select gate lines SGS extend in the Y direction. In a case where the source-side select gate lines SGS perform conduction between the pillars 30 and the source lines SL, a voltage is applied by the drive circuit (not shown), and a prescribed voltage is applied to the source-side select gate electrodes 51 connected to the source-side select gate lines SGS. The source-side select gate lines SGS are located between the silicon substrate 10 and the word lines WL that are closest to the silicon substrate 10 among the plurality of word lines WL corresponding to the same pillars 30. Each source-side select gate line SGS is an example of a "first select gate interconnection."

In the present embodiment, the source-side select gate lines SGS and the source-side select gate electrodes 51 are collectively called select transistors. The select transistors may not include the source-side select gate electrodes 51. For example, the select transistor provided below each first floating gate electrode FGA is an example of a "third select transistor." The select transistor provided below each second floating gate electrode FGB is an example of a "fourth select transistor."

The drain-side select gate electrodes 52 are electrode films that are provided at the sides of the pillars 30. The plurality of drain-side select gate electrodes 52 include first drain-side select gate electrodes 52A located on the sides of the pillars 30 in the −X direction, and second drain-side select gate electrodes 52B located on the sides of the pillars 30 in the +X direction. The first drain-side select gate electrodes 52A are located on sides opposite to the pillars 30 with respect to the first tunnel insulating films 40A. The second drain-side select gate electrodes 52B are located on sides opposite to the pillars 30 with respect to the second tunnel insulating films 40B. The drain-side select gate electrodes 52 are located farther from the silicon substrate 10 than the floating gate electrodes FG that are farthest from the silicon substrate 10 among the plurality of floating gate electrodes FG corresponding to the same pillars 30.

The drain-side select gate lines SGD are interconnections that are provided at the sides of the pillars 30. The plurality of drain-side select gate lines SGD include first drain-side select gate lines SGDA located on the sides of the pillars 30 in the −X direction, and second drain-side select gate lines SGDB located on the sides of the pillars 30 in the +X direction. The first drain-side select gate lines SGDA are located on sides opposite to the pillars 30 with respect to the first drain-side select gate electrodes 52A. The second drain-side select gate lines SGDB are located on sides opposite to the pillars 30 with respect to the second drain-side select gate electrodes 52B. The drain-side select gate lines SGD extend in the Y direction. In a case where the drain-side select gate lines SGD perform conduction between the pillars 30 and the bit lines BL (to be described below), a voltage is applied by the drive circuit (not shown), and a prescribed voltage is applied to the drain-side select gate electrodes 52 connected to the drain-side select gate lines SGD. The drain-side select gate lines SGD are located farther from the silicon substrate 10 than the word lines WL that are farthest from the silicon substrate 10 among the plurality of word lines WL corresponding to the same pillars 30. That is, the drain-side select gate lines SGD are located on sides opposite to the silicon substrate 10 with respect to the plurality of word lines WL corresponding to the same pillars 30. Each drain-side select gate line SGD is an example of a "second select gate interconnection."

In the present embodiment, the drain-side select gate lines SGD and the drain-side select gate electrodes 52 are collectively called select transistors. The select transistors may not include the drain-side select gate electrodes 52. For example, the select transistor provided above each first floating gate electrode FGA is an example of a "first select transistor." The select transistor provided above each second floating gate electrode FGB is an example of a "second select transistor."

The block insulating films 60 are provided between the floating gate electrodes FG and the word lines WL, between the source-side select gate electrodes 51 and the source-side select gate lines SGS, and between the drain-side select gate electrodes 52 and the drain-side select gate lines SGD. The block insulating films 60 are films that substantially allow no current to flow even if a voltage is applied within a range of a driving voltage of the semiconductor storage device 1. A constitution of the block insulating films 60 will be described below in detail.

The insulating films 54 (see FIG. 3) that are interlayer insulating films are provided between the plurality of floating gate electrodes FG and between the plurality of word lines WL in the Z direction. That is, the insulating films 54 and the floating gate electrodes FG are alternately laminated in the Z direction. The insulating films 54 and the word lines WL are alternately laminated in the Z direction. Further, the insulating films 54 are provided between the source-side select gate electrodes 51 and the floating gate electrodes FG, between the source-side select gate electrodes 51 and the upper insulating film 25 of the lower structure 20, between the source-side select gate lines SGS and the word lines WL, between the source-side select gate lines SGS and the upper insulating film 25 of the lower structure 20, between the drain-side select gate electrodes 52 and the floating gate electrodes FG, between the drain-side select gate lines SGD and the word lines WL, and so on.

The insulating members 55 are provided between the pillars 30 arranged in the Y direction, and perform electrical insulation between the plurality of pillars 30. In other words, the word line WL and the floating gate electrode FG are not provided between the two pillars 30 arranged in the Y direction. For this reason, the first floating gate electrodes FGA and the second floating gate electrodes FGB are not connected to one another. Further, the insulating members 56 (see FIG. 34) are provided between the plurality of word lines WL in the X direction, and perform electrical insulation between the plurality of word lines WL.

Next, the upper structure 70 and the plurality of contacts 80 will be described.

The upper structure 70 is provided above the laminate 50. The upper structure 70 includes, for example, the plurality of bit lines BL, interconnections L1 (not shown) for the source-side select gate lines SGS, interconnections L2 of the word lines WL, and interconnections L3 for the drain-side select gate lines SGD.

The plurality of contacts 80 extend in the Z direction. The plurality of contacts 80 include, for example, a plurality of contacts 81 for the pillars 30, a plurality of contacts 82 (not shown) for the source-side select gate lines SGS, a plurality of contacts 83 for the word lines WL, and a plurality of contacts 84 for the drain-side select gate lines SGD.

The contacts 81 are provided on the pillars 30. The plurality of bit lines BL are provided away from one another in the Y direction, and extend in the X direction. In a case where the pillar 30 provided on the outermost side in the −X direction among the plurality of pillars 30 arranged in the X direction is set to a first pillar, the odd-numbered pillars 30A are connected to common bit lines BLA via the contacts 81. The even-numbered pillars 30B are connected to common bit lines BLB different from the bit lines BLA via the contacts 81. The pillars 30A and 30B that are adjacent to each other among the plurality of pillars 30 arranged in the X direction are not connected to a common bit line.

The plurality of contacts 82 (not shown) are provided on ends of the source-side select gate lines SGS in the +Y direction. The interconnections L1 (not shown) are provided on the contacts 82, and extend in the Y direction. The interconnections L1 are connected to the source-side select gate lines SGS via the contacts 82.

The plurality of contacts 83 are provided on ends of the word lines WL in the Y direction. The interconnections L2 are provided on the contacts 83, and extend in the Y direction. The interconnections L2 are connected to the word lines WL via the contacts 83.

The plurality of contacts 84 are provided on ends of the drain-side select gate lines SGD in the +Y direction. The interconnections L3 are provided on the contacts 84, and extend in the Y direction. The interconnections L3 are connected to the drain-side select gate lines SGD via the contacts 84.

<2. Constitutions of Laminate, Word Lines, and Pillars>

Figure 2:
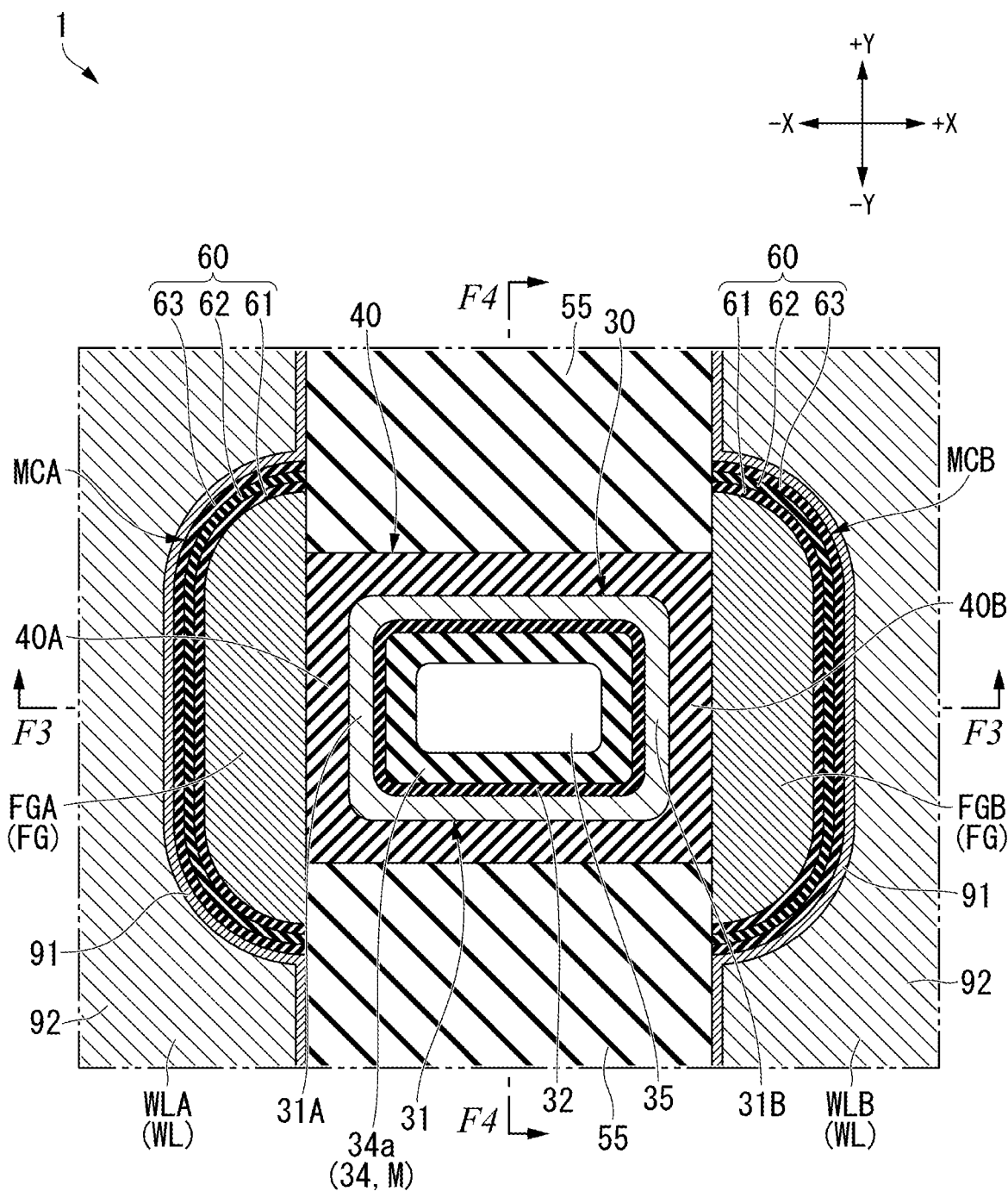
FIG. 2 is a sectional view of a region surrounded by a two-dot chain line F2 of the semiconductor storage device illustrated in FIG. 1.
Figure 3:
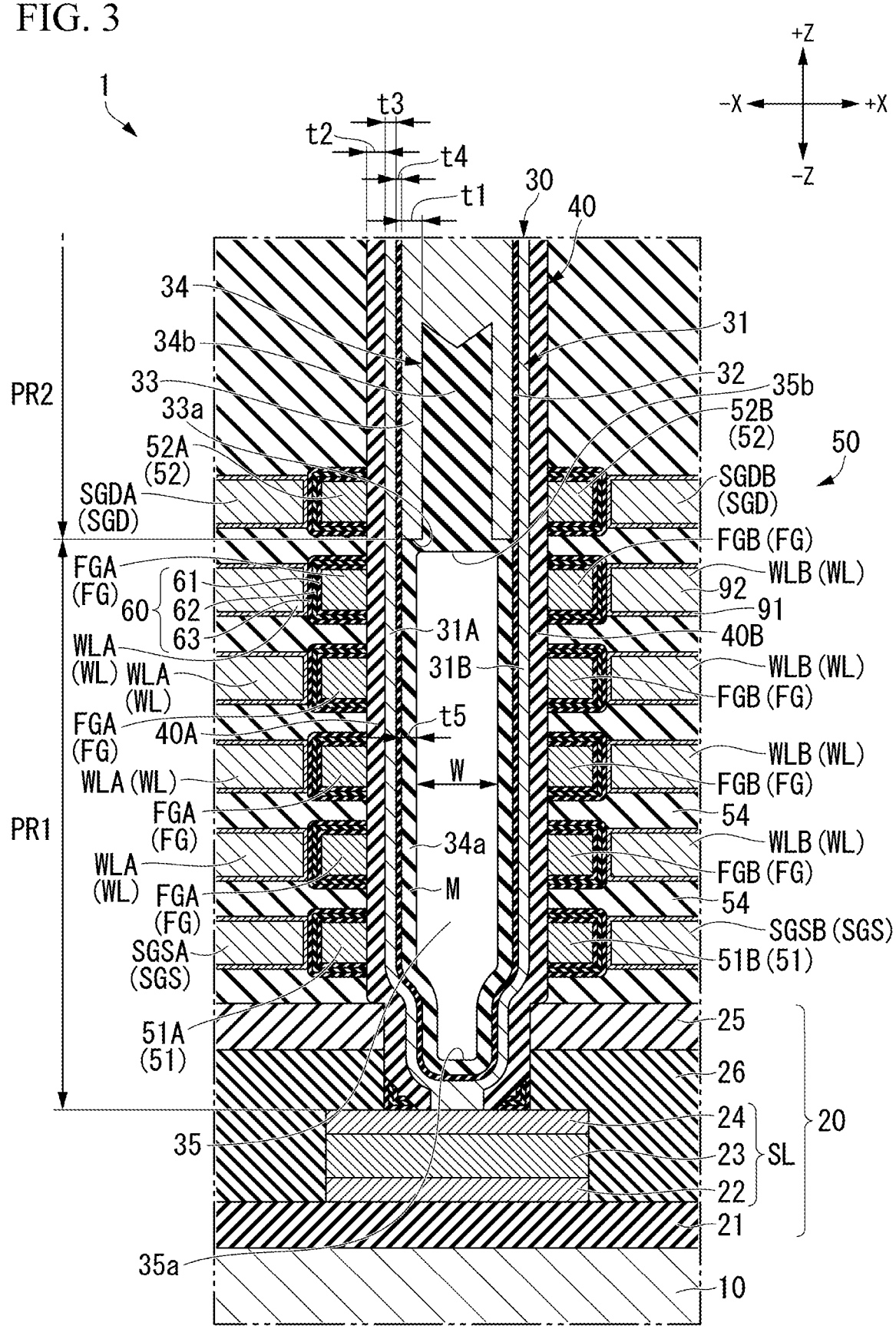
FIG. 3 is a sectional view taken along line F3-F3 of the semiconductor storage device illustrated in FIG. 2.
Figure 4:
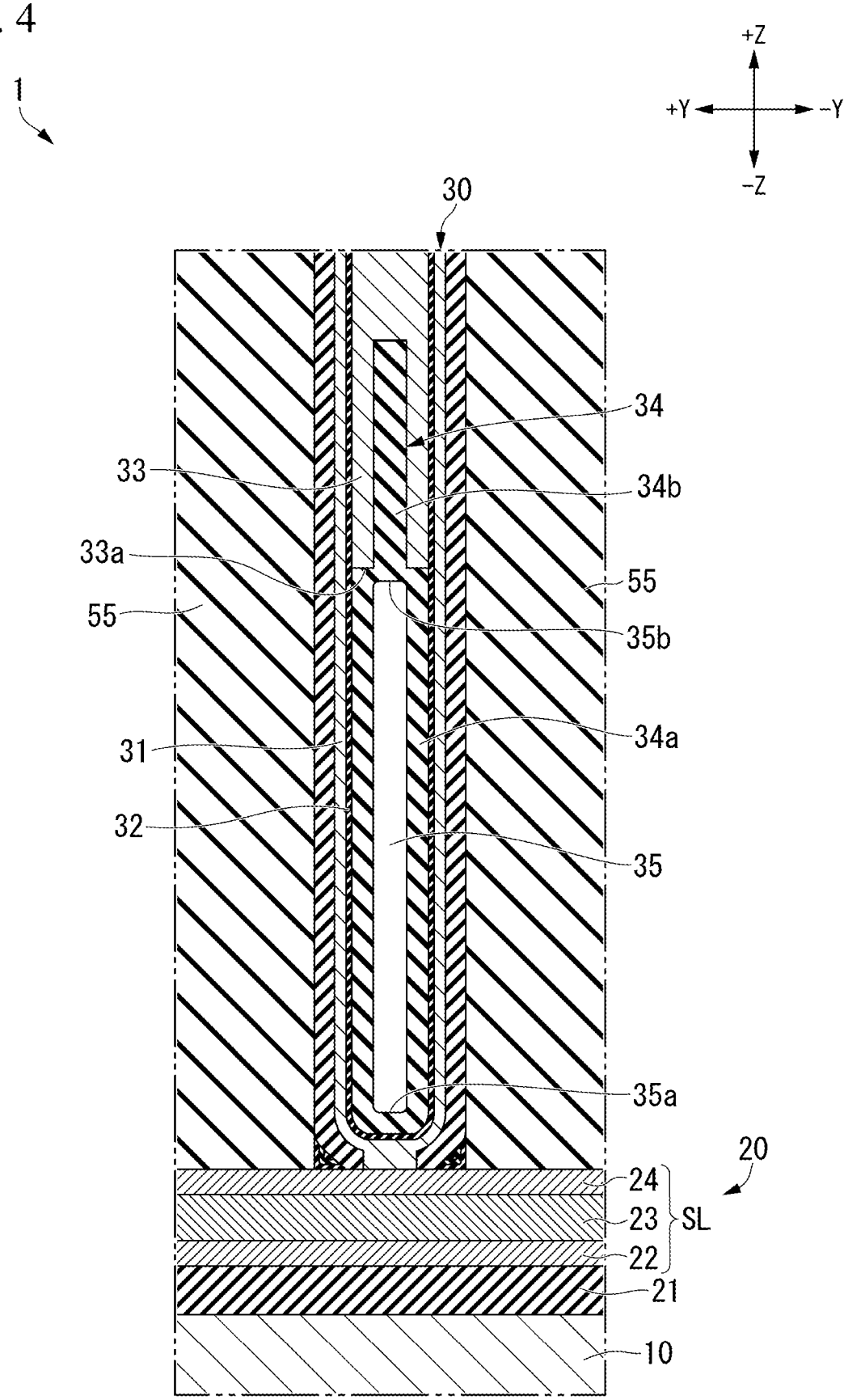
FIG. 4 is a sectional view taken along line F4-F4 of the semiconductor storage device illustrated in FIG. 2.

Next, constitutions of the laminate 50, the word lines WL, and the pillars 30 of the present embodiment will be described in detail. FIG. 2 is a sectional view of a region surrounded with a two-dot chain line F2 of the semiconductor storage device 1 illustrated in FIG. 1 in the Z direction. FIG. 3 is a sectional view taken along line F3-F3 of the semiconductor storage device 1 illustrated in FIG. 2. FIG. 4 is a sectional view taken along line F4-F4 of the semiconductor storage device 1 illustrated in FIG. 2. After FIG. 2, for convenience of description, only four of the word lines WL arranged in the Z direction are illustrated.

<2.1 Floating Gate Electrodes>

First, the floating gate electrodes FG will be described.

As illustrated in FIGS. 2 and 3, the first floating gate electrodes FGA are located between the first word lines WLA and the pillars 30. On the other hand, the second floating gate electrodes FGB are located between the second word lines WLB and the pillars 30. In the present embodiment, the floating gate electrodes FG are formed such that ends thereof in the −Y direction and the +Y direction have trapezoidal shapes of circular arcs.

<2.2 Word Lines>

Next, the word lines WL will be described.

Each word line WL includes, for example, a barrier metal film 91 and a conductive member 92. The barrier metal film 91 is provided on a surface of each word line WL. The barrier metal film 91 is a film that curbs diffusion of a material of the conductive member 92. The barrier metal film 91 is formed of, for example, titanium nitride (TiN). The conductive member 92 is provided inside the barrier metal film 91. The conductive member 92 is formed of, for example, tungsten.

<2.3 Block Insulating Films>

Next, the block insulating films 60 will be described.

The block insulating films 60 are provided, for example, between the first floating gate electrodes FGA and the first word lines WLA, and between the second floating gate electrodes FGB and the second word lines WLB. Each block insulating film 60 includes, for example, first to third block insulating films 61, 62 and 63.

The first block insulating films 61 are located closest to the floating gate electrodes FG among the first to third block insulating films 61, 62 and 63. Each of the first block insulating films 61 covers, for example, lateral surfaces, an upper surface, and a lower surface of each floating gate electrode FG. The first block insulating films 61 are formed of, for example, a high-k material such as silicon nitride (SiN), hafnium oxide (HfO), or the like. The first block insulating films 61 may be formed of a material containing ruthenium (Ru), aluminum (Al), titanium (Ti), zirconium (Zr), or silicon (Si).

The second block insulating films 62 are provided on sides opposite to the floating gate electrodes FG with respect to the first block insulating films 61. Each of the second block insulating films 62 covers, for example, the lateral surfaces, the upper surface, and the lower surface of each floating gate electrode FG with the first block insulating film 61 interposed in-between. In place of the above constitution, the second block insulating films 62 may cover only the lateral surfaces of the floating gate electrodes FG, and be provided along boundaries between the insulating films (the interlayer insulating films) 54 and the word lines WL. The second block insulating films 62 are formed of, for example, silicon oxide.

The third block insulating films 63 are provided on sides opposite to the floating gate electrodes FG with respect to the first and second block insulating films 61 and 62. Each of the third block insulating films 63 covers, for example, the lateral surfaces, the upper surface, and the lower surface of each floating gate electrode FG with the first and second block insulating films 61 and 62 interposed in-between. In place of the above constitution, the third block insulating films 63 may cover only the lateral surfaces of the floating gate electrodes FG, and be provided along boundaries between the insulating films (the interlayer insulating films) 54 and the word lines WL. The third block insulating films 63 need be formed of a material having a high dielectric constant, and are formed of, for example, a high-k film that is an oxide film containing aluminum (Al), hafnium (Hf), or zirconium (Zr). The third block insulating films 63 may be formed of silicon nitride.

<2.4 Tunnel Insulating Films>

Next, the tunnel insulating films 40 will be described.

The first tunnel insulating films 40A are located between the first floating gate electrodes FGA and the pillars 30. On the other hand, the second tunnel insulating films 40B are located between the second floating gate electrodes FGB and the pillars 30. In the present embodiment, a "first memory film (a first memory cell) MCA" is defined by the first floating gate electrode FGA, the block insulating film 60, and the first tunnel insulating film 40A. On the other hand, a "second memory film (second memory cell) MCB" is defined by the second floating gate electrode FGB, the block insulating film 60, and the second tunnel insulating film 40B.

<2.5 Pillars>

Next, the pillars 30 will be described.

The pillars 30 are provided between the first word lines WLA and the second word lines WLB in the X direction. Each pillar 30 includes a channel part 31, an insulating film 32, a sidewall 33 (see FIG. 3), an insulating part 34, and a hollow part 35 from an outer circumferential side thereof in this order.

The channel part 31 is located at an outermost circumference of the pillar 30. The channel part 31 extends in the Z direction over an entire length (a whole height) of the pillar 30 in the Z direction. A lower end of the channel part 31 passes through the upper insulating film 25 of the lower structure 20, and is connected to the source line SL. On the other hand, an upper end of the channel part 31 is connected to the bit line BL via the contact 81. The channel part 31 is formed of a semiconductor material such as amorphous silicon (a-Si). The channel part 31 may be formed of, for example, polysilicon into a part of which impurities are doped. The impurities included in the channel part 31 are any one selected from the group consisting of, for example, carbon, phosphorus, boron, and germanium. In a case where the channel part 31 injects electrons into the floating gate electrode FG and pulls the electrons injected into the floating gate electrode FG out of the floating gate electrode FG, an electric current flows between the source line SL and the bit line BL. The channel part 31 may be referred to as "silicon layer."

The channel part 31 includes a first channel part 31A that is located on a side of the channel part 31 in the −X direction, and a second channel part 31B that is located on a side of the channel part 31 in the +X direction. The first channel part 31A is provided between the first word line WLA and the second word line WLB, and extends in the Z direction. The first channel part 31A faces the first source-side select gate electrode 51A, the plurality of first floating gate electrodes FGA, and the first drain-side select gate electrode 52A with the first tunnel insulating film 40A interposed in-between. The second channel part 31B is provided between the first word line WLA and the second word line WLB, is adjacent to the first channel part 31A in the X direction, and extends in the Z direction. The second channel part 31B faces the second source-side select gate electrode 51B, the plurality of second floating gate electrodes FGB, and the second drain-side select gate electrode 52B with the second tunnel insulating film 40B interposed in-between. In the present embodiment, the channel part 31 is formed in a ring shape.

The insulating film 32 is provided on a central side of the pillar 30 relative to the channel part 31 in the X and Y directions. For example, the insulating film 32 is provided on an inner circumferential surface of the channel part 31. In the present embodiment, the insulating film 32 is formed along the inner circumferential surface of the channel part 31 in a ring shape. The insulating film 32 extends in the Z direction, for example, over an entire length (a whole height) of the pillar 30 in the Z direction. The insulating film 32 is formed of, for example, silicon oxide (SiO). The insulating film 32 is an example of a "third insulating part," and is an example of a "fourth insulating material."

Here, the pillar 30 includes, for example, a first region PR1 and a second region PR2 that is located on a side opposite to the silicon substrate 10 with respect to the first region PR1 to in the Z direction (see FIG. 3). The first region PR1 is a region in which the hollow part 35 (to be described below) is provided. On the other hand, the second region PR2 is a region in which the hollow part 35 (to be described below) is not provided.

The sidewall 33 is provided in the second region PR2 of the pillar 30. The sidewall 33 is not provided in the first region PR1 of the pillar 30. The sidewall 33 is provided on a central side of the pillar 30 relative to the insulating film 32 in the second region PR2 of the pillar 30 in the X and Y directions. For example, the sidewall 33 is provided on an inner circumferential surface of the insulating film 32. In the present embodiment, the sidewall 33 is formed along the inner circumferential surface of the insulating film 32 in a ring shape. The sidewall 33 includes, for example, a semiconductor material such as amorphous silicon (a-Si). However, a material of which the sidewall 33 is formed is not limited to the semiconductor material, and may be an insulating material or the like.

A part of the sidewall 33 (e.g., a region more than half of the length in the Z direction) is located above an upper end (an upper surface) of the drain-side select gate line SGD. One end (a lower end) 33a of the sidewall 33 extends, for example, closer to the silicon substrate 10 than at least a part (e.g., an upper end (an upper surface)) of the drain-side select gate line SGD. In the present embodiment, the one end (the lower end) 33a of the sidewall 33 extends closer to the silicon substrate 10 than a lower end (a lower surface) of the drain-side select gate line SGD. In place of the above constitution, the one end (the lower end) 33a of the sidewall 33 may be located at a height between the upper end (the upper surface) and the lower end (the lower surface) of the drain-side select gate line SGD in the Z direction, and be located above the upper end (the upper surface) of the drain-side select gate line SGD.

For example, a thickness (e.g., a maximum thickness) t1 of the sidewall 33 in the X direction is greater than a thickness (e.g., a maximum thickness) t2 of the first tunnel insulating film 40A in the X direction, is greater than a thickness (e.g., a maximum thickness) t3 of the first channel part 31A in the X direction, is greater than a thickness (e.g., a maximum thickness) t4 of the insulating film 32 in the X direction, and is greater than a thickness (e.g., a maximum thickness) t5 of the insulating part 34 (a first insulating part 34a (to be described below), which is provided in the first region PR1 of the pillar 30, in the X direction. However, the thickness t1 of the sidewall 33 in the X direction is not limited to the above example. The above example is also equally applied to a thickness of the sidewall 33 in the Y direction.

The insulating part 34 is provided over the first region PR1 and the second region PR2 of the pillar 30. That is, the insulating part 34 includes a first insulating part 34a provided in the first region PR1 of the pillar 30, and a second insulating part 34b provided in the second region PR2 of the pillar 30. The insulating part 34 is formed of a material M that is different from the material of which the channel parts 31 is formed and is different from the material of which the sidewall 33 is formed. The material M is, for example, an insulating material such as tetra ethyl or tho silicate (TEOS: $Si(OC_2H_5)_4$). The material M is, for example, a material having the same dielectric constant as the first or second block insulating film 61 or 62. However, the material M is not limited to the above example.

The first insulating part 34a is provided on the central side of the pillar 30 relative to the insulating film 32 in the X and Y directions. For example, the first insulating part 34a is provided, for example, on the inner circumferential surface of the insulating film 32. In the present embodiment, the first insulating part 34a is formed along the inner circumferential surface of the insulating film 32 in a ring shape. The first insulating part 34a is located between the channel part 31 and the hollow part 35 (to be described below) in the X and Y directions. For example, the first insulating part 34a is continuously provided over an entire length (a whole height) of the first region PR1 of the pillar 30 in the Z direction. For example, the first insulating part 34a extends along the plurality of floating gate electrodes FG, which are arranged in the Z direction, in the Z direction. For example, the first insulating part 34a continuously extends from below the floating gate electrode FG that is closest to the silicon substrate 10 among the plurality of floating gate electrodes FG arranged in the Z direction to above the floating gate electrode FG that is farthest from the silicon substrate 10 among the plurality of floating gate electrodes FG arranged in the Z direction. In the present embodiment, the first insulating part 34a passes through at least a part of the upper insulating film 25 of the lower structure 20, and extends below an upper surface of the upper insulating film 25. The first insulating part 34a is an example of a "first inner-pillar insulator."

For example, a thickness (e.g., a maximum thickness) t5 of the first insulating part 34a in the X direction is greater than the thickness (e.g., the maximum thickness) t3 of the first channel part 31A in the X direction, and is greater than the thickness (e.g., the maximum thickness) t4 of the insulating film 32 in the X direction. The thickness (e.g., the maximum thickness) t5 of the first insulating part 34a in the X direction is smaller than, for example, the thickness (e.g., the maximum thickness) t2 of the first tunnel insulating film 40A in the X direction. However, the thickness t5 of the first insulating part 34a in the X direction is not limited to the above example. The above example is also equally applied to a thickness of the first insulating part 34a in the Y direction. However, the first insulating part 34a may not be present. That is, the insulating part 34 may include only the second insulating part 34b.

On the other hand, second insulating part 34b is provided on the central side of the pillar 30 relative to the sidewall 33 in the X and Y directions. In the present embodiment, the second insulating part 34b is embedded on an inner circumferential side of the ring-shaped sidewall 33. The second insulating part 34b is connected to the first insulating part 34a in the Z direction. The second insulating part 34b is an example of a "second inner-pillar insulator." In some respects, the second insulating part 34b is an example of a "fourth insulating part," and is an example of a "fifth insulating material." For example, an insulation property (e.g., an insulation property per unit thickness) of the second insulating part 34b is lower than that of the hollow part 35.

The hollow part 35 is provided in the first region PR1 of the pillar 30, and is formed in a hollow shape. The hollow part 35 is filled with a gas (e.g, air). The hollow part 35 is provided on the central side of the pillar 30 relative to the first insulating part 34a in the X and Y directions. That is, the hollow part 35 is provided on an inner circumferential side of the first insulating part 34a. In other words, the hollow part 35 is provided on an inner circumferential side of the channel part 31. The hollow part 35 is provided between the first channel part 31A and the second channel part 31B. The hollow part 35 is an example of a "third insulating material." An example of the third insulating material is a gas. For example, an insulation property (e.g., an insulation property per unit thickness) of the hollow part 35 is higher than that of the tunnel insulating film 40. The third insulating material is not limited to the gas, and may be a solid insulating material.

The hollow part 35 is continuously provided from a lower end to an upper end of the first region PR1 of the pillar 30. For example, the hollow part 35 extends along the plurality of floating gate electrodes FG, which are arranged in the Z direction, in the Z direction. For example, a first end (a lower end) 35a of the hollow part 35 is located closer to the silicon substrate 10 than at least a part (e.g., an upper end (an upper surface)) of the floating gate electrode FG that is closest to the silicon substrate 10 among the plurality of floating gate electrodes FG. Further, a second end (upper end) 35b of the hollow part 35 is located farther from the silicon substrate 10 than at least a part (e.g., a lower end (a lower surface)) of the floating gate electrode FG that is farthest from the silicon substrate 10 among the plurality of floating gate electrodes FG. In the present embodiment, the hollow part 35 extends from below a lower end (a lower surface) of the floating gate electrode FG that is closest to the silicon substrate 10 among the plurality of floating gate electrodes FG arranged in the Z direction to above an upper end (an upper surface) of the floating gate electrode FG that is farthest from the silicon substrate 10 among the plurality of floating gate electrodes FG arranged in the Z direction.

For example, the hollow part 35 extends closer to the silicon substrate 10 than at least a part (e.g., an upper end (an upper surface)) of the source-side select gate line SGS. In the present embodiment, the hollow part 35 extends closer to the silicon substrate 10 than a lower end (a lower surface) of the source-side select gate lines SGS. For example, the hollow part 35 passes through at least a part of the upper insulating film 25 of the lower structure 20, and extends below the upper surface of the upper insulating film 25. On the other hand, an upper end of the hollow part 35 is located below the drain-side select gate line SGD. In place of the above constitution, the upper end of the hollow part 35 may be located above the drain-side select gate line SGD.

For example, a width (e.g., a maximum width) W of the hollow part 35 in the X direction is greater than the thickness (e.g., the maximum thickness) t1 of the sidewall 33 in the X direction, is greater than the thickness (e.g., the maximum thickness) t2 of the first tunnel insulating film 40A in the X direction, is greater than the thickness (e.g., the maximum thickness) t3 of the first channel part 31A in the X direction, is greater than the thickness (e.g., the maximum thickness) t4 of the insulating film 32 in the X direction, and is greater than the thickness (e.g., the maximum thickness) t5 of the first insulating part 34a in the X direction. The width W of the hollow part 35 in the X direction is not limited to the above example.

<3. Method of Fabricating Semiconductor Storage Device>

Next, an example of a method of fabricating the semiconductor storage device 1 will be described.

Figure 5:
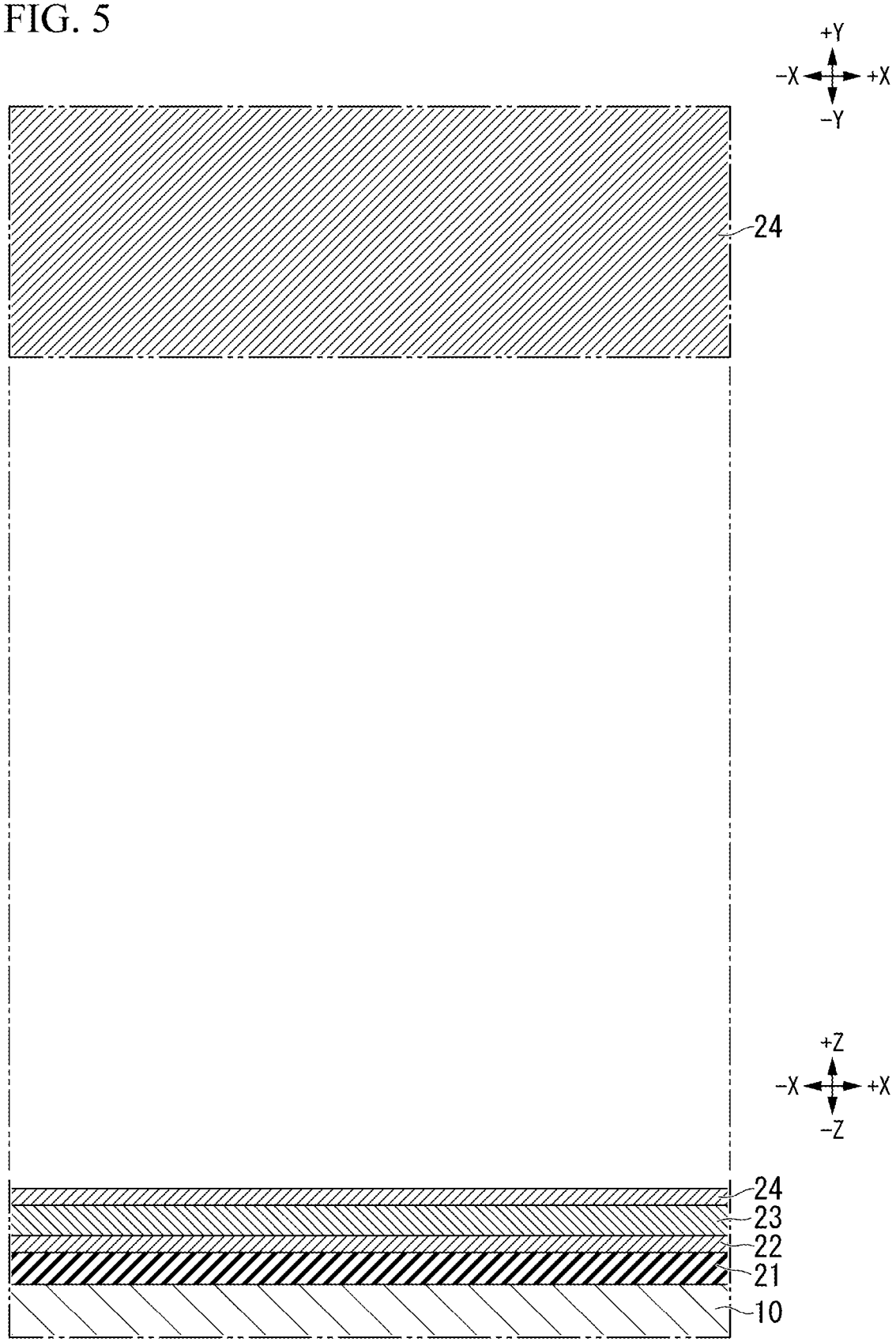
FIG. 5 is a view illustrating a method of fabricating the semiconductor storage device of the first embodiment.
Figure 6:
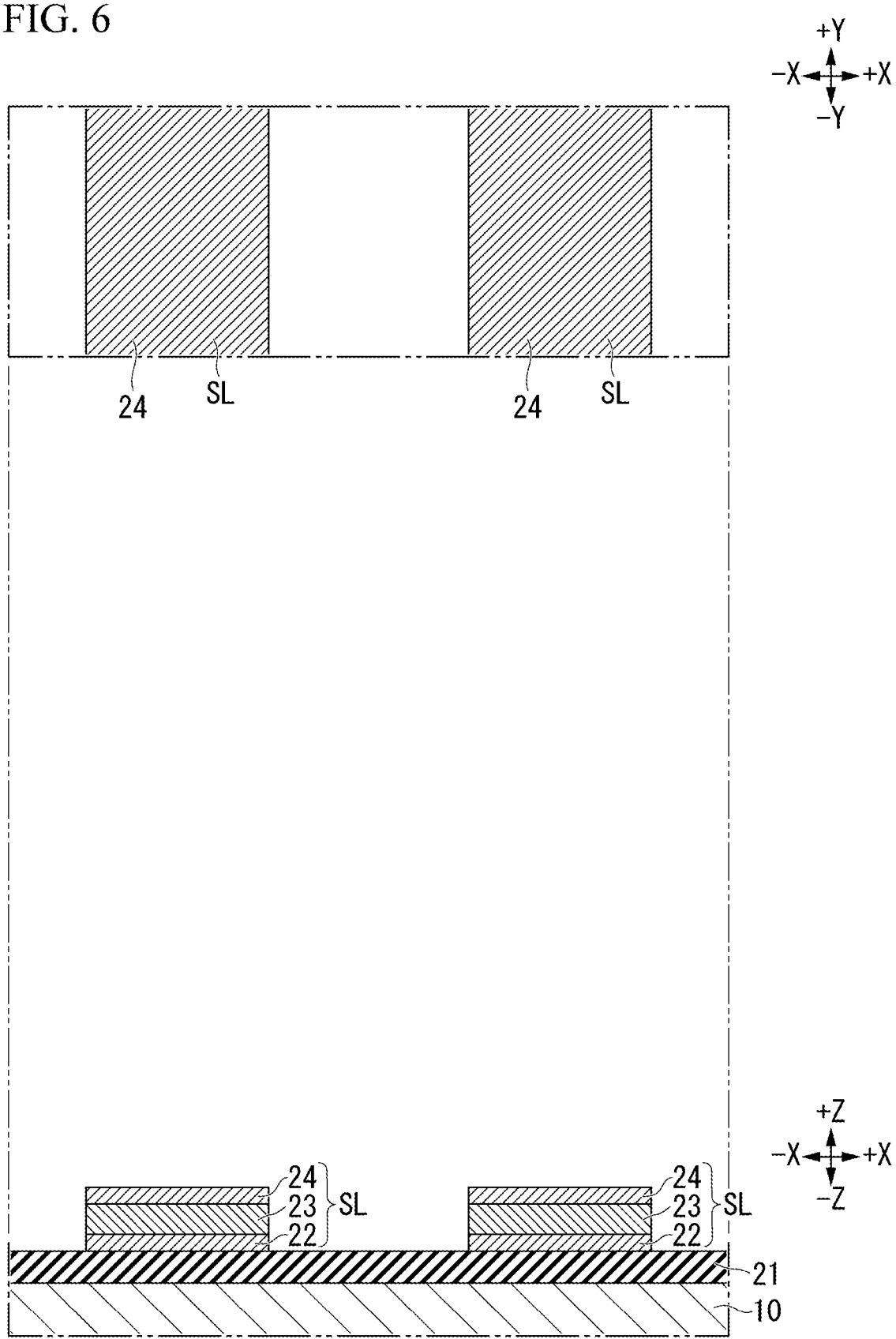
FIG. 6 is a view illustrating a method of fabricating the semiconductor storage device of the first embodiment.
Figure 7:
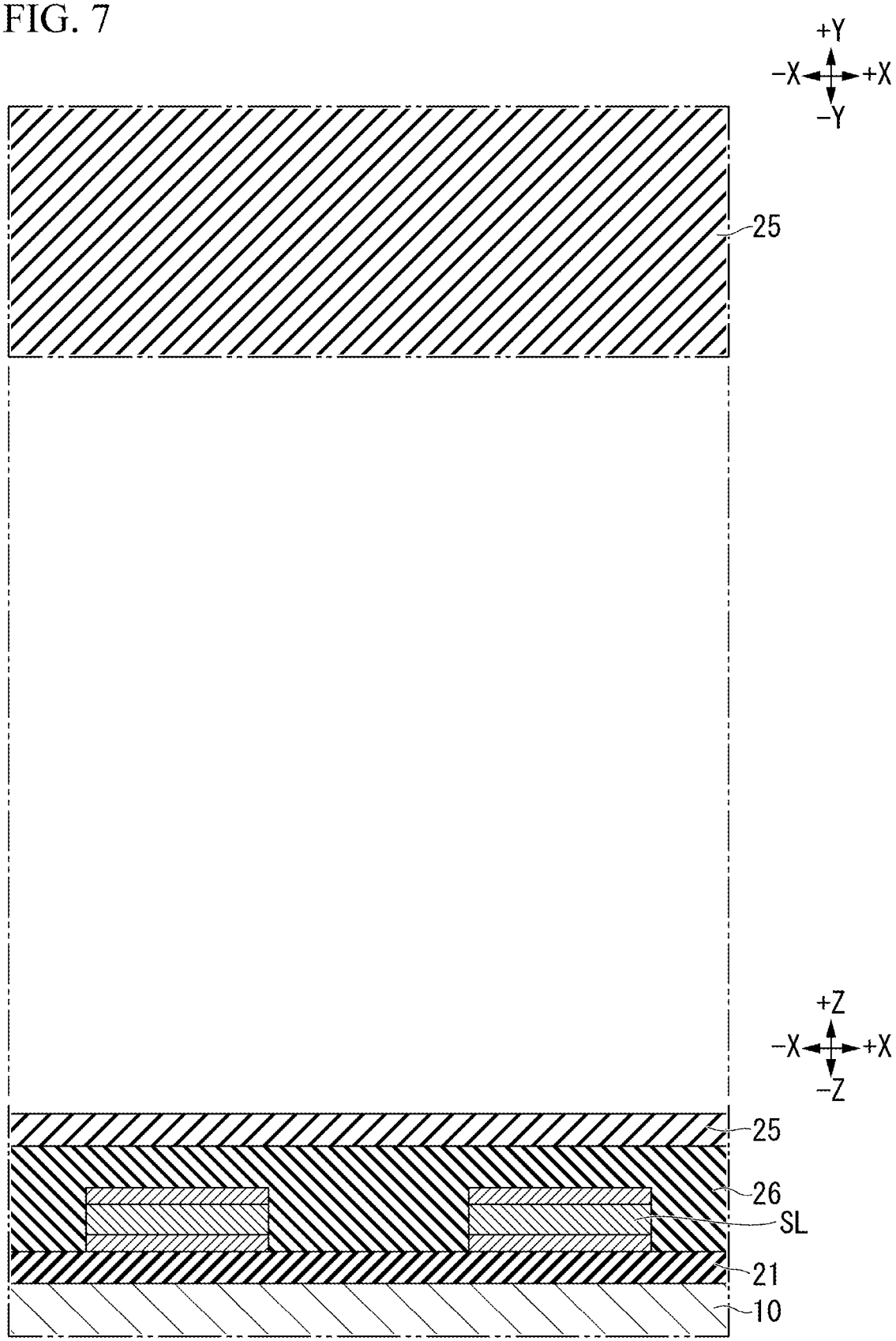
FIG. 7 is a view illustrating a method of fabricating the semiconductor storage device of the first embodiment.

FIGS. 5 to 34 are views illustrating a method of fabricating the semiconductor storage device 1. First, as illustrated in FIG. 5, a lower insulating film 21, a conductive layer 22, an interconnection layer 23, and a conductive layer 24 are formed on a silicon substrate 10. Next, as illustrated in FIG. 6, the conductive layer 22, the interconnection layer 23, and the conductive layer 24 are selectively removed by, for example, dry etching. Thereby, source lines SL are formed. Next, as illustrated in FIG. 7, an insulating member 26 and an upper insulating film 25 are formed on the lower insulating film 21 and the source lines SL.

Figure 8:
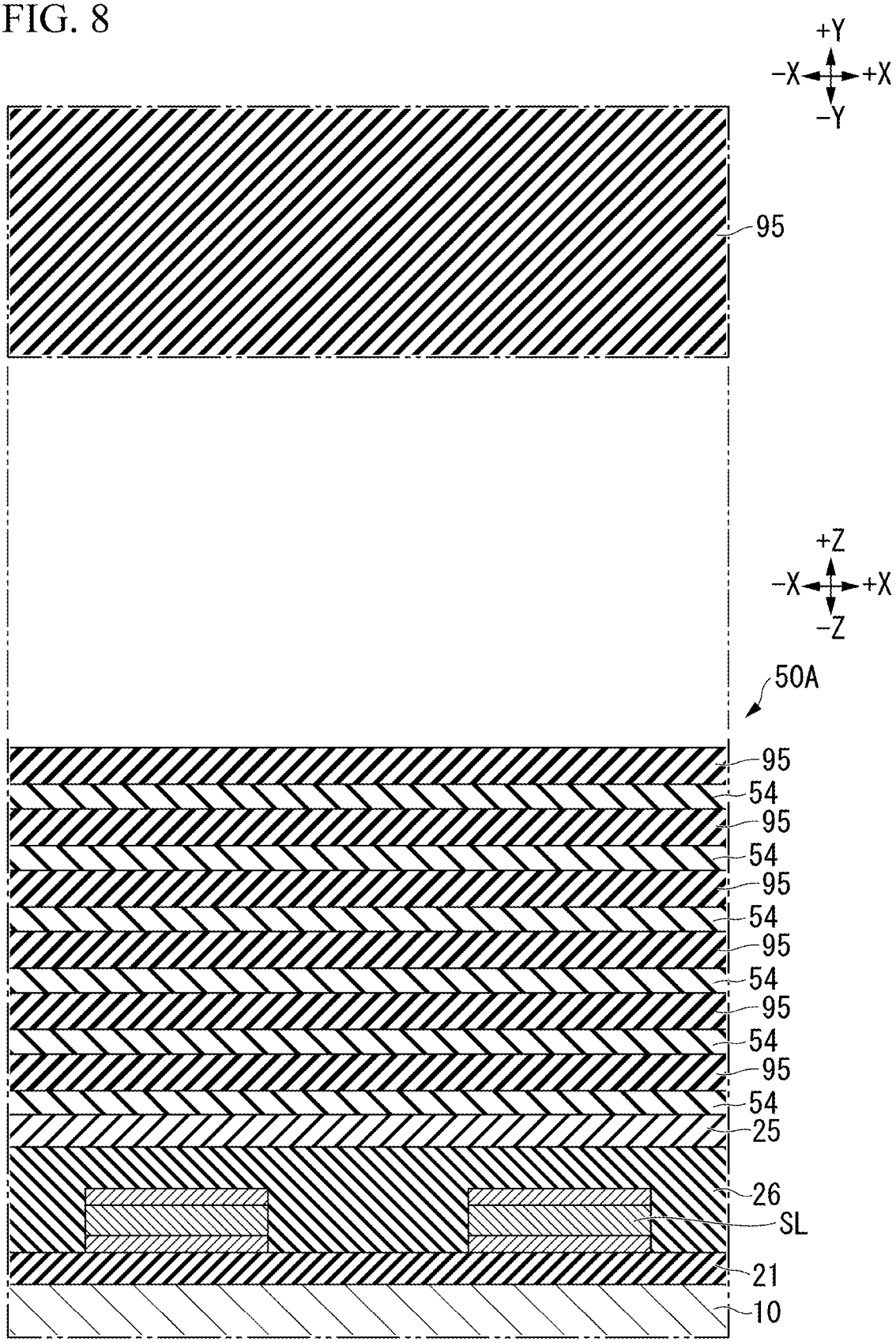
FIG. 8 is a view illustrating a method of fabricating the semiconductor storage device of the first embodiment.
Figure 9:
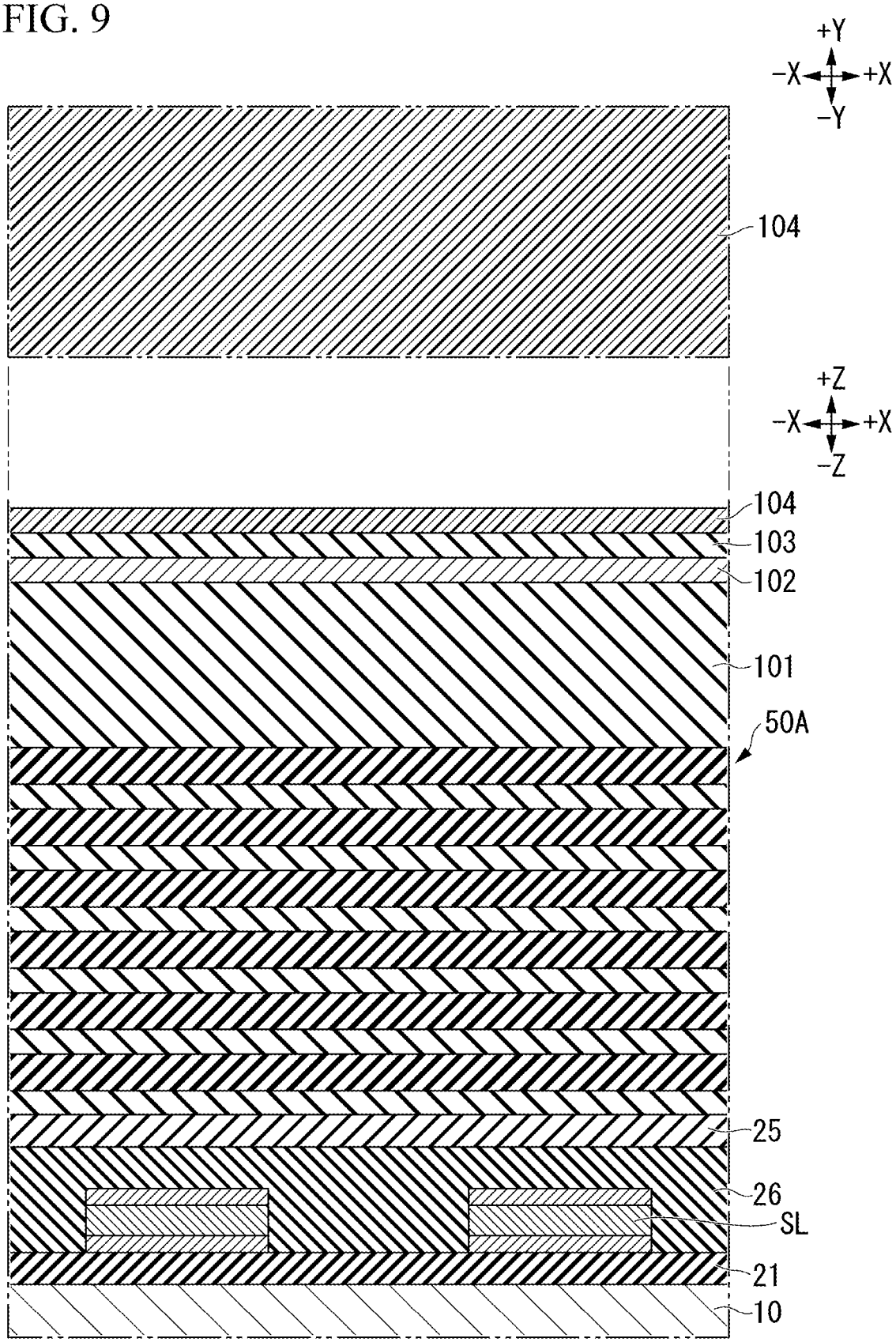
FIG. 9 is a view illustrating a method of fabricating the semiconductor storage device of the first embodiment.

Next, as illustrated in FIG. 8, for example, insulating films 54 including silicon oxide and filling films 95 including silicon nitride are alternately laminated on the upper insulating film 25 by a chemical vapor deposition (CVD) method, and thus a laminated intermediate 50A is formed. Next, as illustrated in FIG. 9, a mask 101 is formed on the laminated intermediate 50A by depositing, for example, silicon oxide ($SiO_2$). Next, for example, a pattern film 102 including carbon (C), an anti-reflective coating (ARC) 103, and a resist film 104 are formed on the mask 101.

Figure 10:
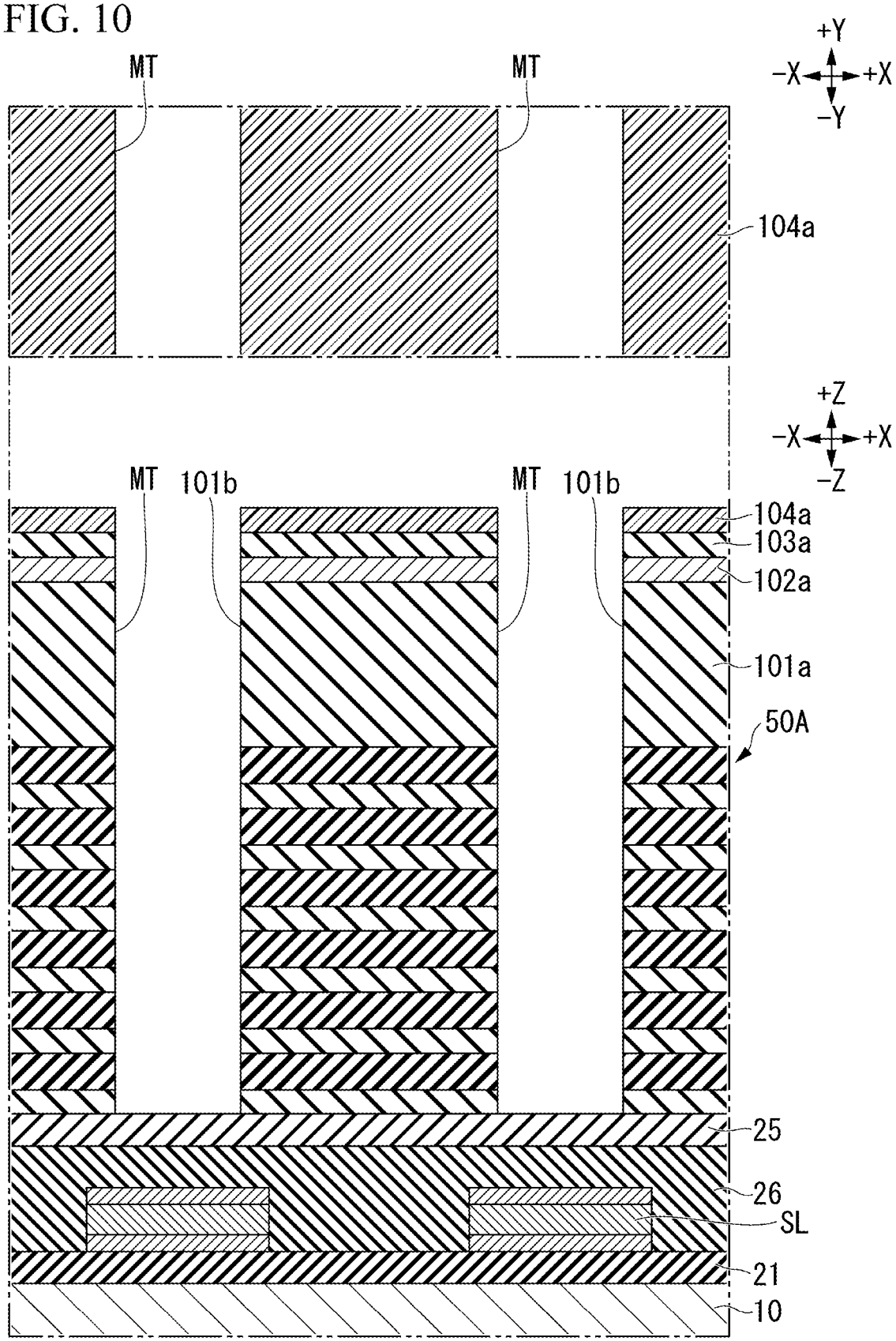
FIG. 10 is a view illustrating a method of fabricating the semiconductor storage device of the first embodiment.

Next, as illustrated in FIG. 10, a resist pattern 104a is formed by exposing and developing the resist film 104. Next, the resist pattern 104a is etched to form an ARC 103a and a pattern film 102a. Next, the mask 101 is patterned to form a mask 101a. Thereby, the mask 101a includes openings 101b that extend in the Y direction. Next, for example wet etching is performed using the mask 101a as a mask, thus digging the laminated intermediate 50A in the Z direction. Thereby, memory cell trenches MT that passes through the laminated intermediate 50A to reach the upper insulating film 25 are formed.

Figure 11:
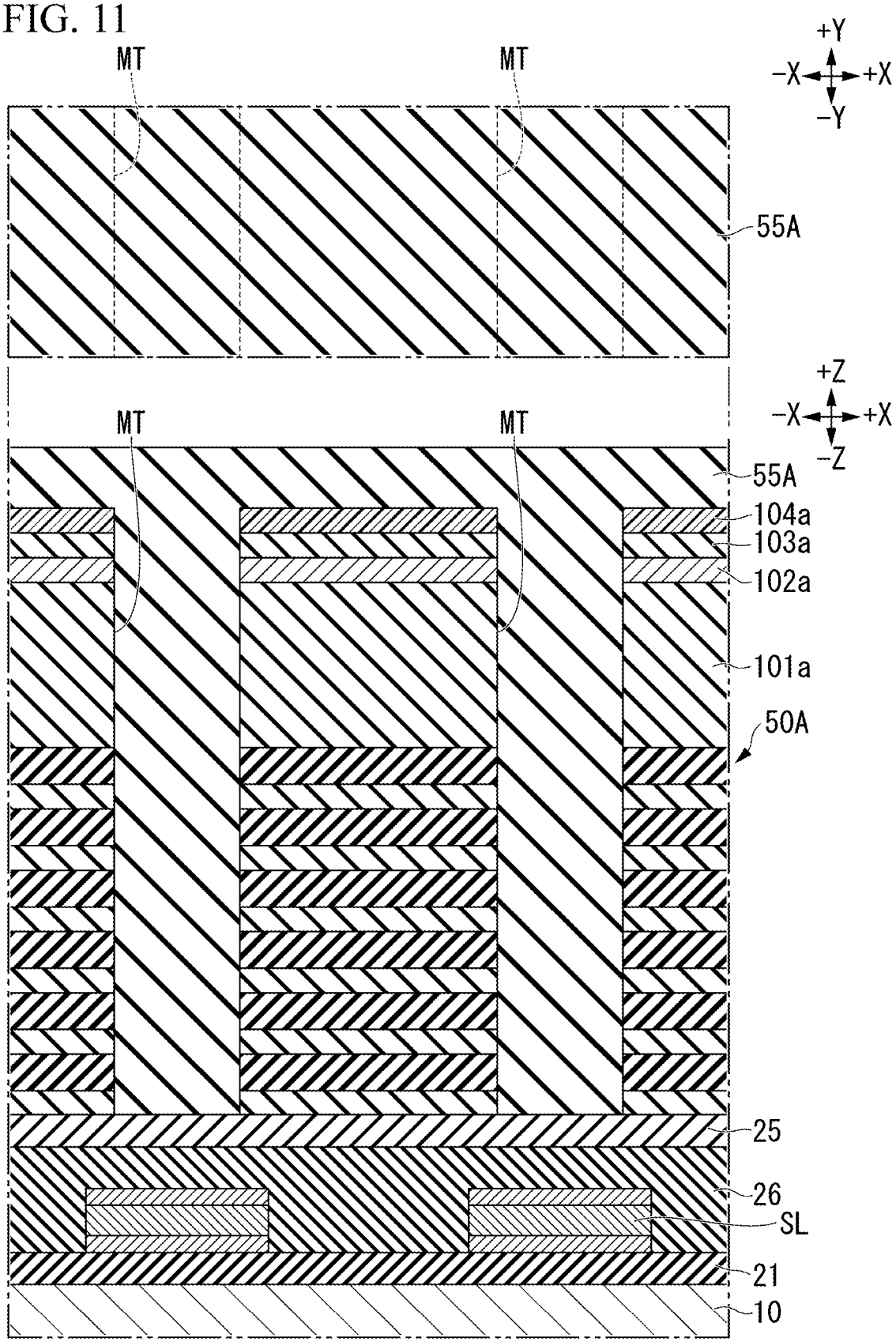
FIG. 11 is a view illustrating a method of fabricating the semiconductor storage device of the first embodiment.
Figure 12:
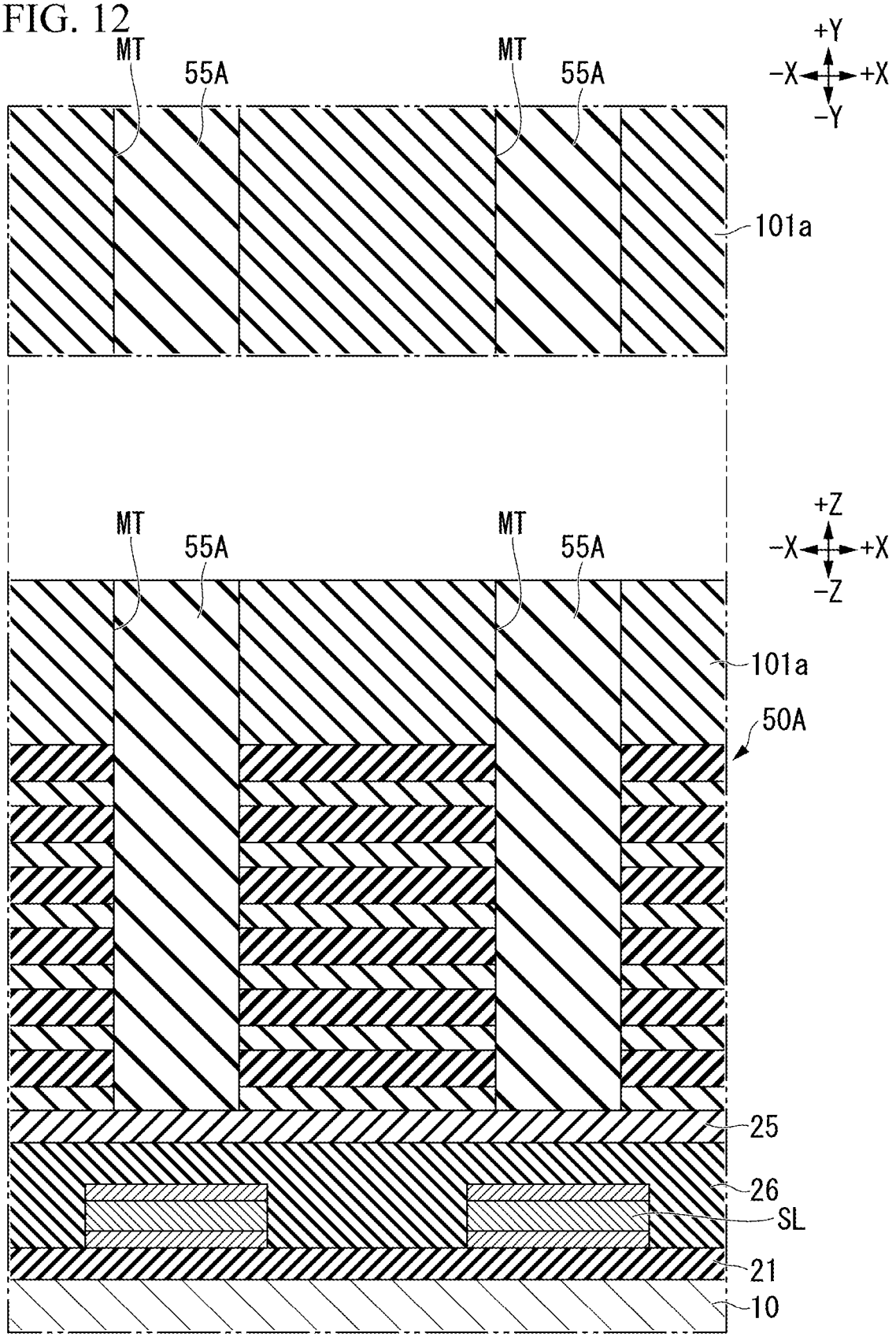
FIG. 12 is a view illustrating a method of fabricating the semiconductor storage device of the first embodiment.
Figure 13:
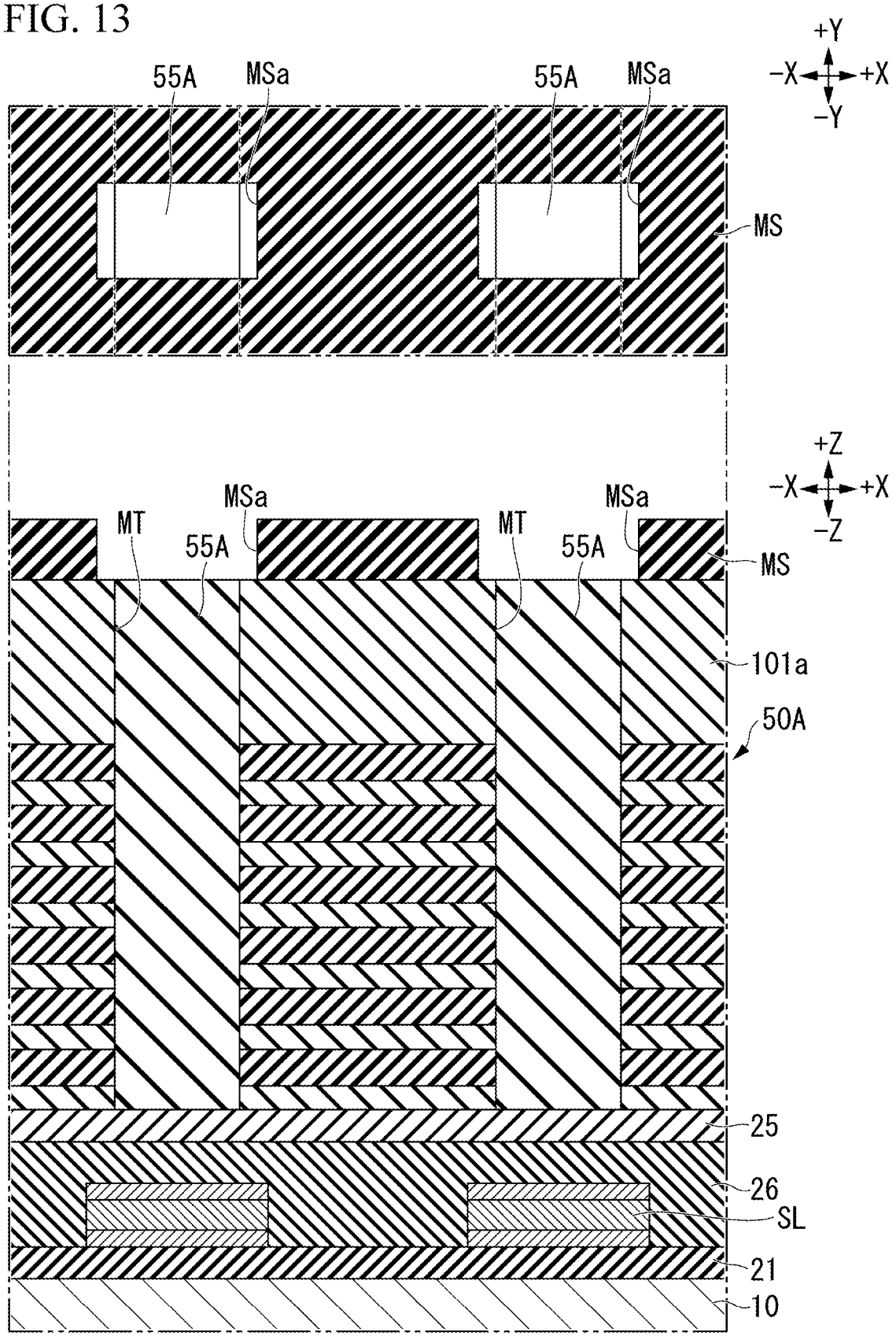
FIG. 13 is a view illustrating a method of fabricating the semiconductor storage device of the first embodiment.

Next, as illustrated in FIG. 11, an insulating material such as silicon oxide is deposited. Thereby, an insulating film 55A serving as an origin of an insulating member 55 is formed in the memory cell trenches MT. Next, as illustrated in FIG. 12, an unnecessary portion of the insulating film 55A located on the resist pattern 104a is removed by, for example, etching-back. Next, the resist pattern 104a, the ARC 103a, and the pattern film 102a are removed. Next, as illustrated in FIG. 13, for example, a hard mask MS is provided, for example, on the mask 101a. The hard mask MS includes openings MSa at positions corresponding to memory holes MH (to be described below).

Figure 14:
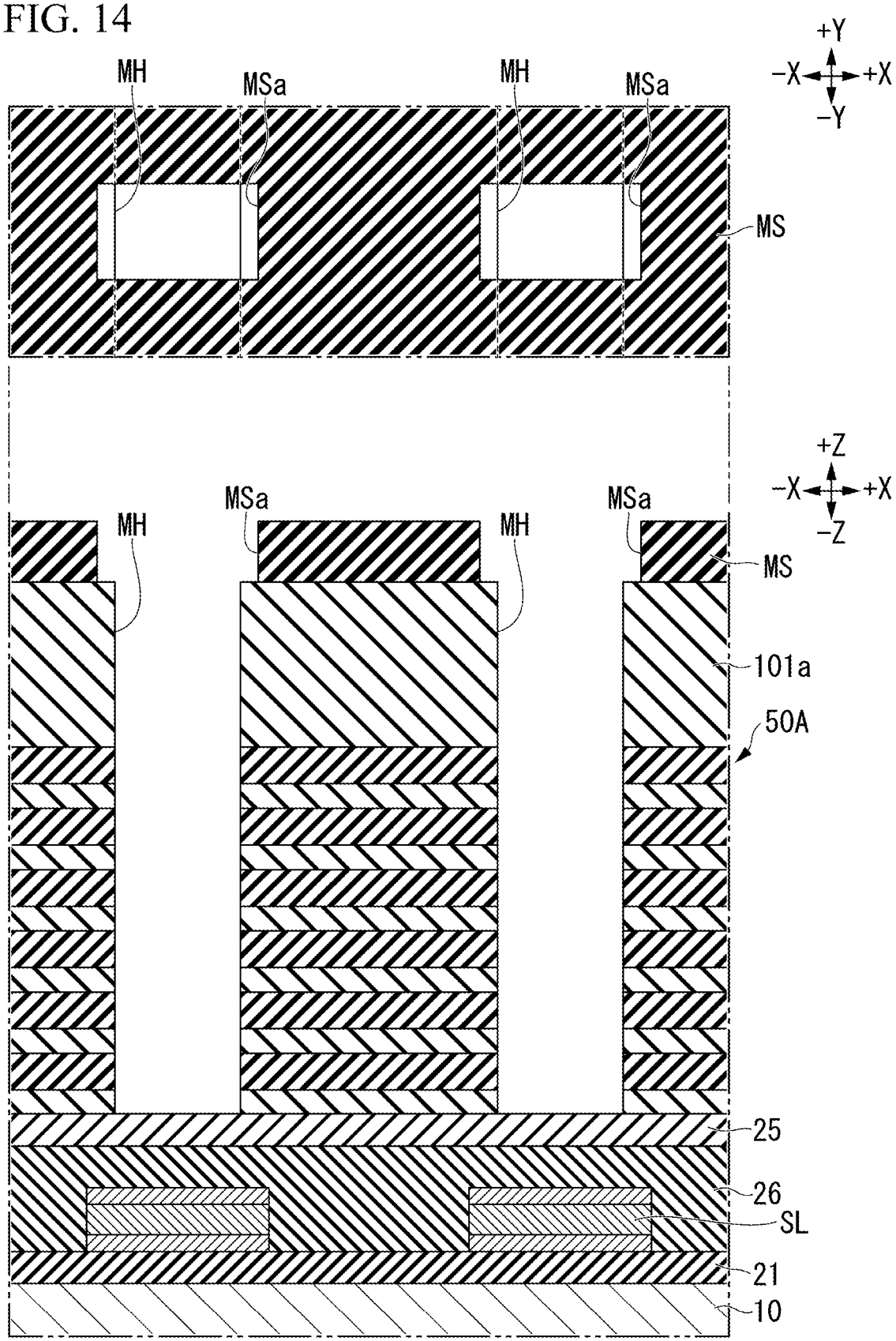
FIG. 14 is a view illustrating a method of fabricating the semiconductor storage device of the first embodiment.

Next, as illustrated in FIG. 14, for example, wet etching is performed using the hard mask MS as a mask, and thus portions exposed to the openings MSa of the hard mask MS are removed from the laminated intermediate 50A. Here, in the present embodiment, an etchant remaining without removing the mask 101a under the hard mask MS is used. For this reason, only the unnecessary portion of the insulating film 55A is removed without removing the insulating films 54 and the filling films 95.

Figure 15:
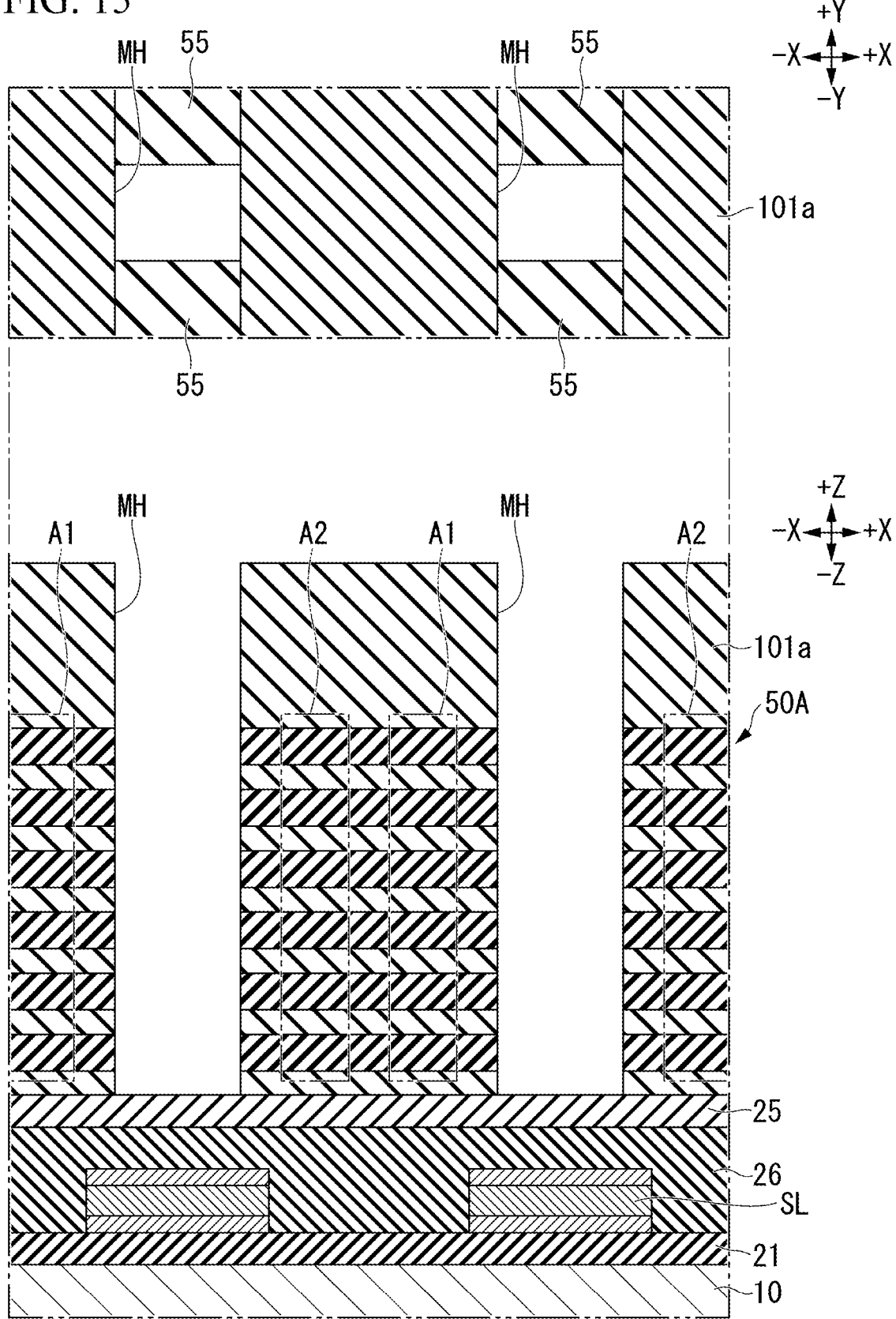
FIG. 15 is a view illustrating a method of fabricating the semiconductor storage device of the first embodiment.
Figure 16:
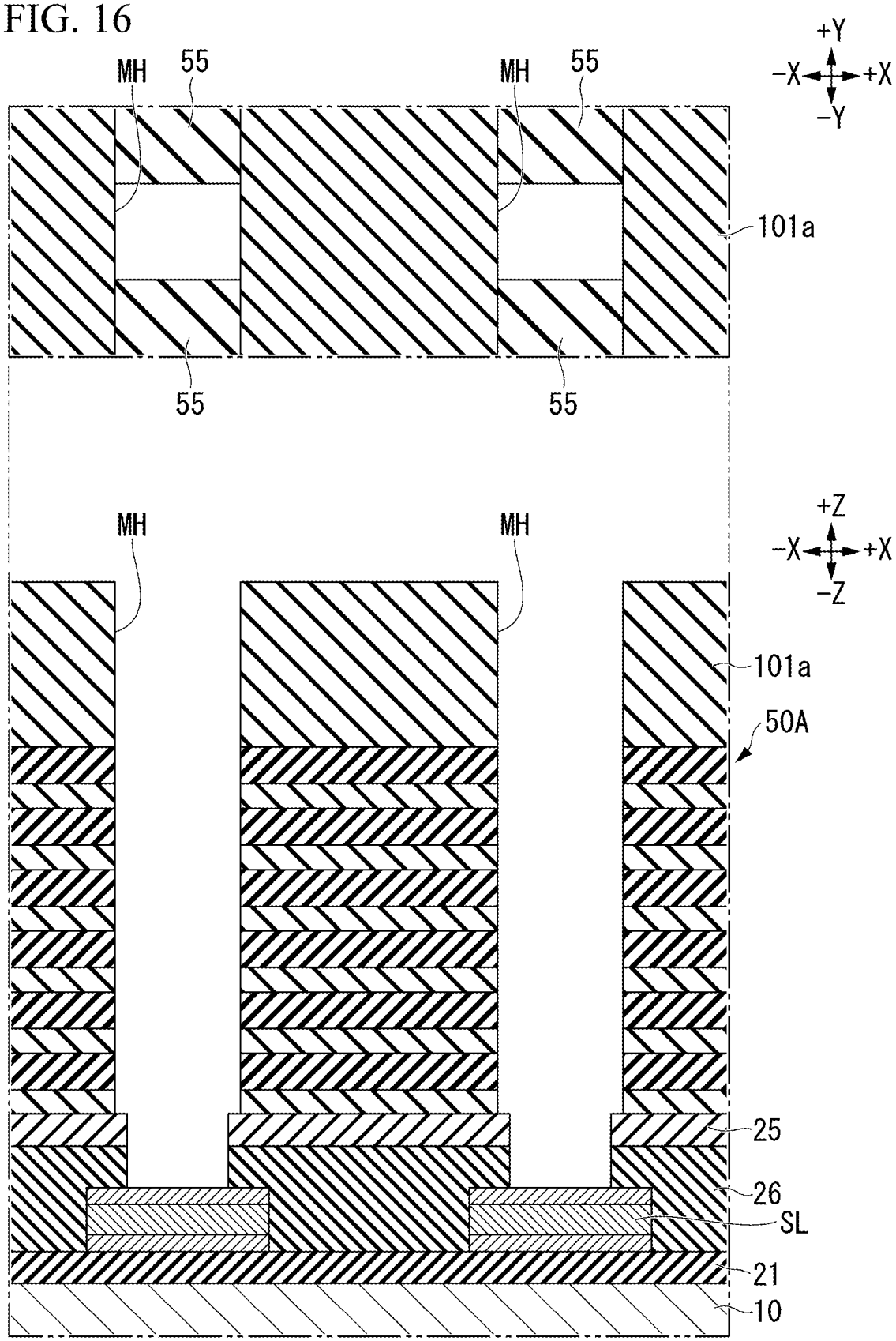
FIG. 16 is a view illustrating a method of fabricating the semiconductor storage device of the first embodiment.

Thereby, as illustrated in FIG. 15, the memory holes MH passing through the insulating film 55A in the Z direction are formed, and the remaining portions of the insulating films 55A become insulating members 55. Each memory hole MH is an example of a "hole part." The memory holes MH are provided between a first interconnection region A1 and a second interconnection region A2 in the laminated intermediate 50A. The "interconnection region" may be a region where an interconnection is previously formed, or may be a region where an interconnection is formed in a succeeding process. In the present embodiment, the first interconnection region A1 is a region where a first word line WLA is formed in a succeeding process, and the second interconnection region A2 is a region where a second word line WLB is formed in a succeeding process. Next, as illustrated in FIG. 16, the upper insulating film 25 is exposed in the memory holes MH are exposed is partly removed by, for example, etching, and thus source lines SL are exposed.

Figure 17:
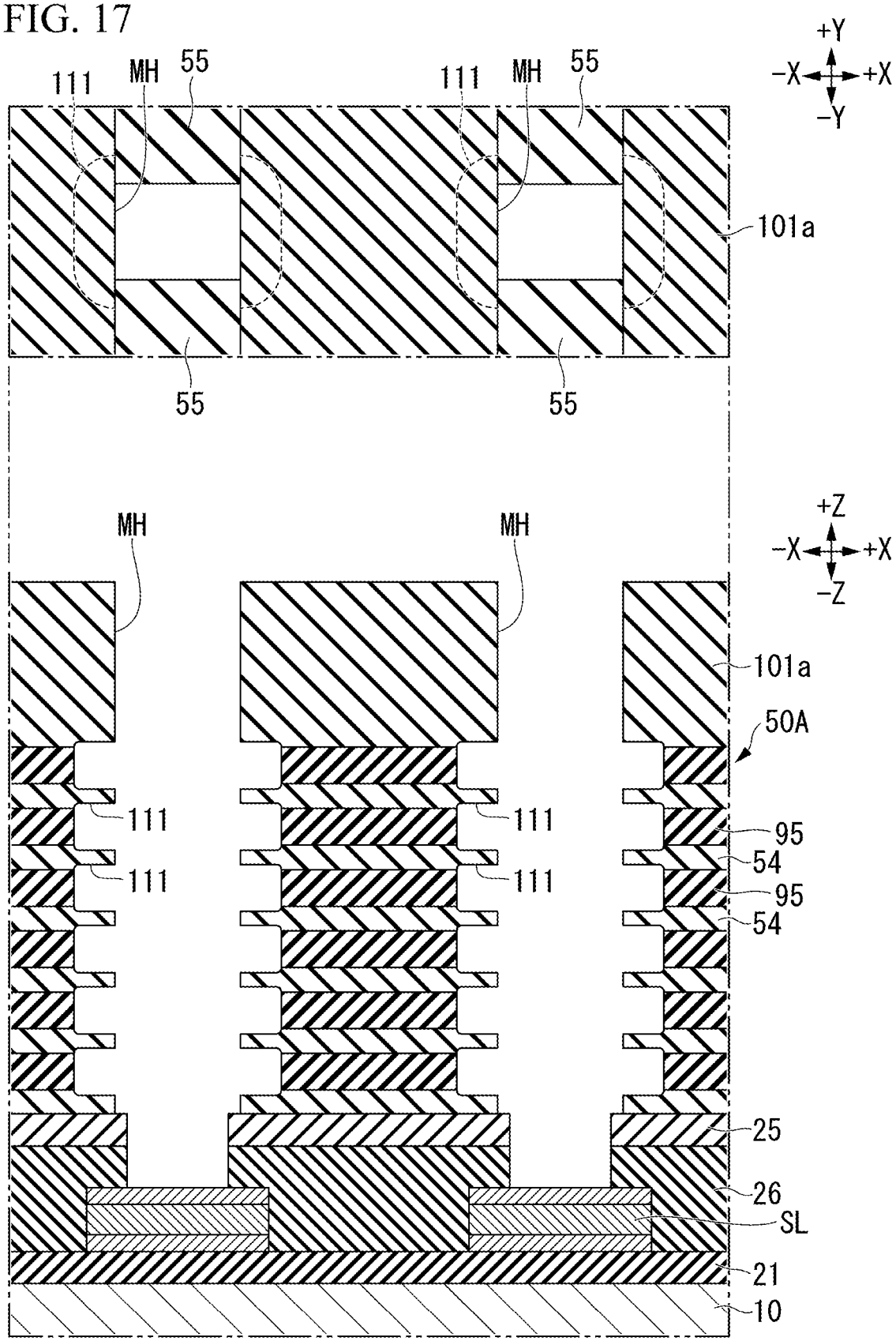
FIG. 17 is a view illustrating a method of fabricating the semiconductor storage device of the first embodiment.

Next, as illustrated in FIG. 17, wet etching that uses, for example, a hot phosphoric acid ($H_3PO_4$) that is a chemical liquid dissolving silicon nitride as an etchant is performed via the memory holes MH. Thereby, parts of the filling films 95 which are close to the memory holes MH are removed, and thus dents 111 are formed in lateral surfaces of the memory holes MH.

Figure 18:
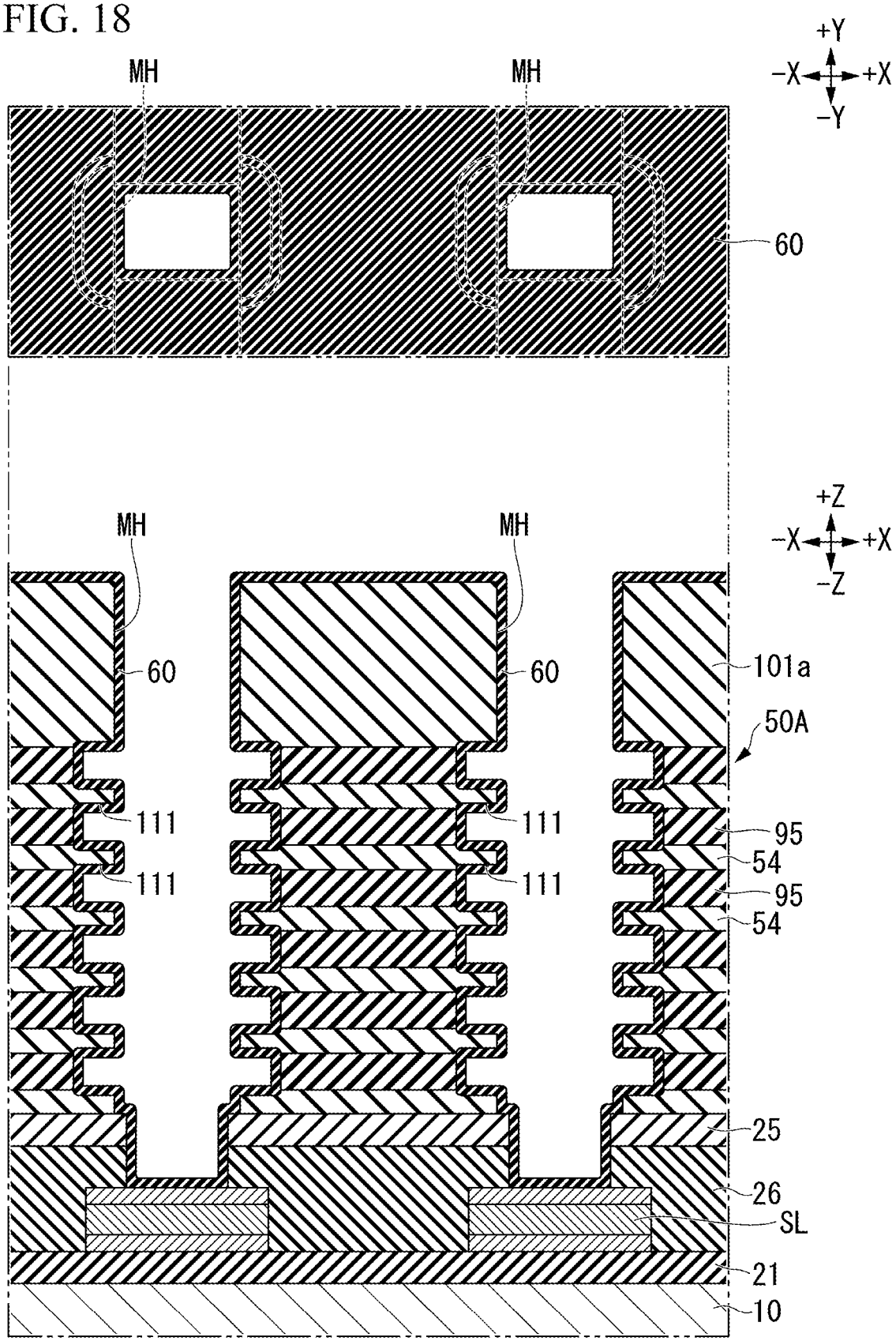
FIG. 18 is a view illustrating a method of fabricating the semiconductor storage device of the first embodiment.
Figure 19:
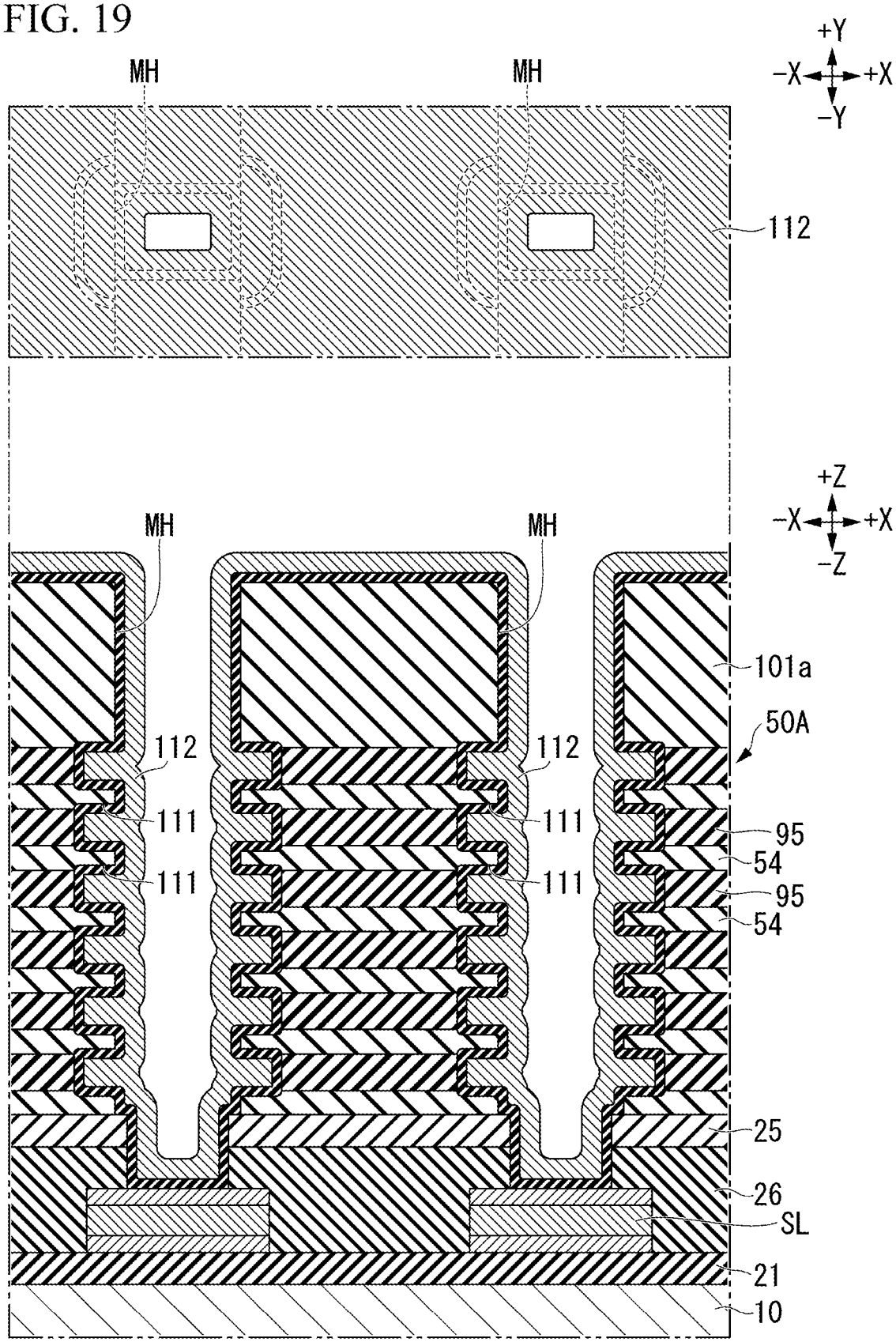
FIG. 19 is a view illustrating a method of fabricating the semiconductor storage device of the first embodiment.
Figure 20:
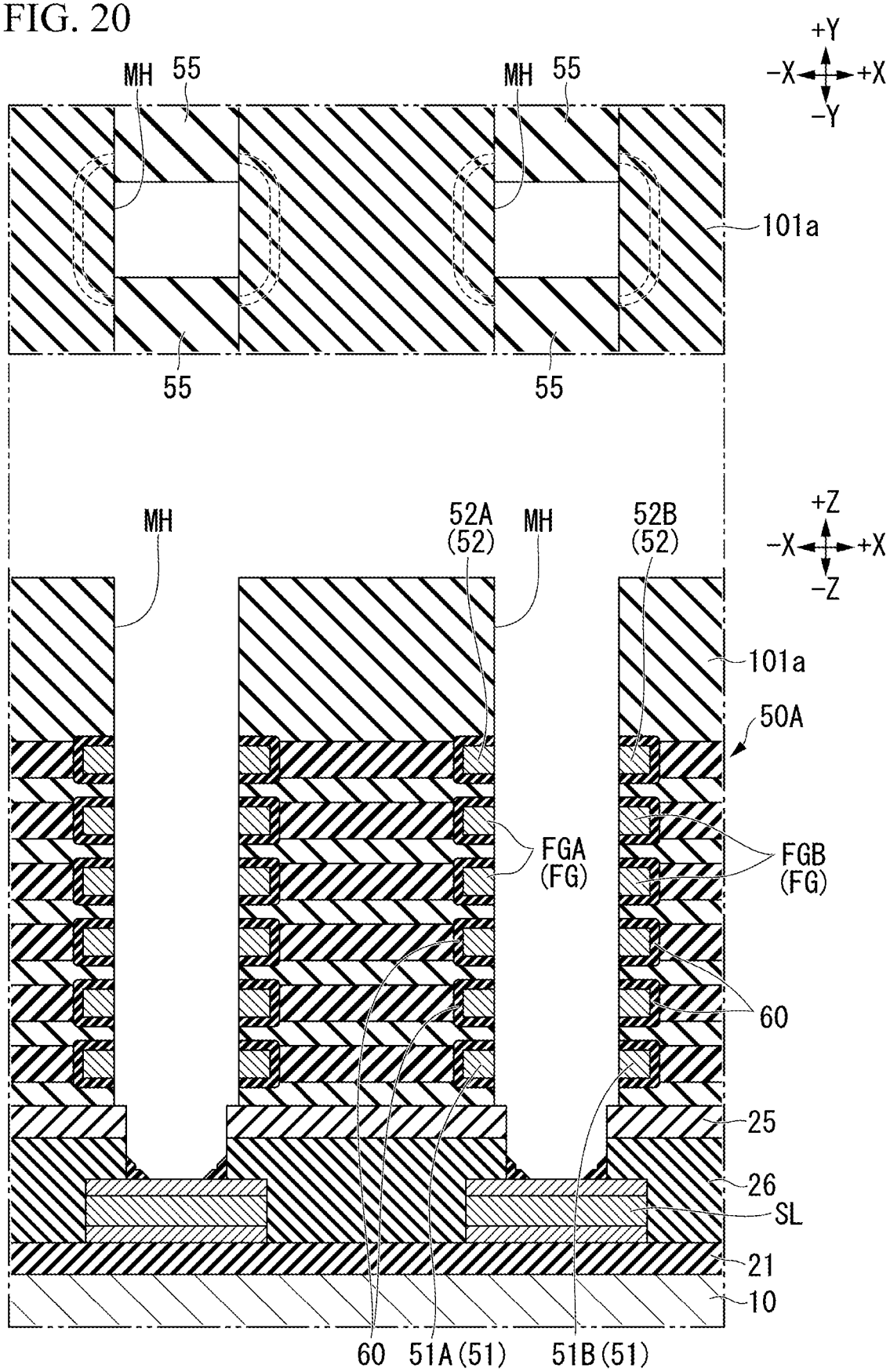
FIG. 20 is a view illustrating a method of fabricating the semiconductor storage device of the first embodiment.

Next, as illustrated in FIG. 18, a block insulating film 60 is formed, for example, by depositing an insulating material on inner surfaces of the memory holes MH and inner surfaces of the dents 111, thus forming a block insulating film 60. Next, as illustrated in FIG. 19, a floating gate electrode film 112 is formed, for example, by depositing polysilicon on an inner circumferential surface of the block insulating film 60. In this case, the polysilicon is provided to fill the dents 111. Next, as illustrated in FIG. 20, unnecessary insulating material and polysilicon are removed from the inner surfaces of the memory holes MEL Thereby, an unnecessary portion of the floating gate electrode film 112 is removed, and floating gate electrodes FG are formed.

Figure 21:
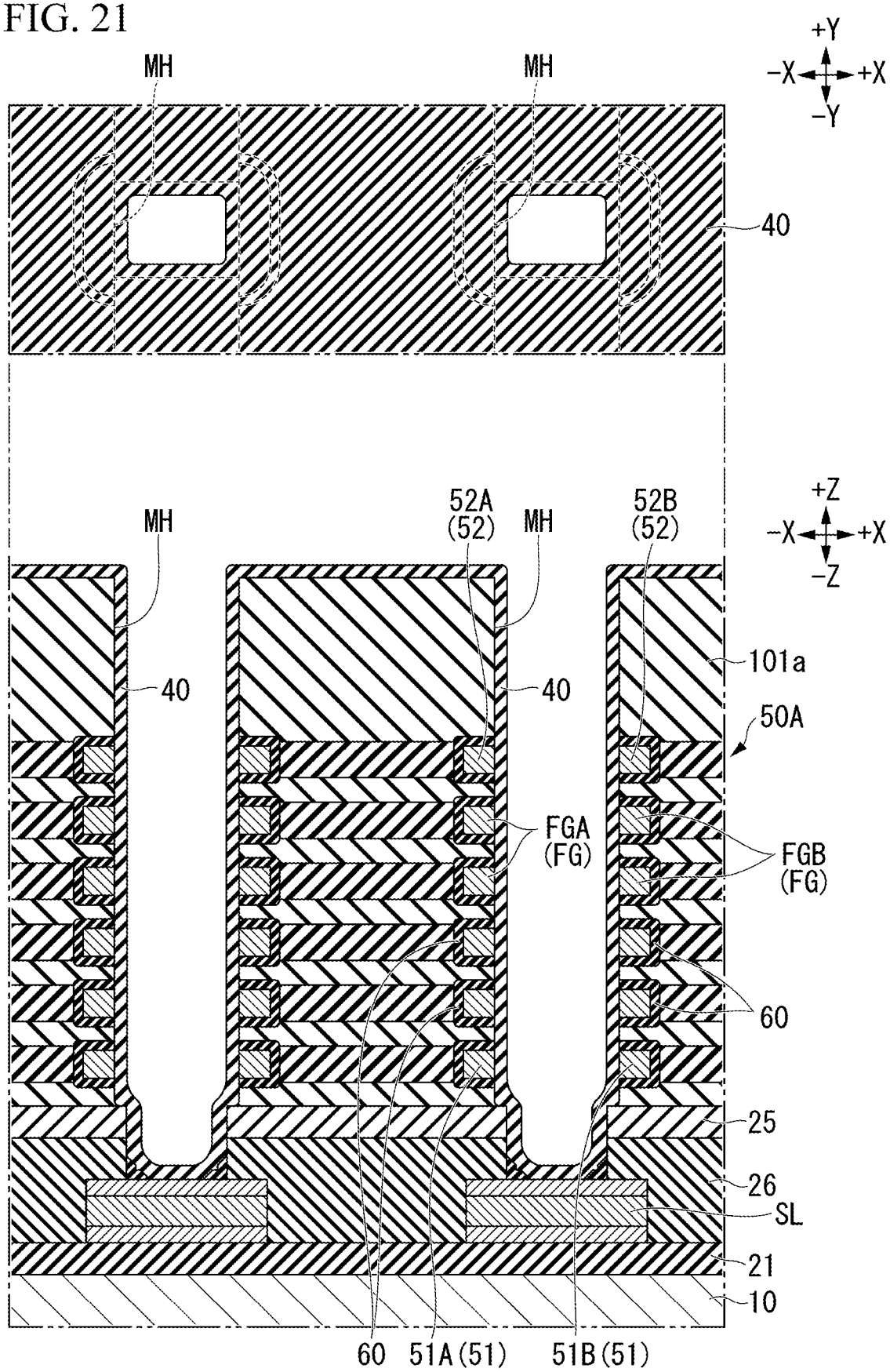
FIG. 21 is a view illustrating a method of fabricating the semiconductor storage device of the first embodiment.
Figure 22:
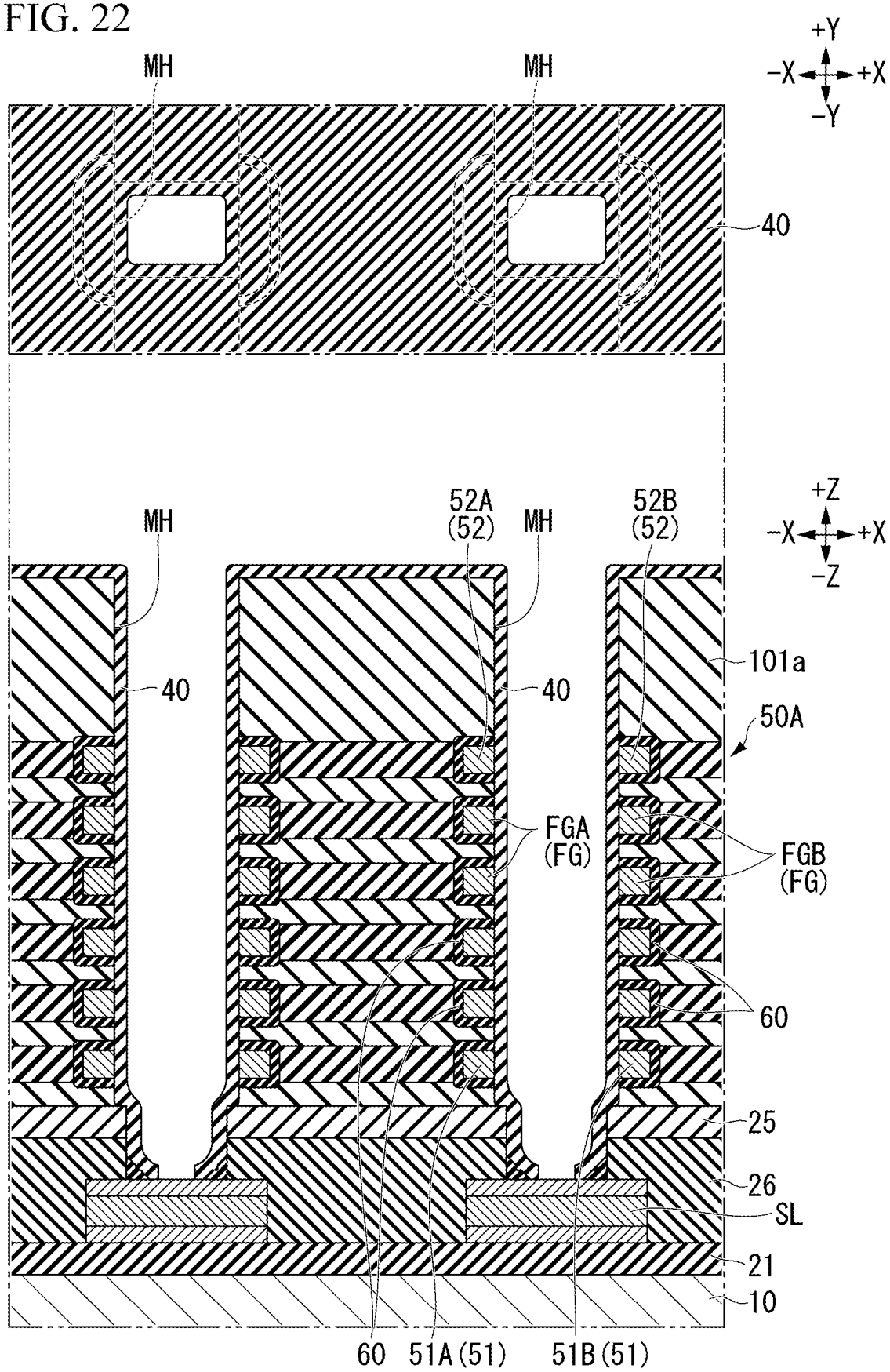
FIG. 22 is a view illustrating a method of fabricating the semiconductor storage device of the first embodiment.

Next, as illustrated in FIG. 21, a tunnel insulating film 40 is formed, for example, by depositing silicon oxide on the inner surfaces of the memory holes MH. The tunnel insulating film 40 is an example of a "first film." Next, as illustrated in FIG. 22, bottoms of the tunnel insulating film 40 are removed by, for example, etching, and the source lines SL are exposed in the memory holes MH.

Figure 23:
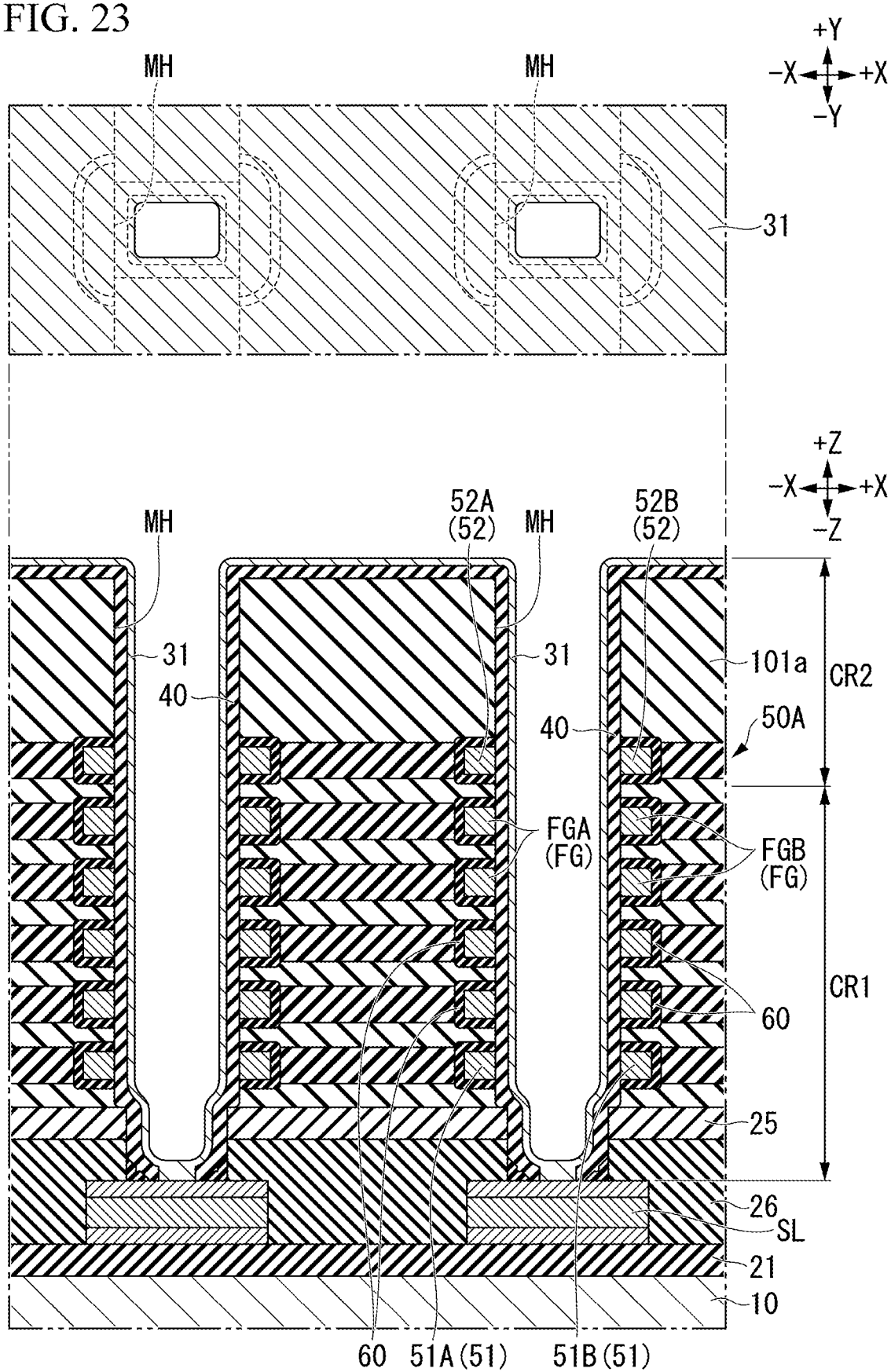
FIG. 23 is a view illustrating a method of fabricating the semiconductor storage device of the first embodiment.
Figure 24:
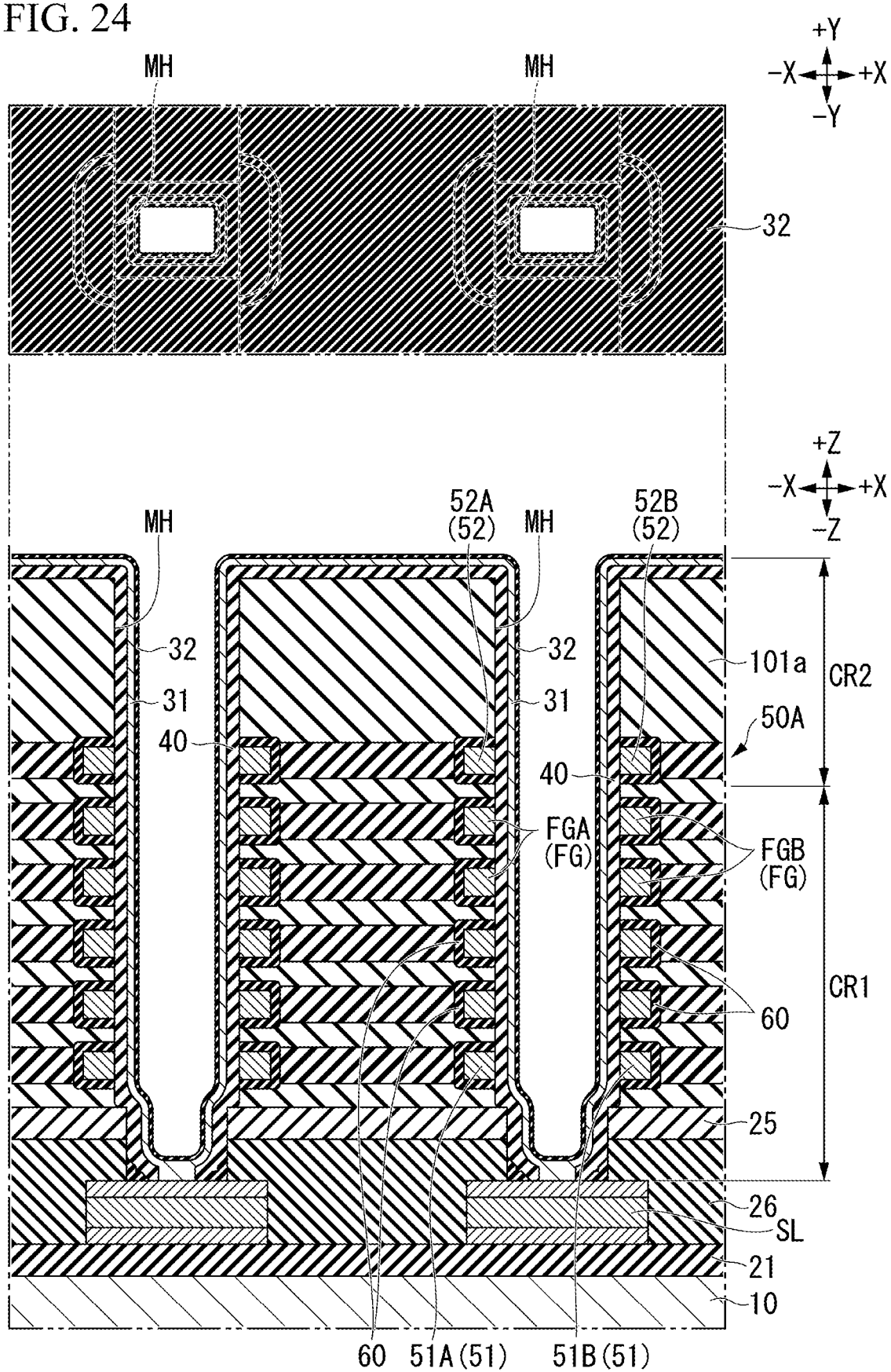
FIG. 24 is a view illustrating a method of fabricating the semiconductor storage device of the first embodiment.

Next, as illustrated in FIG. 23, a channel part 31 of a pillar 30 is formed on the inner circumferential surface of the tunnel insulating film 40 by laminating a semiconductor material. The channel part 31 includes a first region CR1 and a second region CR2. The first region CR1 is a region that is included in the aforementioned first region PR1 of the pillar 30. The second region CR2 is a region that is included in the aforementioned second region PR2 of the pillar 30. The channel part 31 may be annealed to crystallize amorphous silicon at this timing, or be annealed at a timing after this timing. The channel part 31 is an example of a "second film." Next, as illustrated in FIG. 24, an insulating film 32 is formed on an inner circumferential surface of the channel part 31 by depositing an insulating material.

Figure 25:
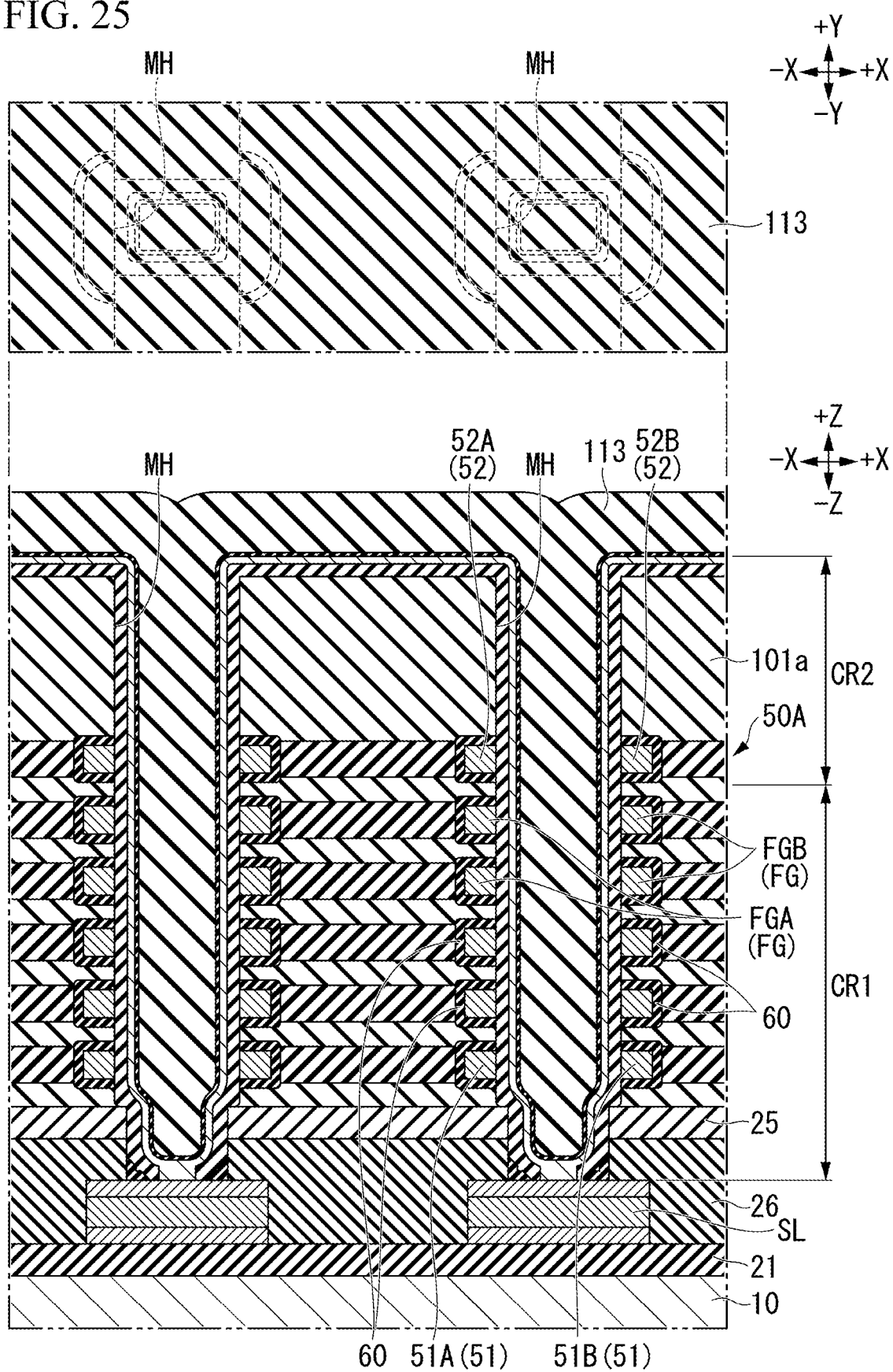
FIG. 25 is a view illustrating a method of fabricating the semiconductor storage device of the first embodiment.

Next, as illustrated in FIG. 25, for example, silicon oxide (SiO) is deposited, and thereby a sacrificial film 113 embedding the inside of the memory holes MH is formed. A material having a faster depositing speed than a semiconductor material (e.g., amorphous silicon) is used for the sacrificial film 113.

Figure 26:
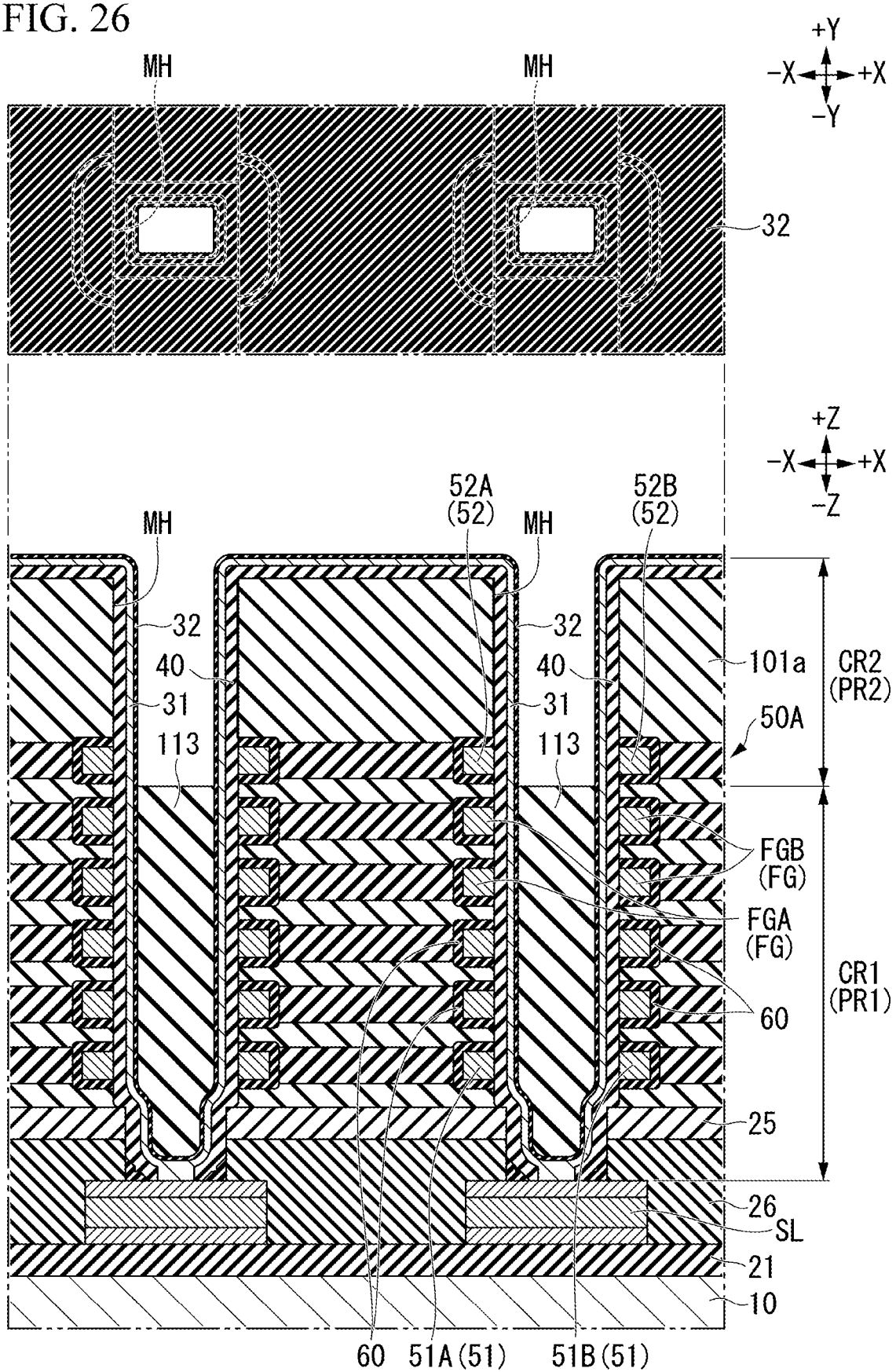
FIG. 26 is a view illustrating a method of fabricating the semiconductor storage device of the first embodiment.

Next, as illustrated in FIG. 26, the sacrificial film 113 is removed by, for example, etching-back, except a portion corresponding to the first region CR1 of the pillar 30. Thereby, the sacrificial film 113 remains in only a region corresponding to the first region PR1 of the pillar 30 in the memory holes MH.

Figure 27:
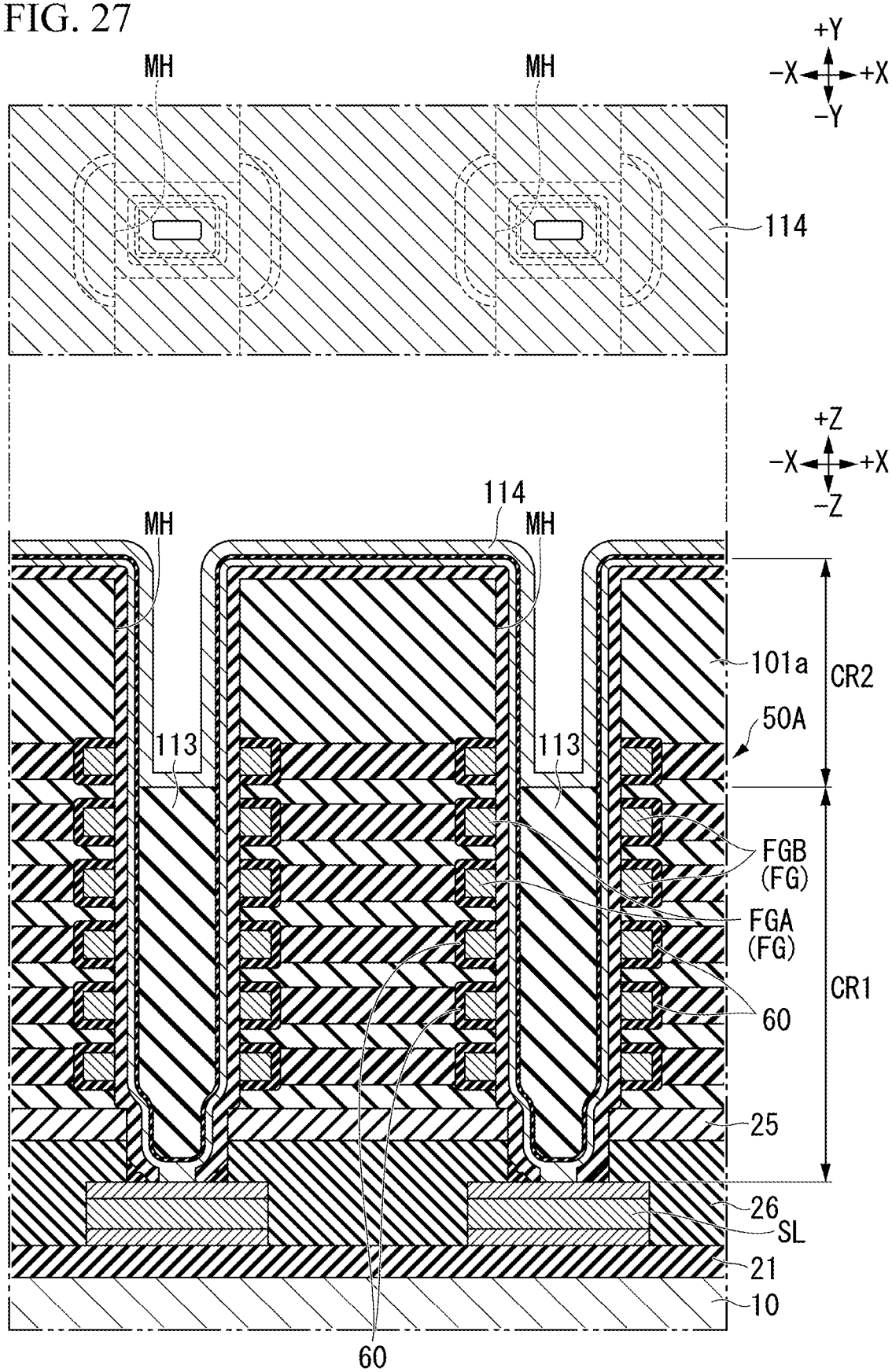
FIG. 27 is a view illustrating a method of fabricating the semiconductor storage device of the first embodiment.
Figure 28:
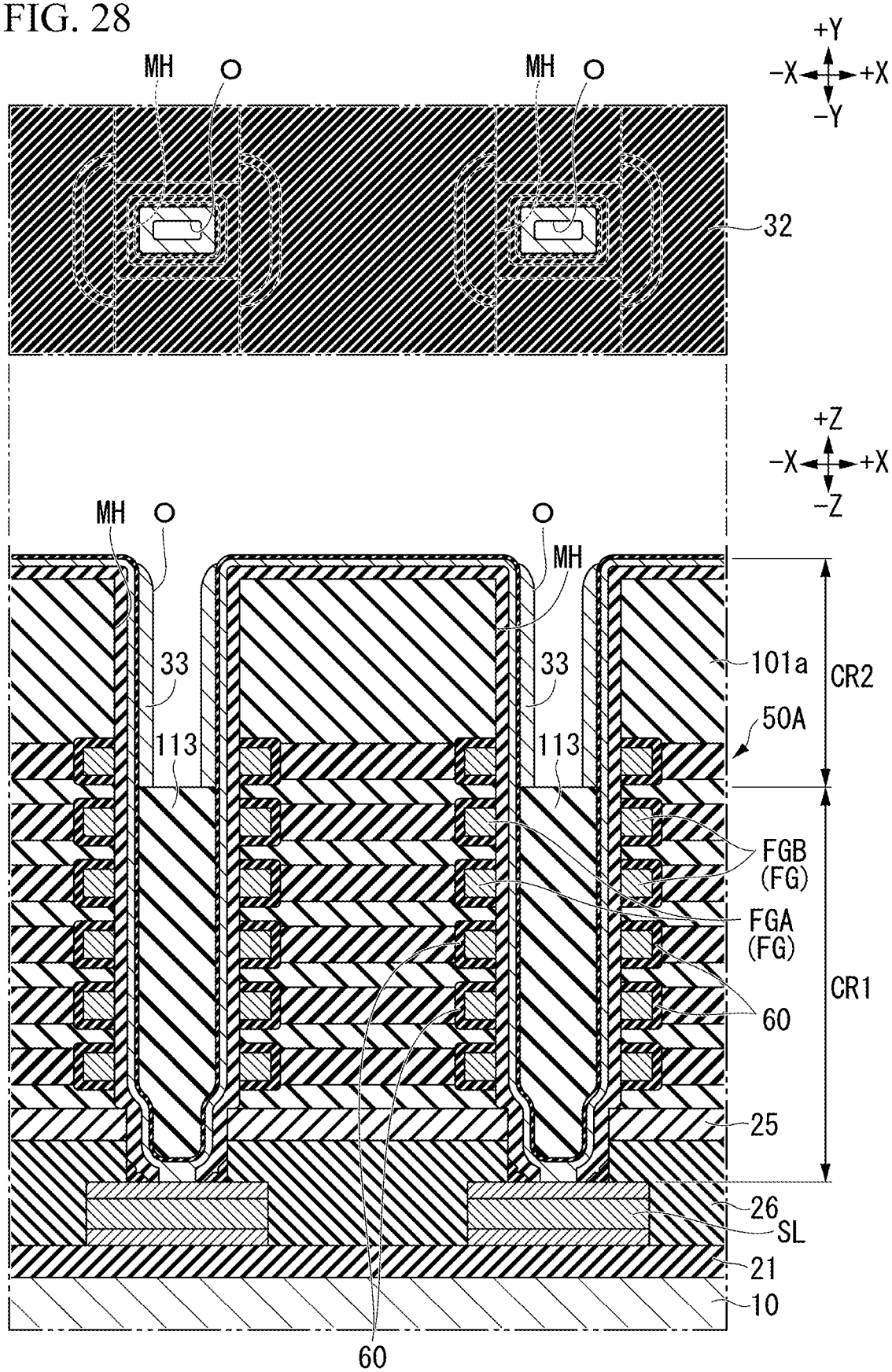
FIG. 28 is a view illustrating a method of fabricating the semiconductor storage device of the first embodiment.

Next, as illustrated in FIG. 27, a semiconductor film 114 is formed on the mask 101a, on inner surfaces of the memory holes MH, and on the sacrificial film 113 inside the semiconductor film 114 by, for example, depositing a semiconductor material. Next, as illustrated in FIG. 28, the semiconductor film 114 is removed on the mask 101a and above the center of the sacrificial film 113 by, for example, etching-back. Thereby, a ring-shaped sidewall 33 is formed on an inner circumferential side of each of the channel part 31 in the second region CR2, and openings O of upper portions of the memory holes MH are narrowed. That is, in the present embodiment, the sidewalls 33 are formed in a state in which the sacrificial film 113 is provided on the inner circumferential side of the channel part 31 in the first region CR1. Each sidewall 33 is an example of a "third film."

Figure 29:
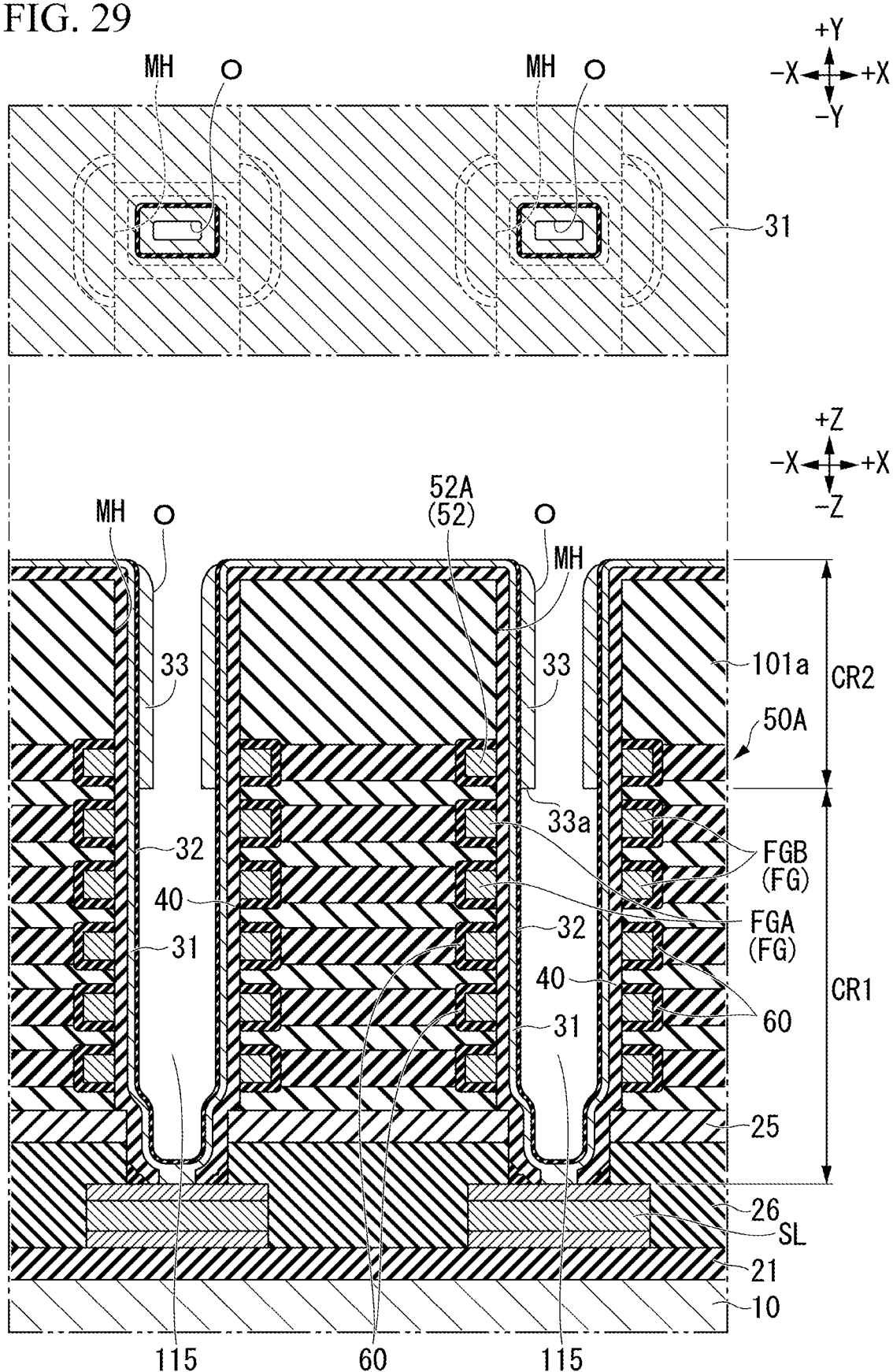
FIG. 29 is a view illustrating a method of fabricating the semiconductor storage device of the first embodiment.

Next, as illustrated in FIG. 29, the sacrificial film 113 inside the memory holes MH is removed through the openings O inside the sidewalls 33 by, for example, wet etching. Thereby, hollow parts 115 are again formed in the first regions PR1 of the pillars 30.

Figure 30:
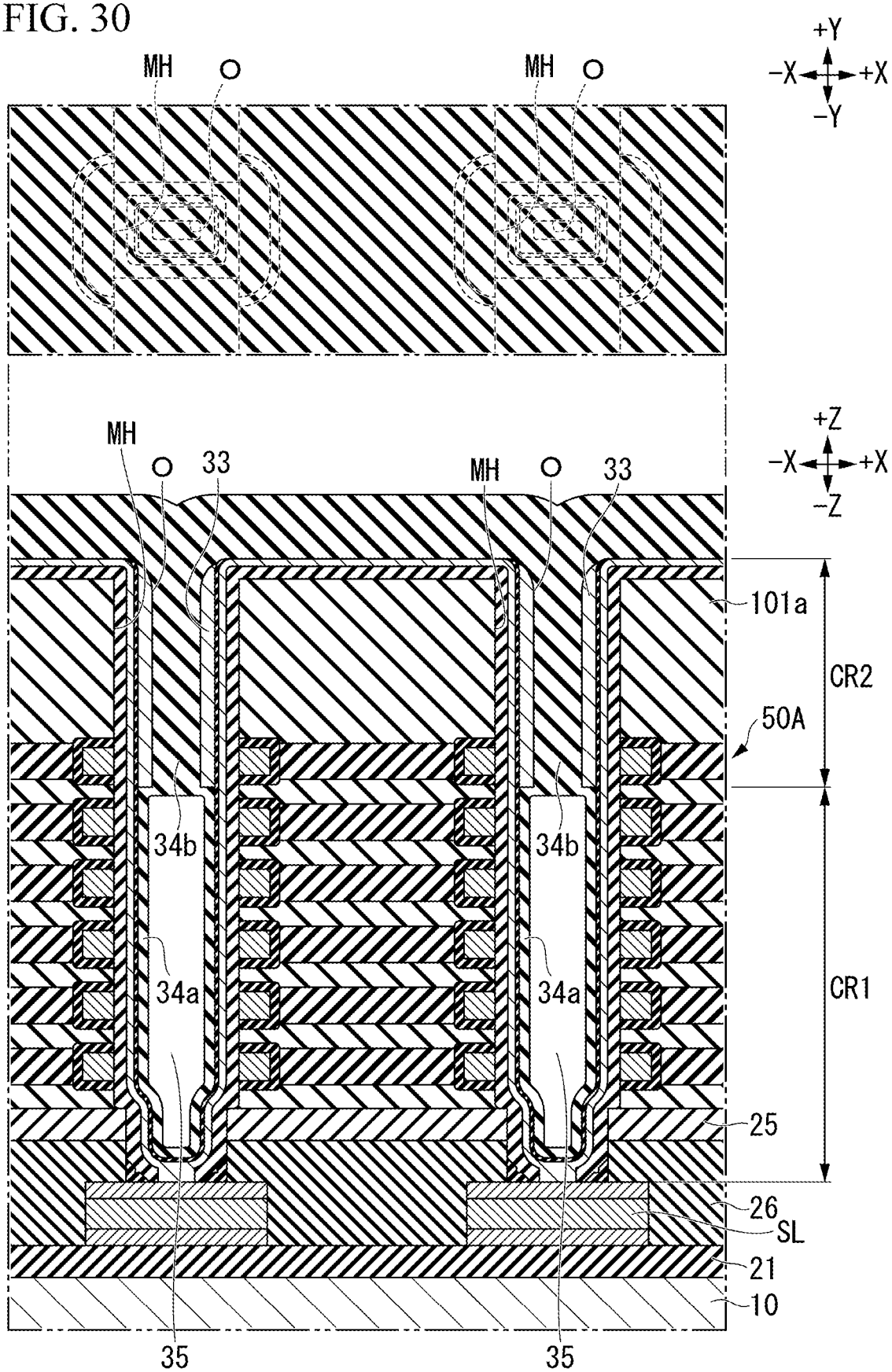
FIG. 30 is a view illustrating a method of fabricating the semiconductor storage device of the first embodiment.

Next, as illustrated in FIG. 30, an insulating material having relatively bad coverage such as, for example, TEOS is deposited. This insulating material is a material that have worse coverage than, for example, the semiconductor material of which the sidewalls 33 are formed. The "coverage" refers to a rate at which, in a case where a material is deposited, for example, on a complicated surface under the same condition, the surface can be covered with this material. By depositing the insulating material, a part of the insulating material is attached on an inner circumferential surface of the insulating film 32 on the inner circumferential side of the channel parts 31 in the first regions CR1, and the first insulating parts 34a are formed. Further, the insulating material blocks the openings O on inner circumferential sides of the sidewalls 33, and thus forming second insulating parts 34b. Thereby, inner circumferential sides of the sidewalls 33 are embedded while leaving at least parts of the hollow parts 115 on the inner circumferential side of the channel parts 31 in the first regions CR1. That is, portions of the hollow parts 115 which are not embedded by the insulating material remains as hollow parts 35 of the pillars 30.

Figure 31:
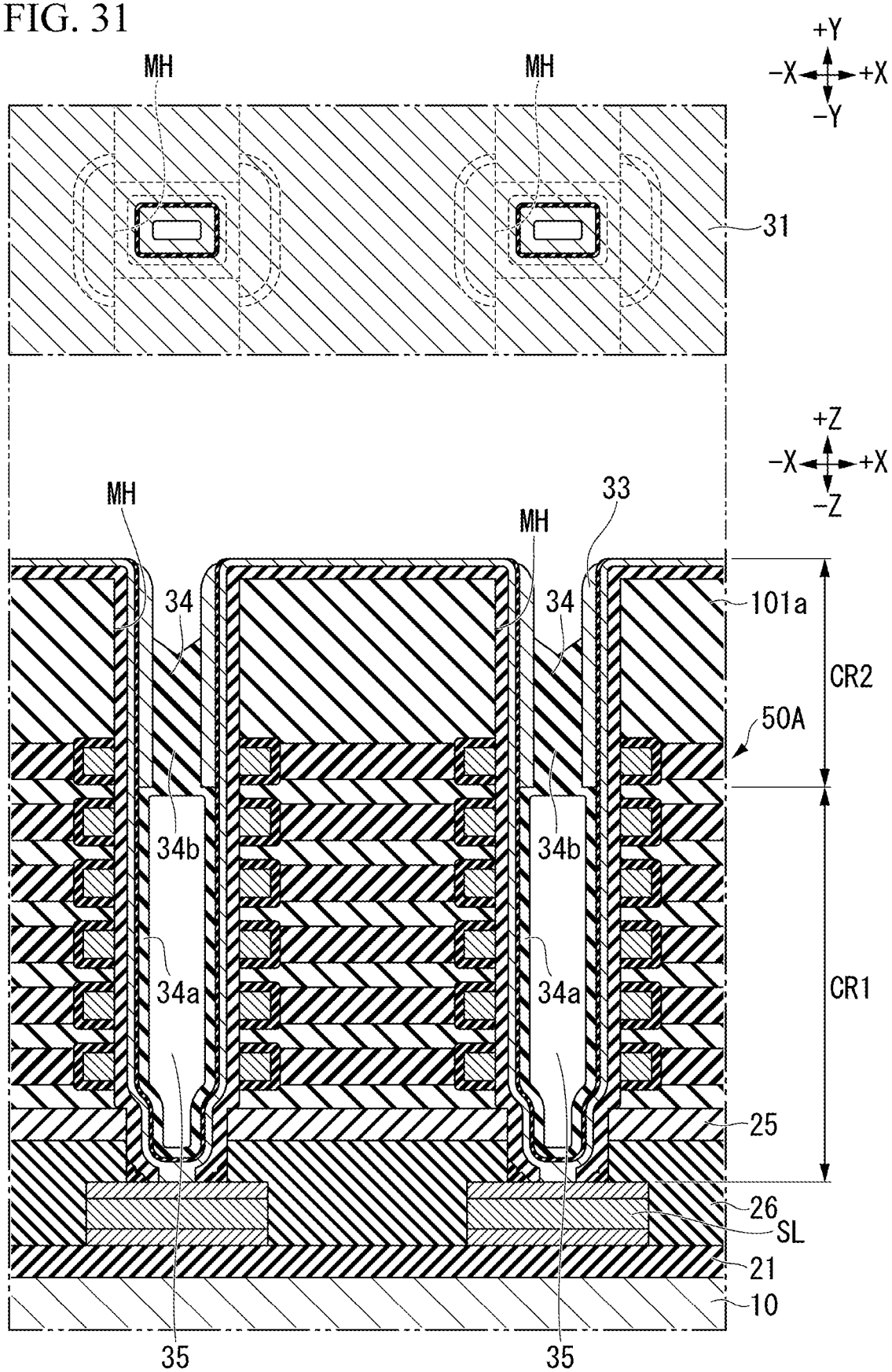
FIG. 31 is a view illustrating a method of fabricating the semiconductor storage device of the first embodiment.
Figure 32:
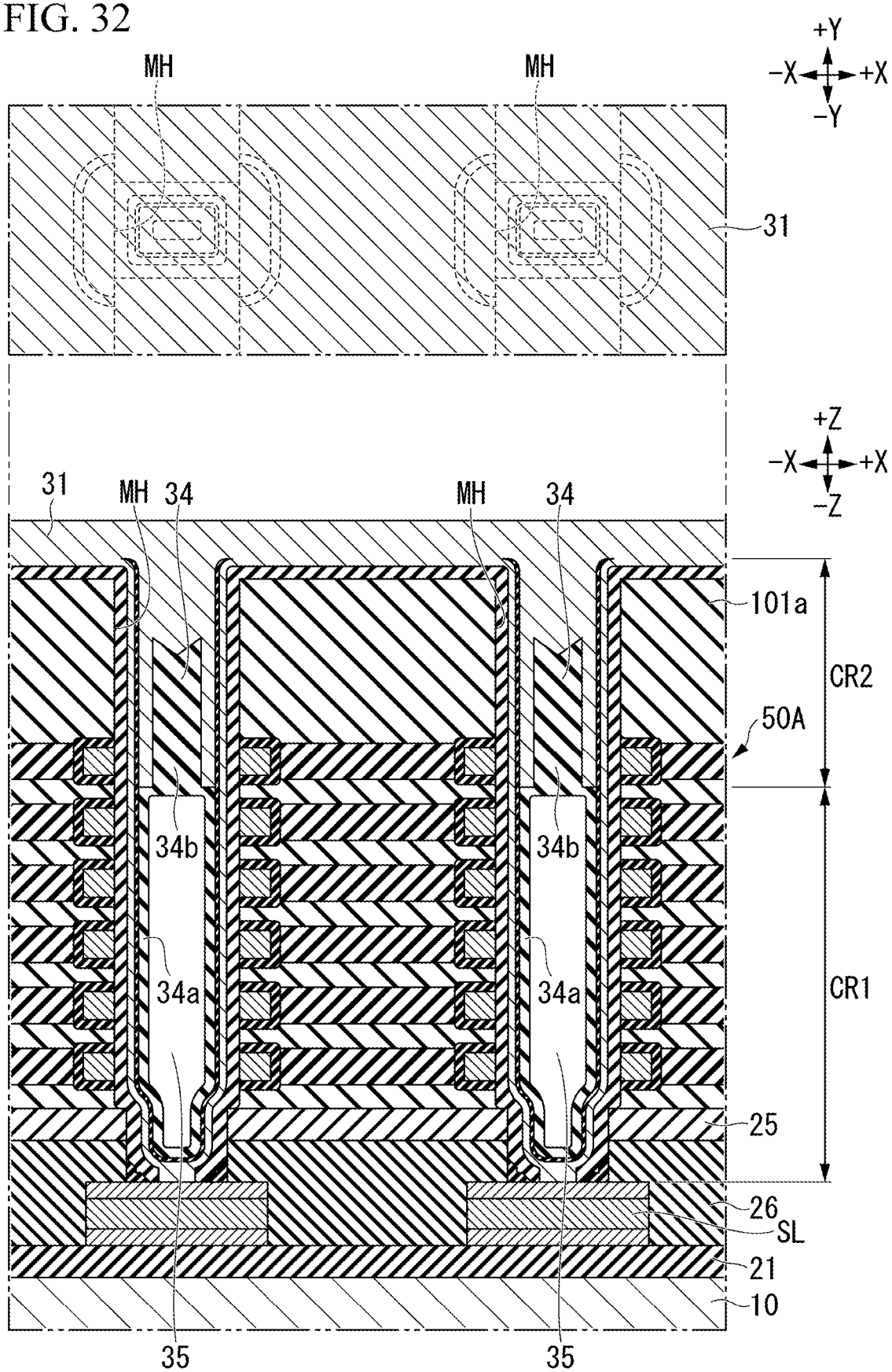
FIG. 32 is a view illustrating a method of fabricating the semiconductor storage device of the first embodiment.
Figure 33:
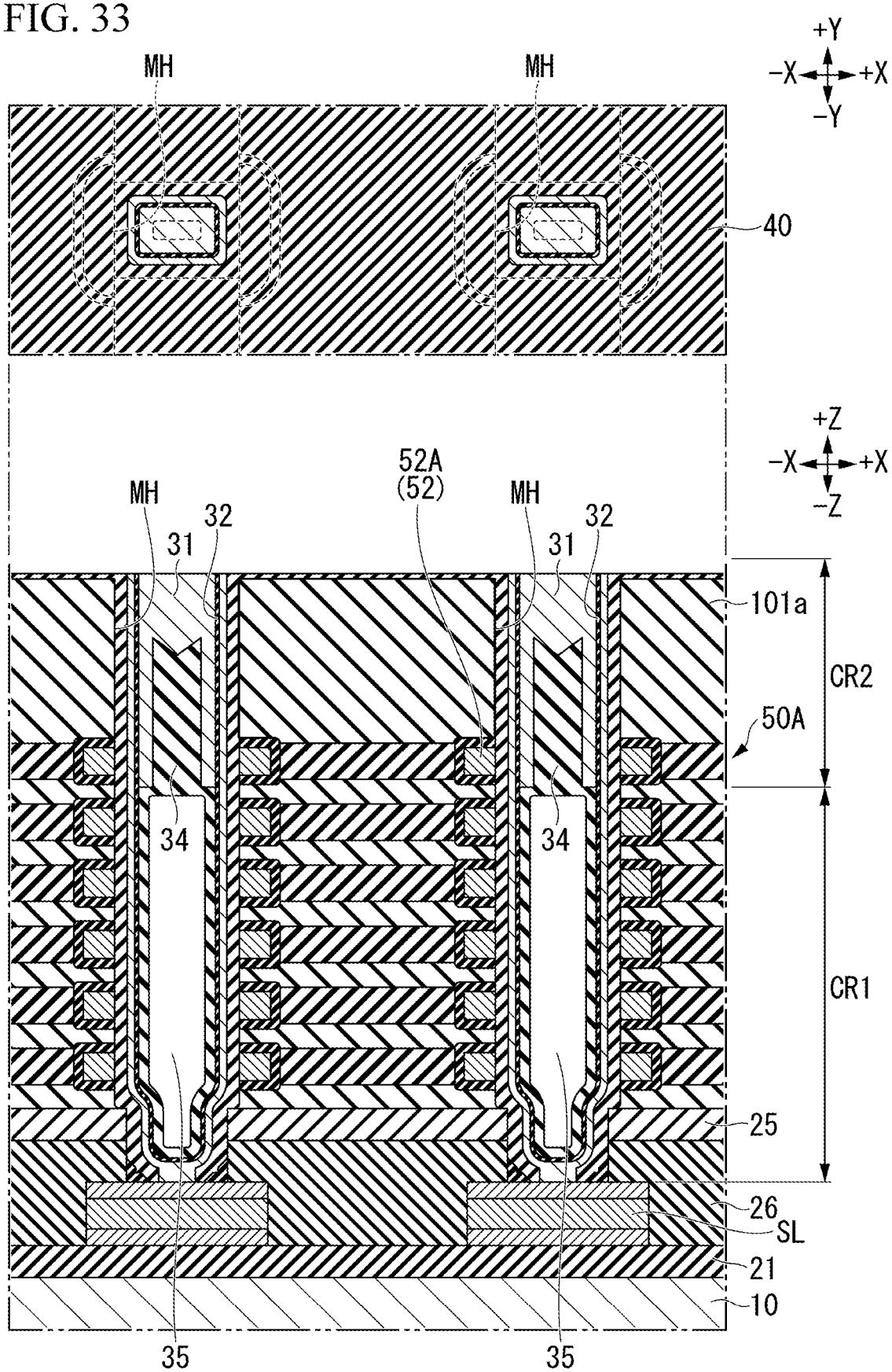
FIG. 33 is a view illustrating a method of fabricating the semiconductor storage device of the first embodiment.

Next, as illustrated in FIG. 31, the insulating part 34 is removed on the mask 101a and above upper ends of the memory holes MH by, for example, etching-back. Next, as illustrated in FIG. 32, the same semiconductor material as, for example, the material of which the sidewalls 33 are formed is again deposited, and the upper ends of the memory holes MH are embedded. Next, as illustrated in FIG. 33, the semiconductor material is removed on the mask 101a.

Figure 34:
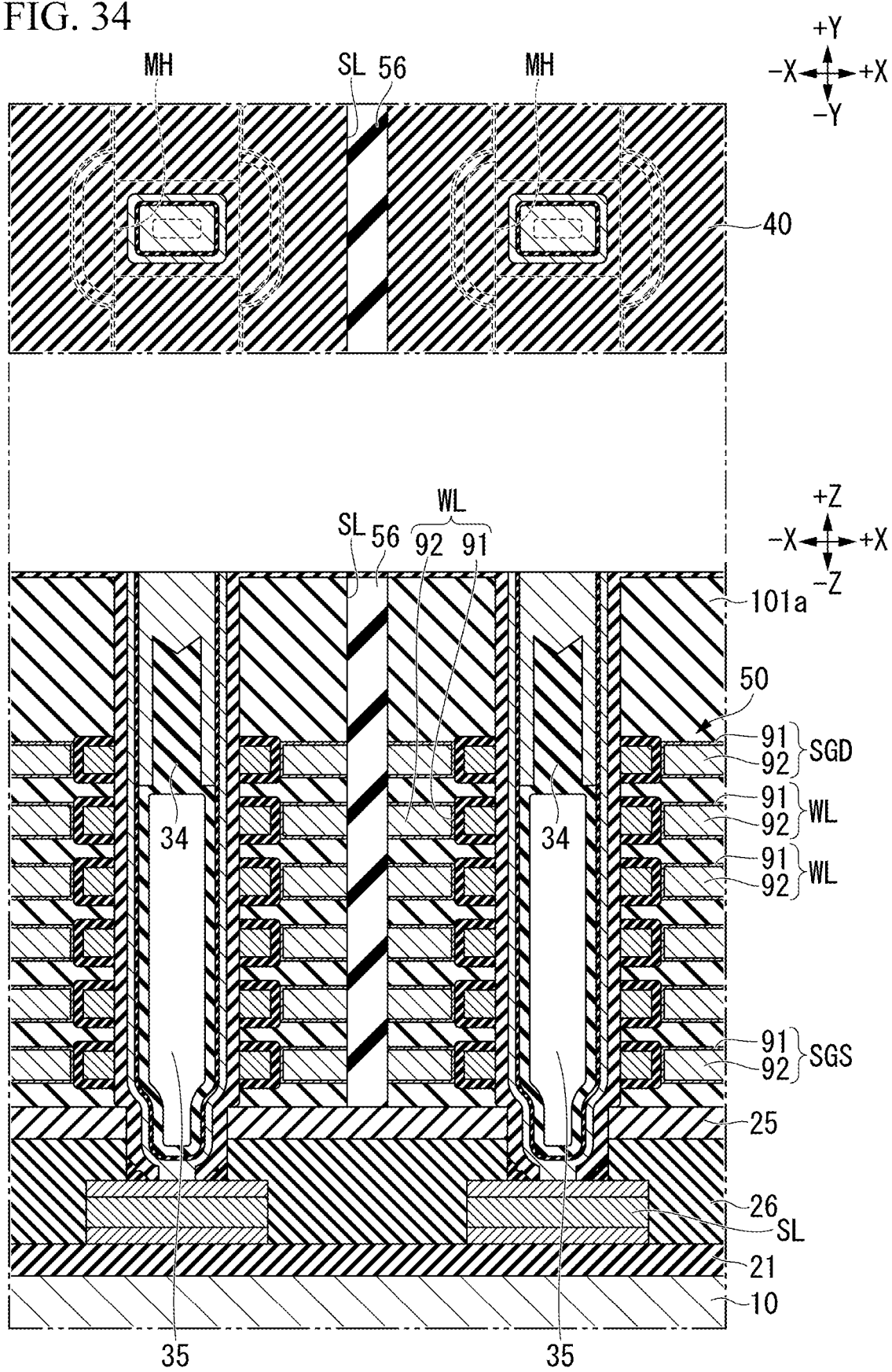
FIG. 34 is a view illustrating a method of fabricating the semiconductor storage device of the first embodiment.

Next, as illustrated in FIG. 34, a slit SL passing through a laminated intermediate 50A in the Z direction is formed, and the filling films 95 are removed via the slit SL by, for example, wet etching. Next, barrier metal films 91 and conductive members 92 are provided in spaces from which the filling films 95 are removed, and thereby a plurality of word lines WL, source-side select gate lines SGS, and drain-side select gate lines SGD are formed. Next, the slit SL is embedded by an insulating material, and thereby an insulating member 56 is formed. Thereby, the laminated intermediate 50A becomes a laminate 50. Next, bit lines BL, a plurality of interconnections L1, L2 and L3, and contacts 80 are formed by a known method. Thereby, the semiconductor storage device 1 is formed.

According to the semiconductor storage device 1 having this constitution, electrical characteristics can be improved. That is, in a case where, for example, many parts of the pillar 30 are formed of an oxide film, the electrical characteristics of the semiconductor storage device 1 may be reduced by immobile charges in the oxide film. For example, when the oxide film has positive immobile charges, a threshold value of the memory cell used to determine a charge state is generally shifted to a positive side, and a sufficient gap between neighboring threshold value distributions is hardly secured. As a result, it may be difficult to improve reliability to read out data. On the other hand, when the oxide film has negative immobile charges, a threshold value of a fringe transistor of, for example, the memory cell may be reduced, and a writing slope may be reduced. As a result, it may be difficult to improve writing reliability of data. The "threshold value of the fringe transistor" is a threshold value at which a parasite transistor generated when electric charges are concentrated on ends of the memory cell is put in an ON state. Further, the "writing slope" is a slope in a graph of a ratio of "Δ threshold value" to "Δ writing voltage" when the writing voltage is swept.

Thus, in the present embodiment, the hollow part 35 is provided inside the channel part 31 at the pillar 30. According to this constitution, for example, in comparison with a case where the center of the pillar 30 is formed of an oxide film, the immobile charges included in the pillar 30 can be reduced. Thereby, the electrical characteristics of the semiconductor storage device 1 can be improved.

(Modification of the Fabricating Method of the First Embodiment)

Next, a modification of the method of fabricating of the semiconductor storage device 1 of the first embodiment will be described. In this modification, since the processes up to the process of forming the insulating film 32 (the process illustrated in FIG. 24) is the same as those of the first embodiment, the description thereof will be omitted.

Figure 35:
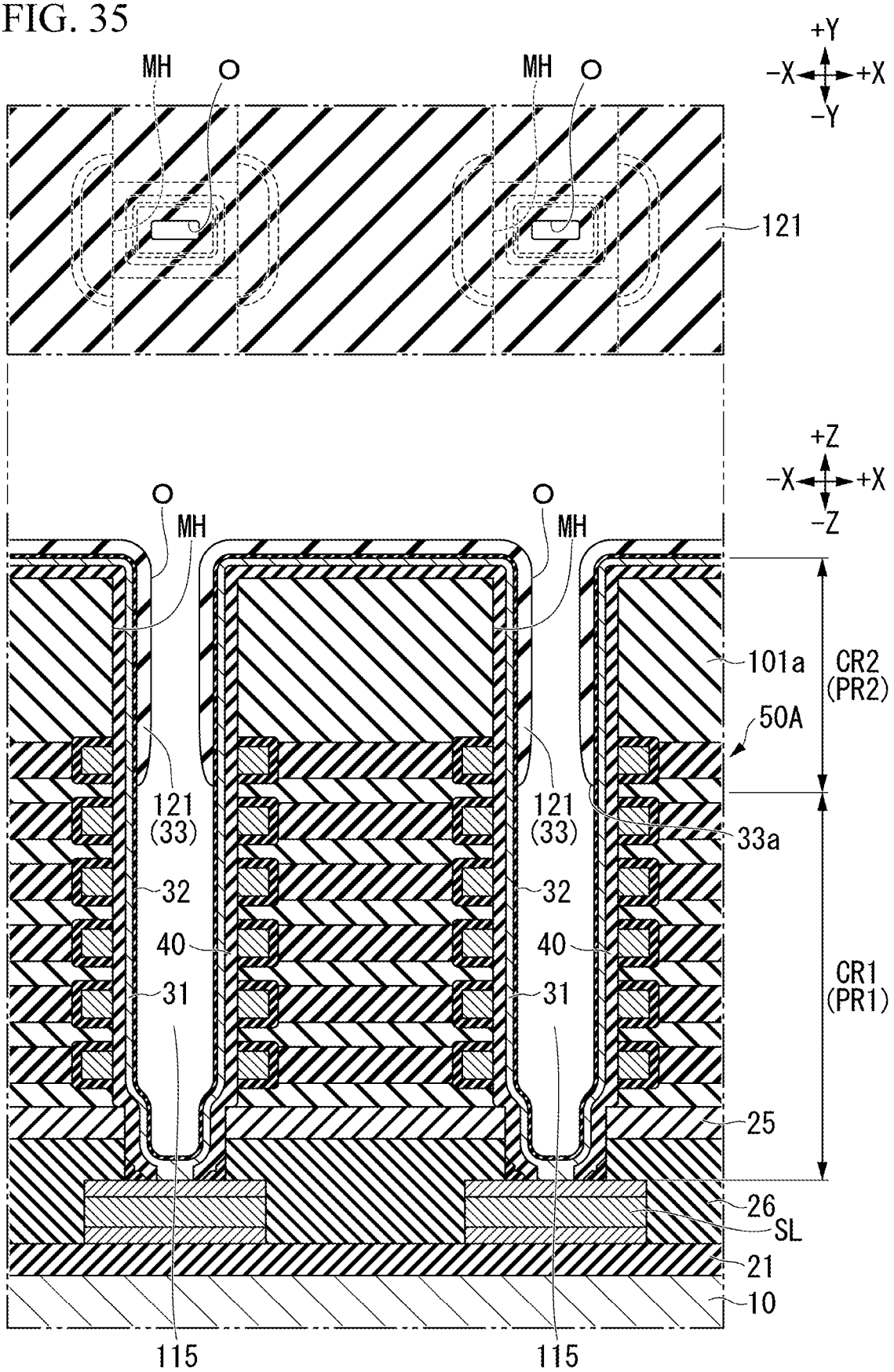
FIG. 35 is a view illustrating a modification of the method of fabricating the semiconductor storage device of the first embodiment.

In this modification, after the insulating film 32 is formed, the sacrificial film 113 is not provided, and the sidewalls 33 are formed. To be specific, as illustrated in FIG. 35, in a state in which hollow parts 115 remain on the inner circumferential side of the channel parts 31 in the first regions CR1, insulating films 121 are formed by depositing an insulating material. At least one of a material and a deposition condition of the deposited insulating material is adjusted, and thereby the insulating films 121 are formed inside the memory holes MH only around the openings of the memory holes MH. Thereby, the sidewalls 33 are formed only on the inner circumferential side of the channel parts 31 in the second regions CR2. These insulating films 121 may be formed, for example, by depositing an insulating material having worse coverage than a TEOS, or may be formed by previously applying nucleuses that become starting points of growth of the insulating films 121 only to regions on which the insulating films 121 is to be formed.

Figure 36:
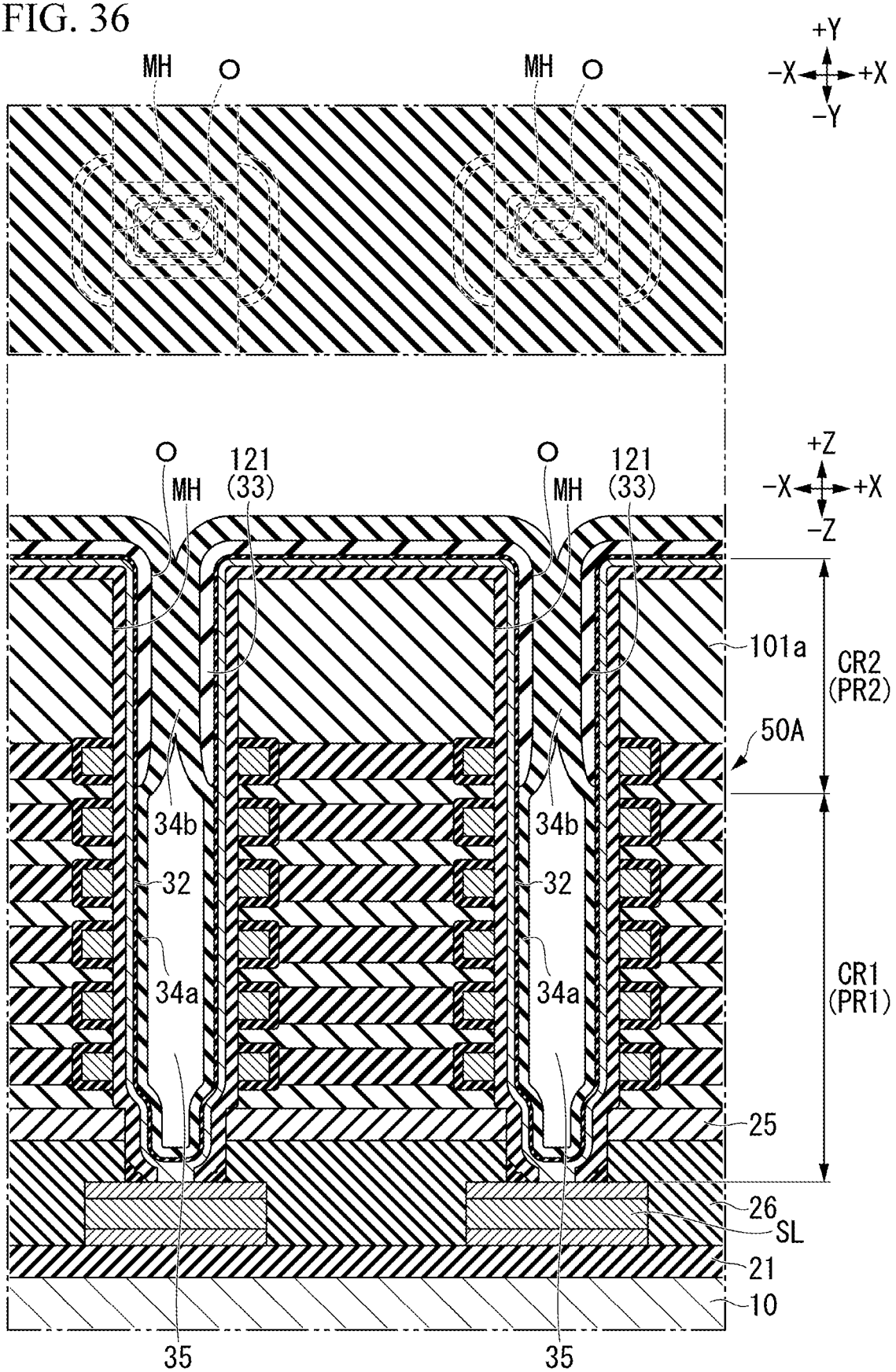
FIG. 36 is a view illustrating the modification of the method of fabricating the semiconductor storage device of the first embodiment.

Next, as illustrated in FIG. 36, an insulating material having relatively bad coverage such as a TEOS is deposited. Thereby, a part of the insulating material is deposited on an inner circumferential surfaces of the insulating films 32 on the inner circumferential sides of the channel parts 31 in the first regions CR1, and a first insulating parts 34a are formed. Further, an insulating material blocks the openings O on inner circumferential sides of the sidewalls 33, and second insulating parts 34b are formed. Thereby, the inner circumferential sides of the sidewalls 33 are embedded while leaving at least parts of the hollow parts 115 on the inner circumferential sides of the channel parts 31 in the first regions CR1. That is, portions of the hollow parts 115 which are not embedded by the insulating material are left as the hollow parts 35 of the pillars 30.

Figure 37:
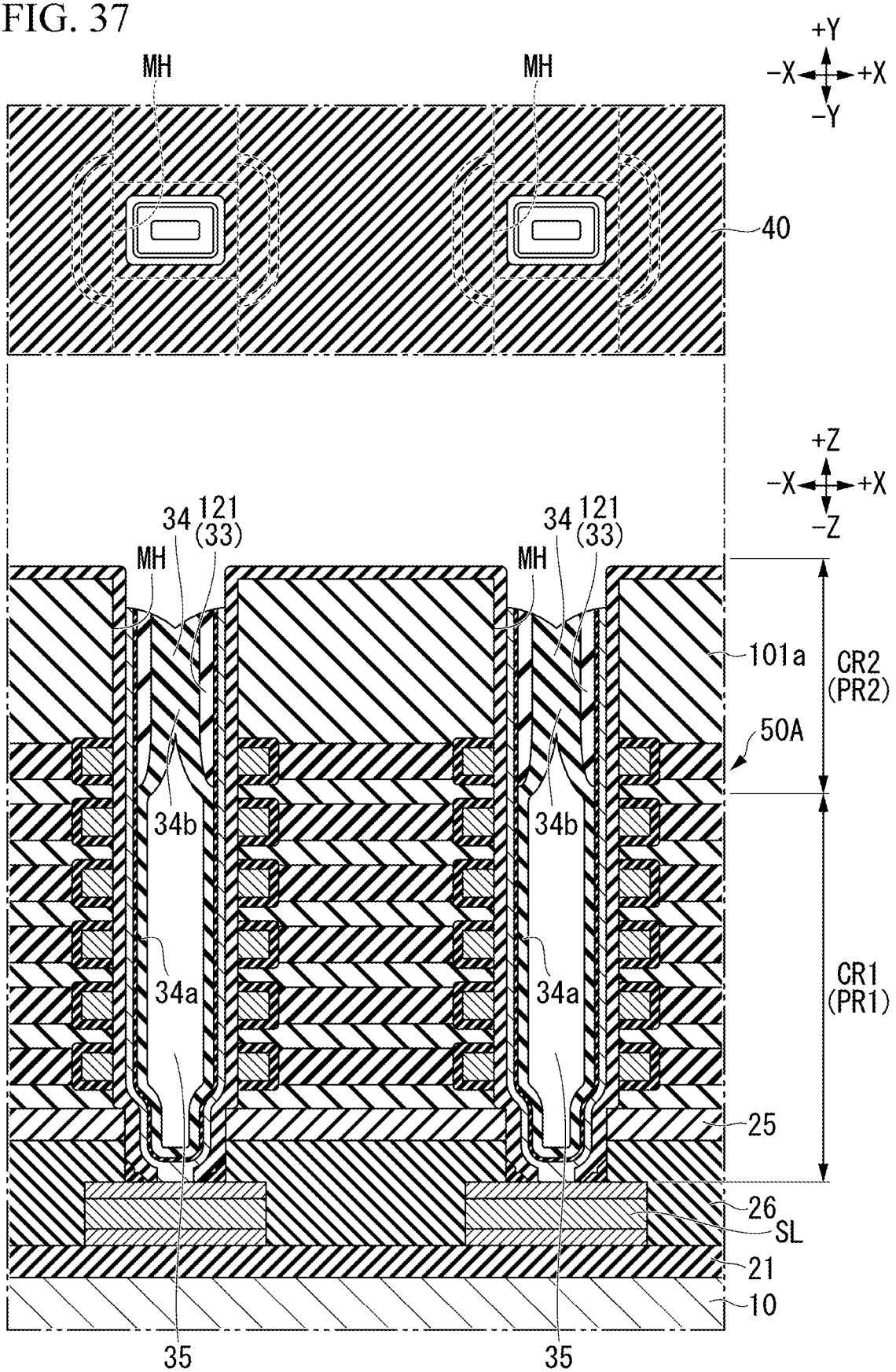
FIG. 37 is a view illustrating the modification of the method of fabricating the semiconductor storage device of the first embodiment.
Figure 38:
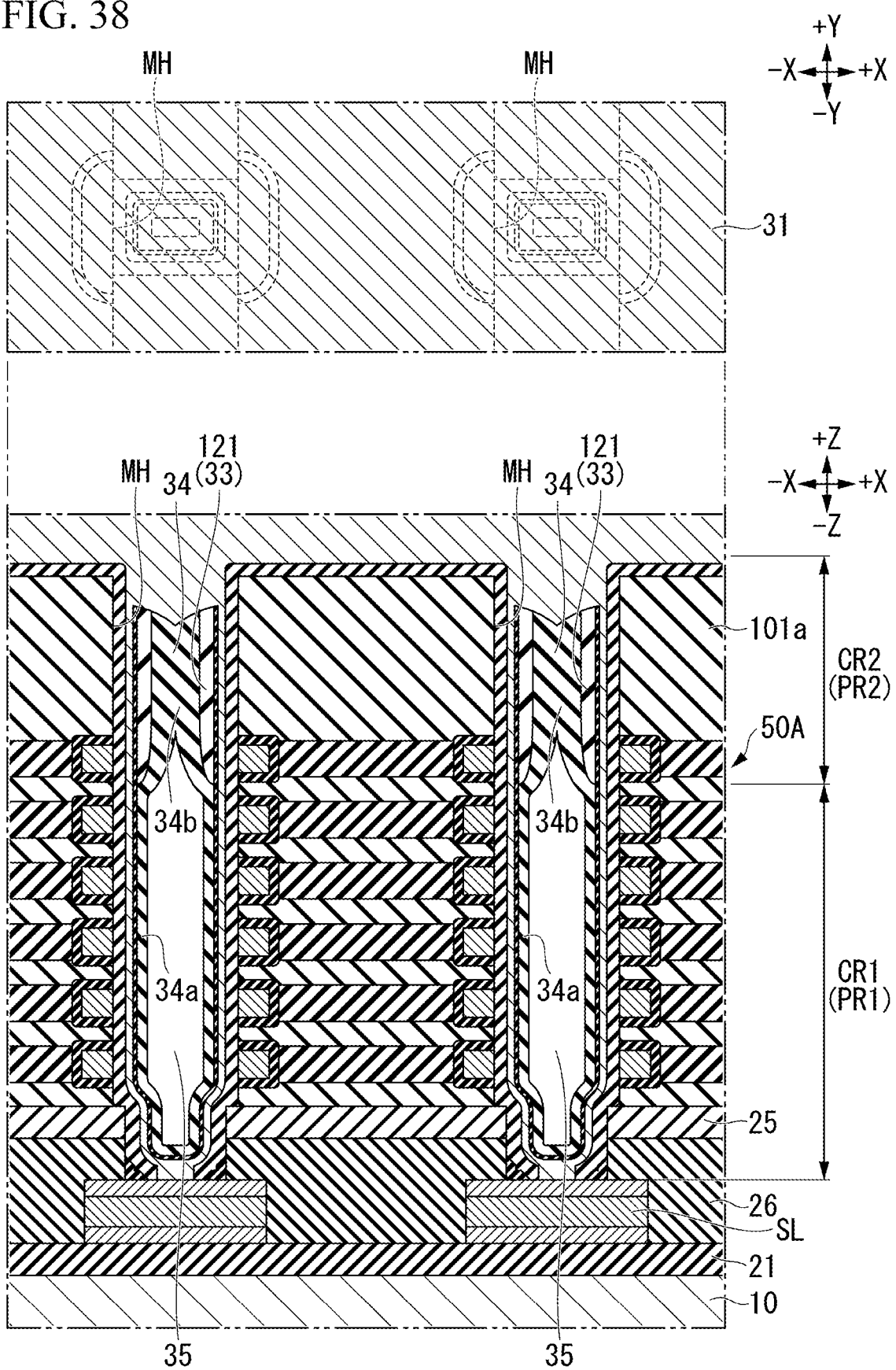
FIG. 38 is a view illustrating the modification of the method of fabricating the semiconductor storage device of the first embodiment.
Figure 39:
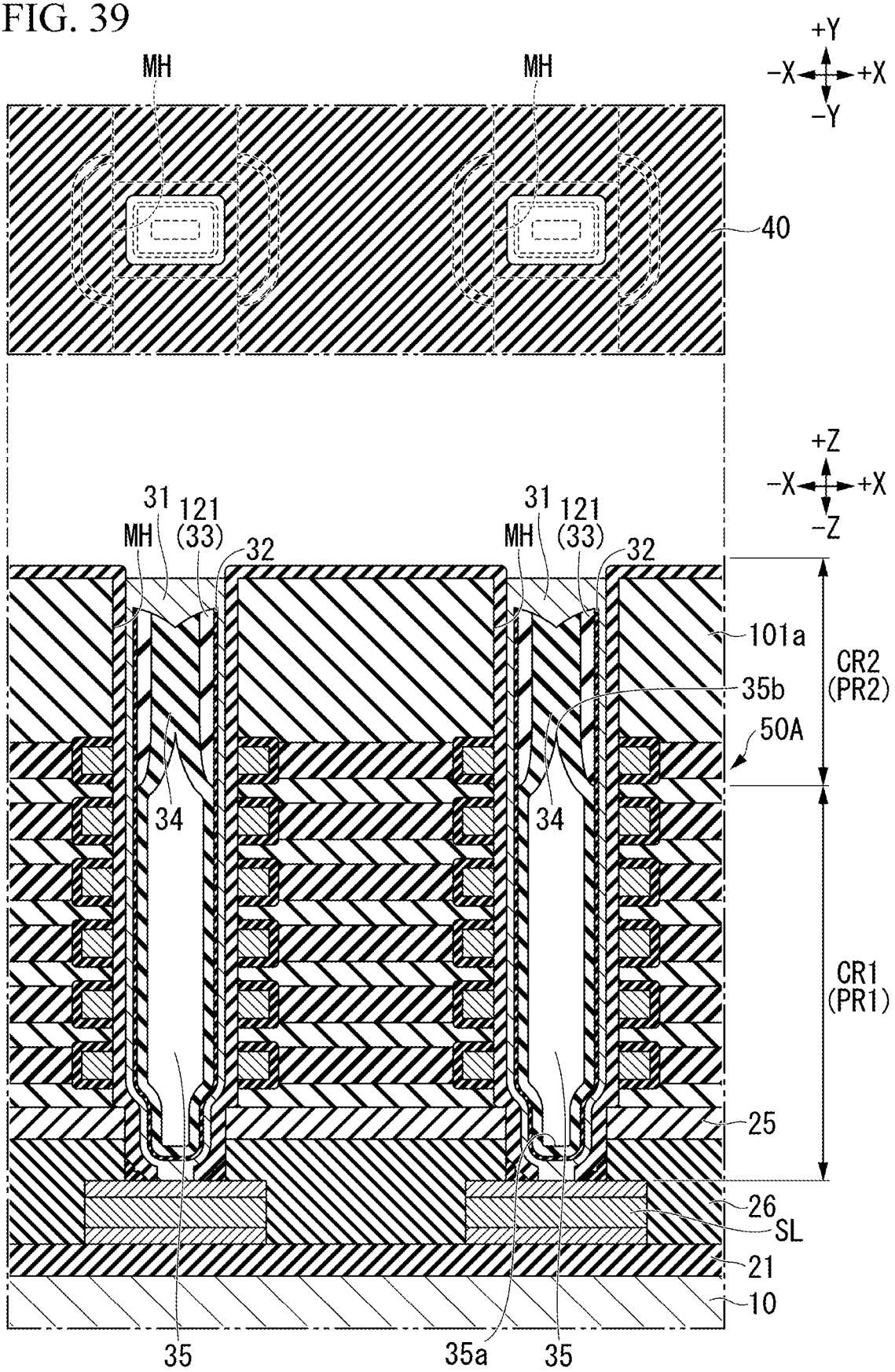
FIG. 39 is a view illustrating the modification of the method of fabricating the semiconductor storage device of the first embodiment.

Next, as illustrated in FIG. 37, the insulating part 34 is removed above the mask 101a and from the upper ends of the memory holes MH by, for example, etching-back. Next, as illustrated in FIG. 38, for example, a semiconductor material is deposited, and the upper ends of the memory holes MH are embedded. Next, as illustrated in FIG. 39, the semiconductor material is removed from above the mask 101a. Afterward, the process equivalent to FIG. 34 of the first embodiment is performed, the word lines WL or the like are formed, and the laminated intermediate 50A becomes a laminate 50.

According to this constitution, like the first embodiment, the semiconductor storage device 1 whose electrical characteristics are improved can be provided. According to the fabricating method of this modification, man-hours required for the fabrication can be reduced compared to the first embodiment.

Second Embodiment

Next, a second embodiment will be described. The second embodiment is different from the first embodiment in which each pillar 30 is formed in an elliptical shape when viewed in the Z direction. A constitution other than a constitution described below is the same as in the first embodiment.

Figure 40:
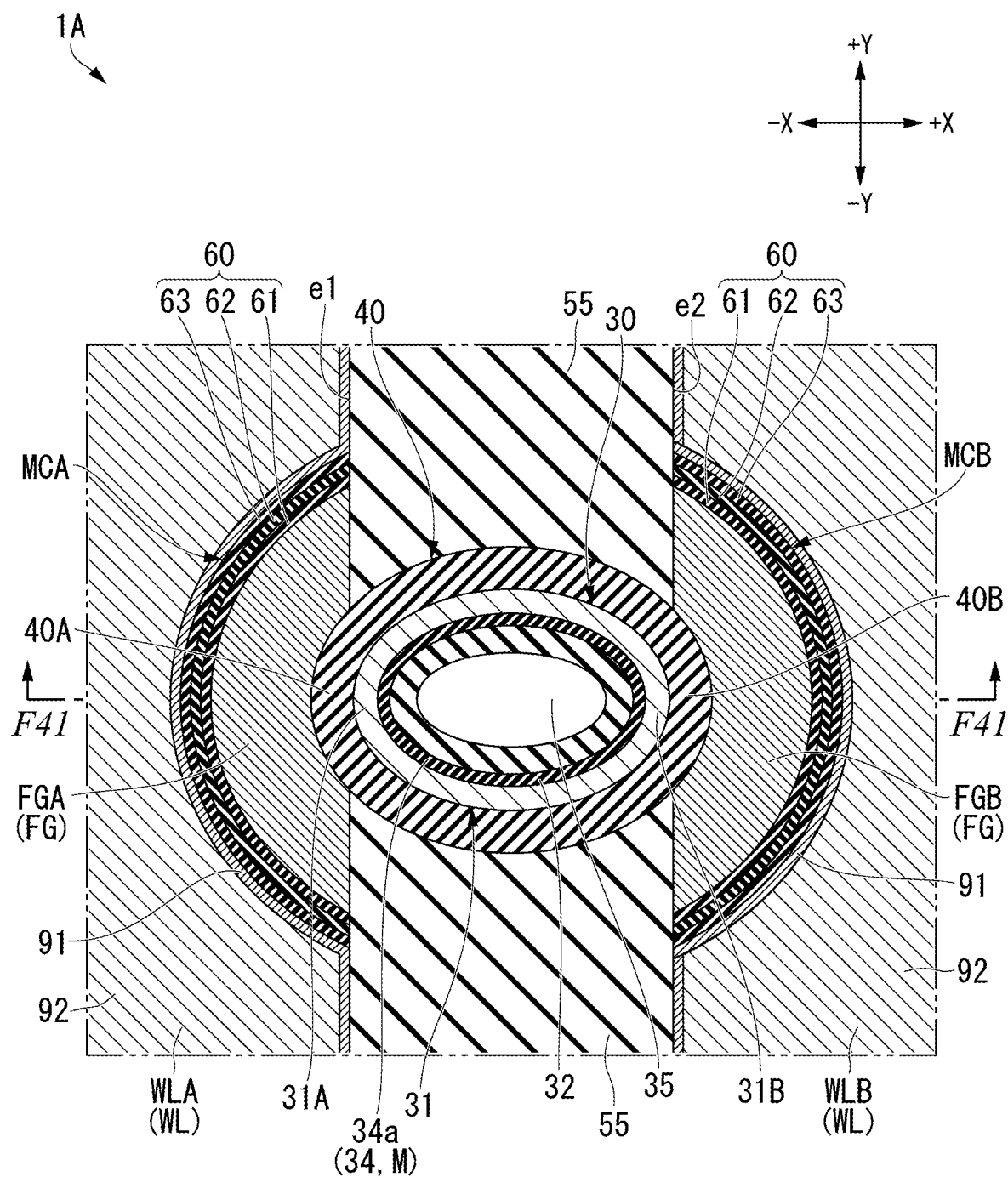
FIG. 40 is a perspective view illustrating a constitution of a semiconductor storage device of a second embodiment.
Figure 41:
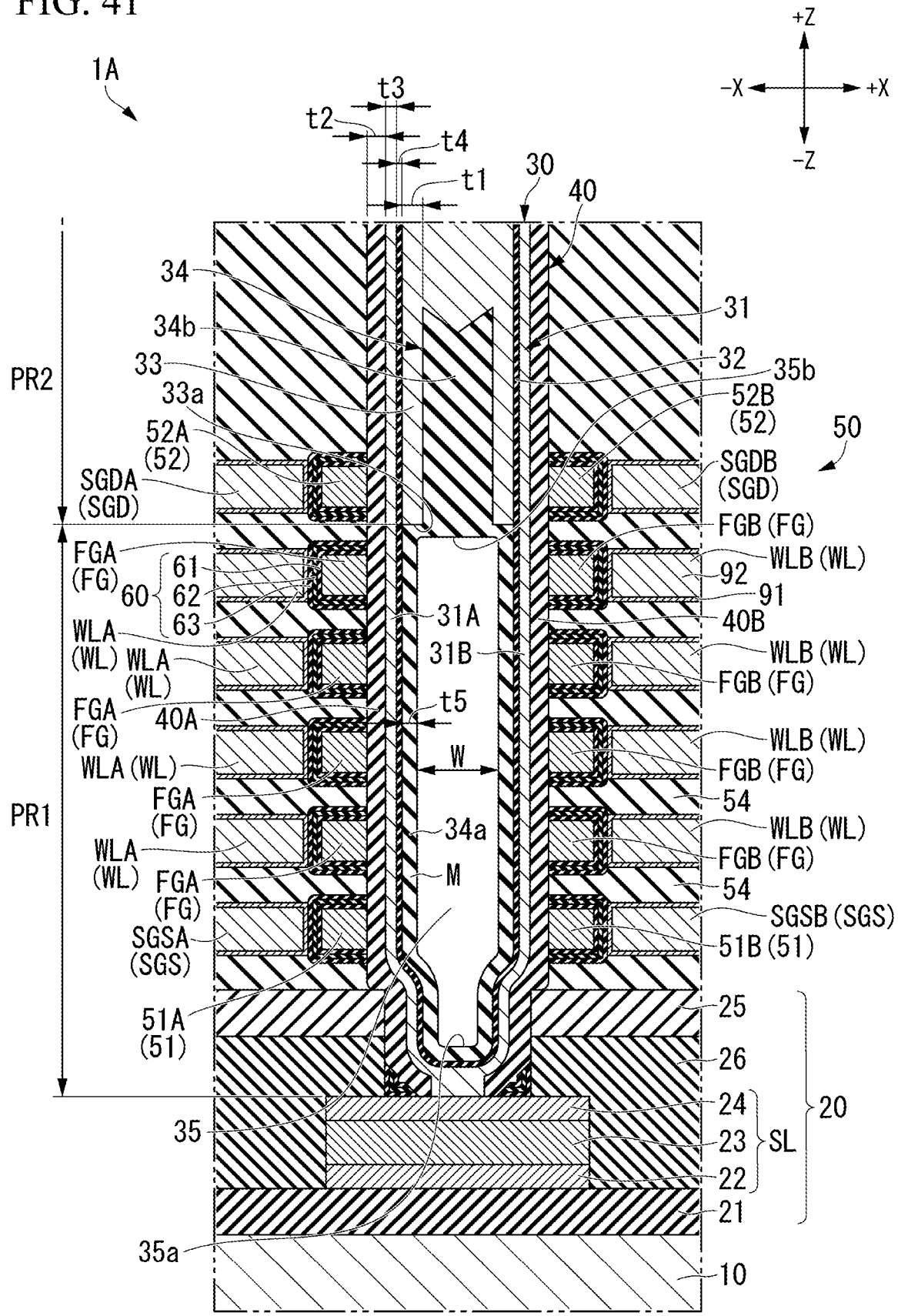
FIG. 41 is a sectional view taken along line F41-F41 of the semiconductor storage device illustrated in FIG. 40.

FIG. 40 is a sectional view illustrating a semiconductor storage device 1A of a second embodiment. FIG. 41 is a sectional view taken along line F41-F41 of the semiconductor storage device 1A illustrated in FIG. 40. In the present embodiment, each tunnel insulating film 40 and each pillar 30 are formed in an elliptical shape in which the X direction is a longitudinal direction. For example, an end of the tunnel insulating film 40 in the −X direction protrudes in the −X direction relative to an end face e1 of an insulating member 55 in the −X direction. Similarly, an end of the tunnel insulating film 40 in the +X direction protrudes in the +X direction relative to an end face e2 of the insulating member 55 in the +X direction. In the present embodiment, each of first floating gate electrodes FGA is formed in a circular arc shape along an outline of the end of the tunnel insulating film 40 in the −X direction. Similarly, each of second floating gate electrodes FGB is formed in a circular arc shape along an outline of the end of the tunnel insulating film 40 in the +X direction.

Figure 42:
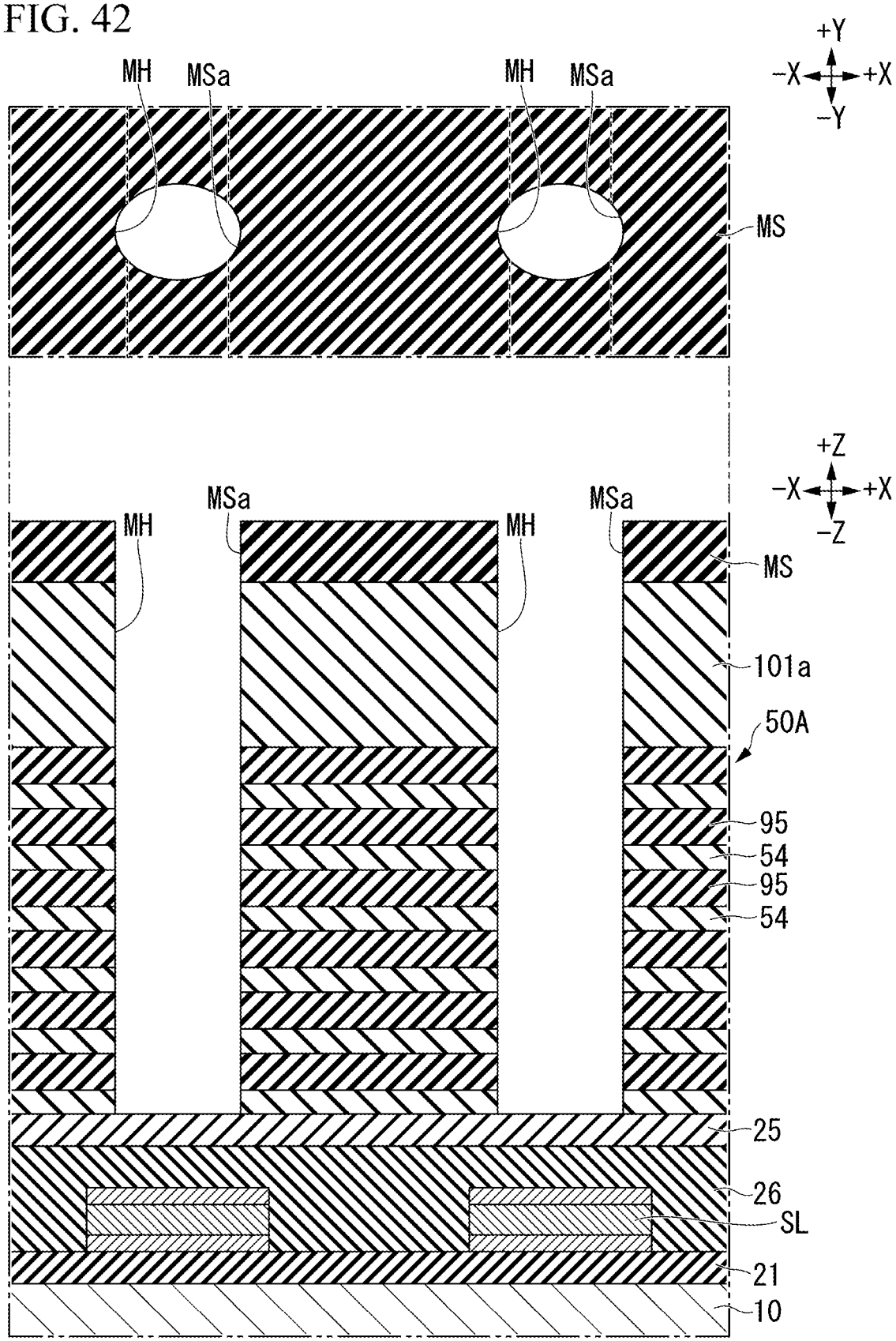
FIG. 42 is a view illustrating a method of fabricating the semiconductor storage device of the second embodiment.
Figure 43:
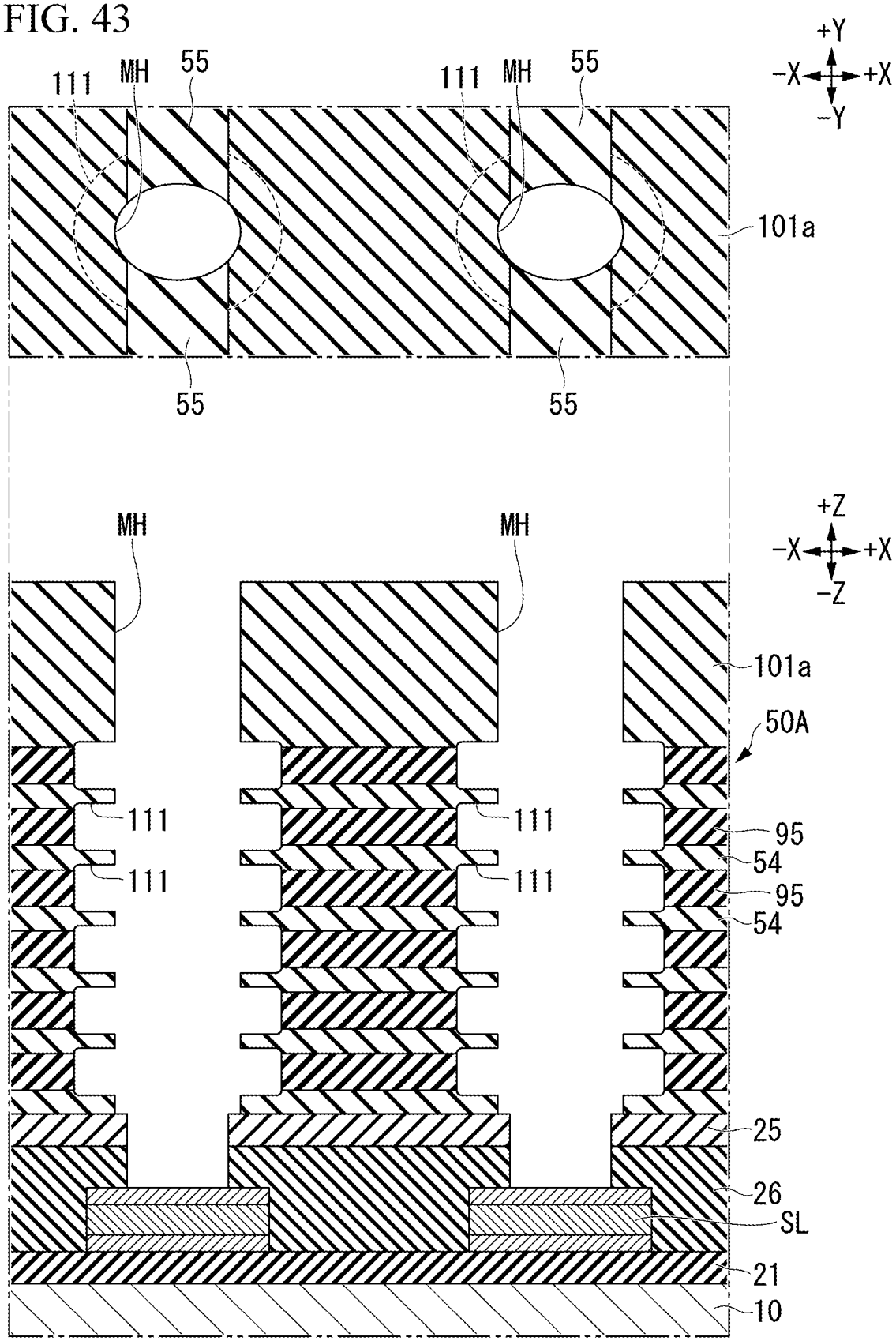
FIG. 43 is a view illustrating a method of fabricating the semiconductor storage device of the second embodiment.

Next, an example of a method of fabricating the semiconductor storage device 1A of the present embodiment will be described. FIG. 42 is a view of a process equivalent to FIG. 14 of the first embodiment. As illustrated in FIG. 42, in the present embodiment, a hard mask MS has elliptical openings MSa. For example, wet etching is performed using the hard mask MS as a mask, and portions of a laminated intermediate 50A which are exposed to the openings MSa of the hard mask MS are removed. In the present embodiment, an etchant by which a mask 101a under the hard mask MS is also removed is used. For this reason, as illustrated in FIG. 42, insulating films 54 and filling films 95 located immediately under the openings MSa of the hard mask MS are removed. Next, processes equivalent to FIGS. 15 and 16 of the first embodiment are performed. FIG. 43 is a view of the process equivalent to FIG. 17 of the first embodiment. As illustrated in FIG. 43, wet etching using, for example, a hot phosphoric acid ($H_3PO_4$) that is a chemical liquid dissolving silicon nitride as an etchant is performed via memory holes MH, portions of the filling films 95 which are close to the memory holes MH are removed, and dents 111 are formed in lateral surfaces of the memory holes MH. Afterward, processes equivalent to FIGS. 18 to 34 of the first embodiment are performed. Thereby, the semiconductor storage device 1A is formed.

According to this constitution, like the first embodiment, the semiconductor storage device 1A whose electrical characteristics are improved can be provided.

Third Embodiment

Next, a third embodiment will be described. The third embodiment is different from the first embodiment in which each floating gate electrode FG is formed in a fan shape when viewed in the Z direction. A constitution other than a constitution described below is the same as in the first embodiment.

Figure 44:
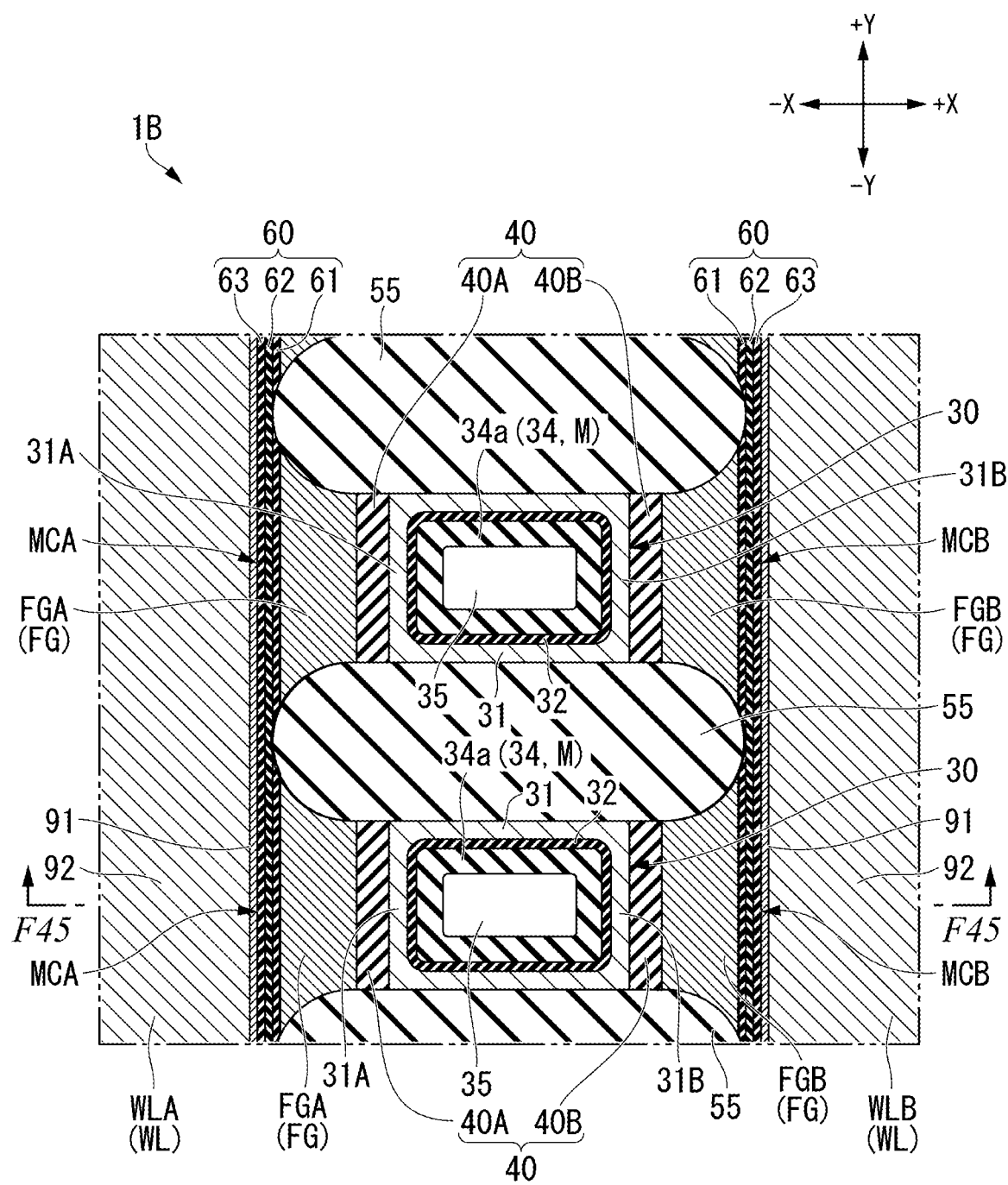
FIG. 44 is a perspective view illustrating a constitution of a semiconductor storage device of a third embodiment.
Figure 45:
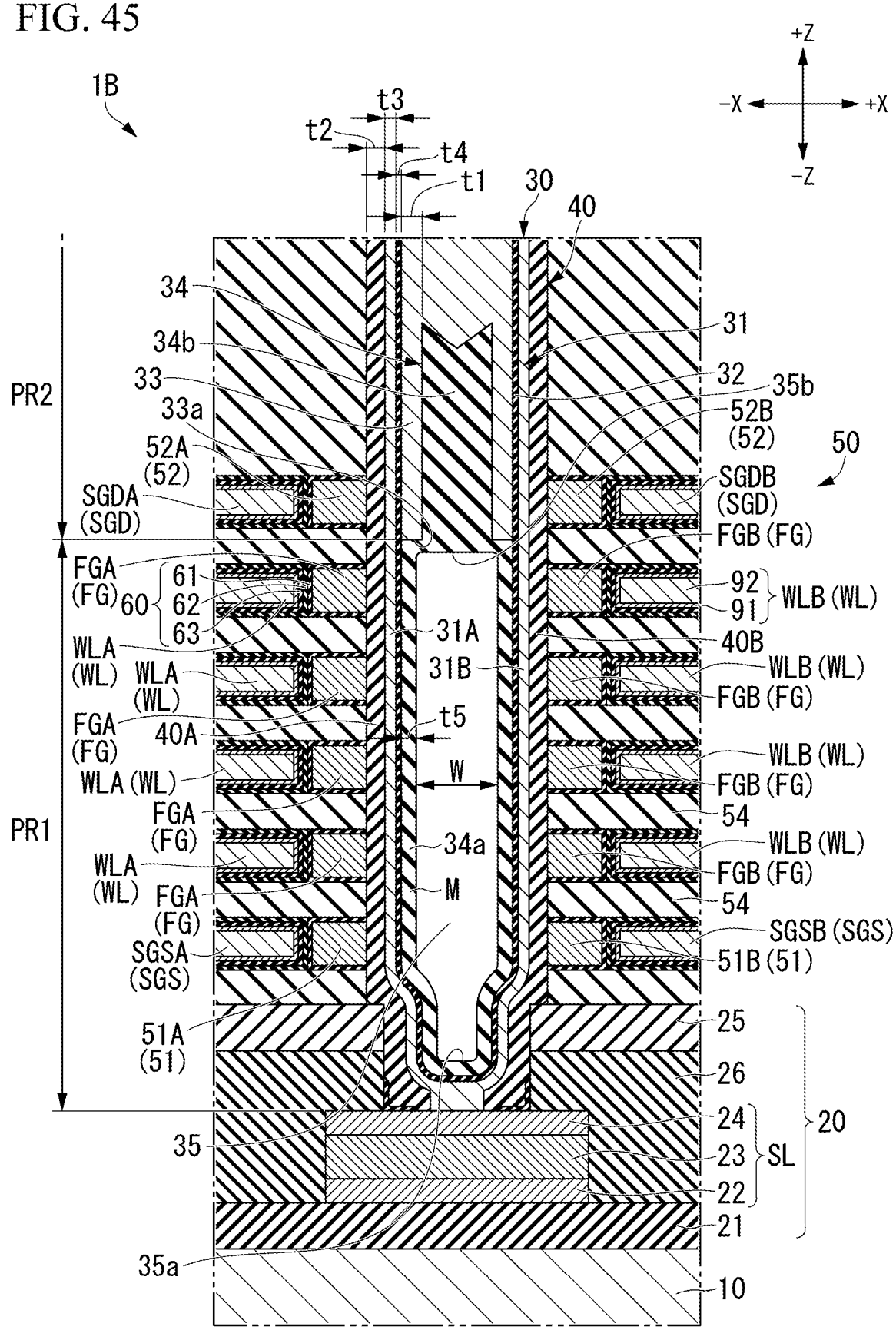
FIG. 45 is a sectional view taken along line F45-F45 of the semiconductor storage device illustrated in FIG. 44.

FIG. 44 is a sectional view illustrating a semiconductor storage device 1B of a third embodiment. FIG. 45 is a sectional view taken along line F45-F45 of the semiconductor storage device 1B illustrated in FIG. 44. In the present embodiment, tunnel insulating films 40 are not formed in a ring shape, and are provided on a lateral surface of each pillar 30 in the −X direction and a lateral surface of each pillar 30 in the +X direction. Further, first floating gate electrodes FGA are formed in a fan shape, a width of which in the Y direction is widened toward first word lines WLA. Second floating gate electrodes FGB are formed in a fan shape, a width of which in the Y direction is widened toward second word lines WLB. In the present embodiment, second and third block insulating films 62 and 63 cover lateral surfaces of the floating gate electrodes FG, and are provided along boundaries between insulating films (interlayer insulating films) 54 and word lines WL (see FIG. 45).

Figure 46:
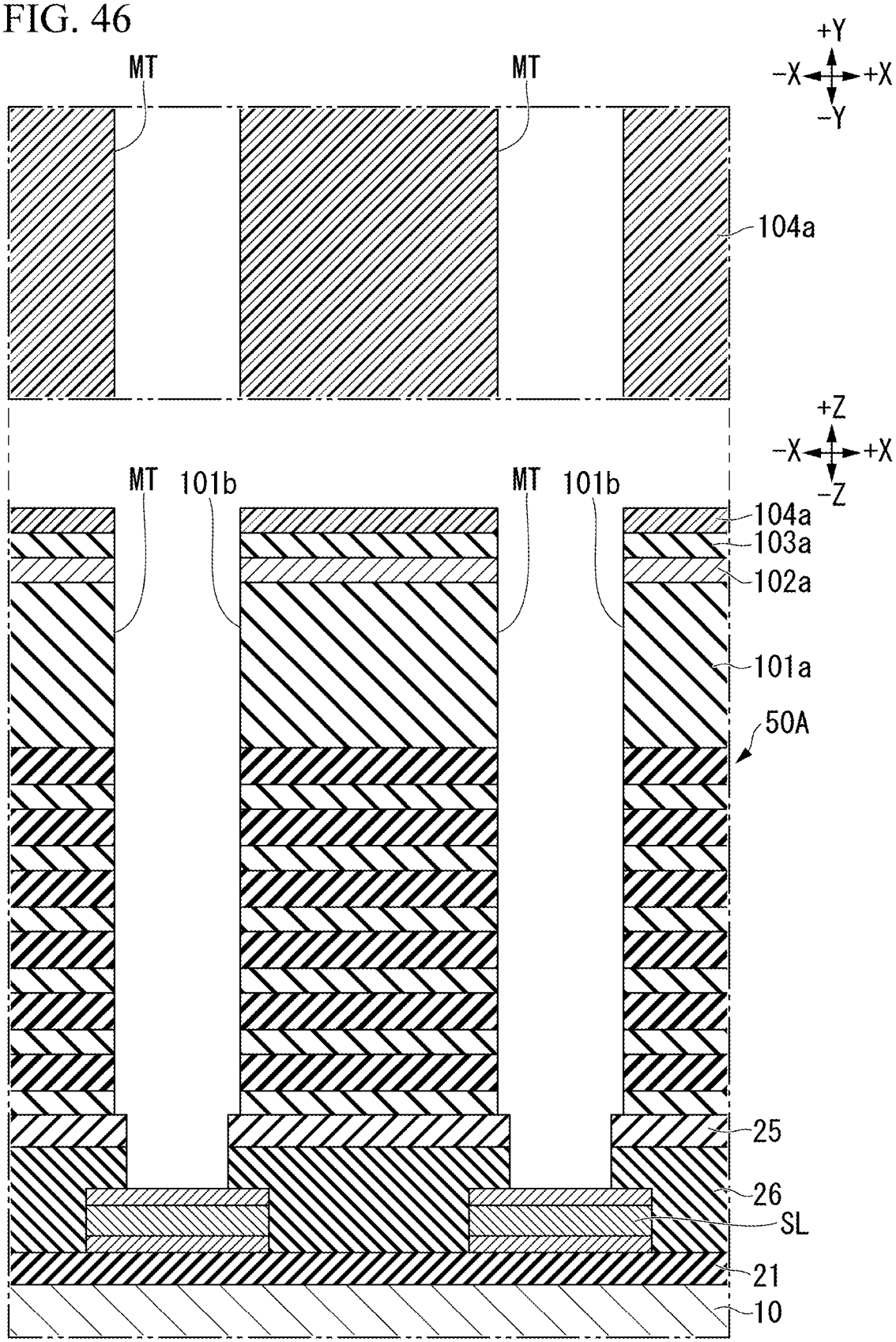
FIG. 46 is a view illustrating a method of fabricating the semiconductor storage device of the third embodiment.

Next, an example of a method of fabricating the semiconductor storage device 1B of the present embodiment will be described. In the present embodiment, processes including a process of forming a mask 101a (the process illustrated in FIG. 9) are the same as those of the first embodiment. FIG. 46 is a view of a process equivalent to FIG. 10 of the first embodiment. In the present embodiment, trenches that reach an upper insulating film 25 of a lower structure 20 are formed first, and then parts of the upper insulating film 25 and an insulating member 26 of the lower structure 20 are removed. Thereby, memory cell trenches MT that reach source lines SL are formed.

Figure 47:
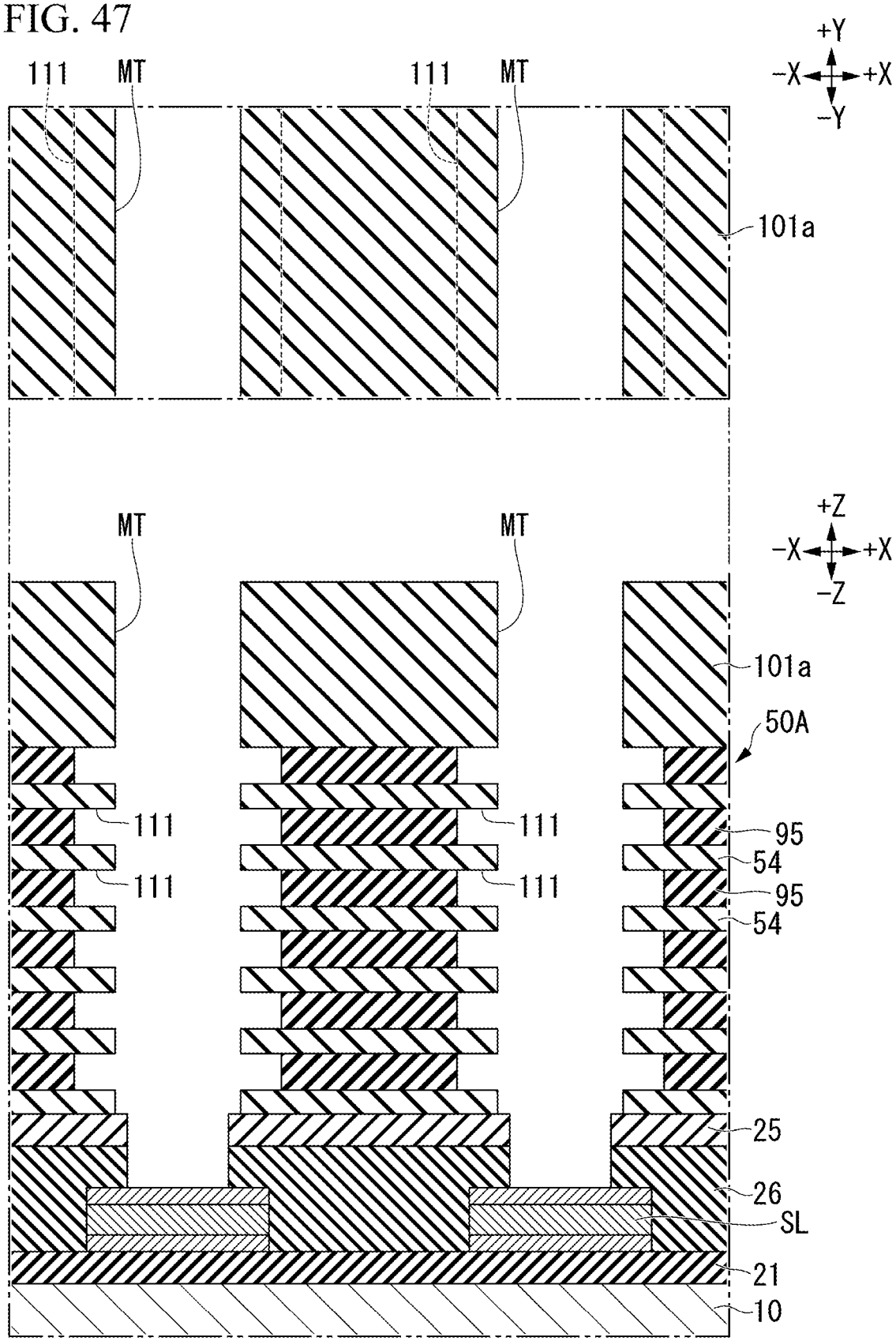
FIG. 47 is a view illustrating a method of fabricating the semiconductor storage device of the third embodiment.

Next, as illustrated in FIG. 47, wet etching using, for example, a hot phosphoric acid ($H_3PO_4$) that is a chemical liquid dissolving silicon nitride as an etchant is performed via the memory cell trenches MT. Thereby, portions of filling films 95 which are close to the memory cell trenches MT are removed, and dents 111 are formed in lateral surfaces of the memory cell trenches MT.

Figure 48:
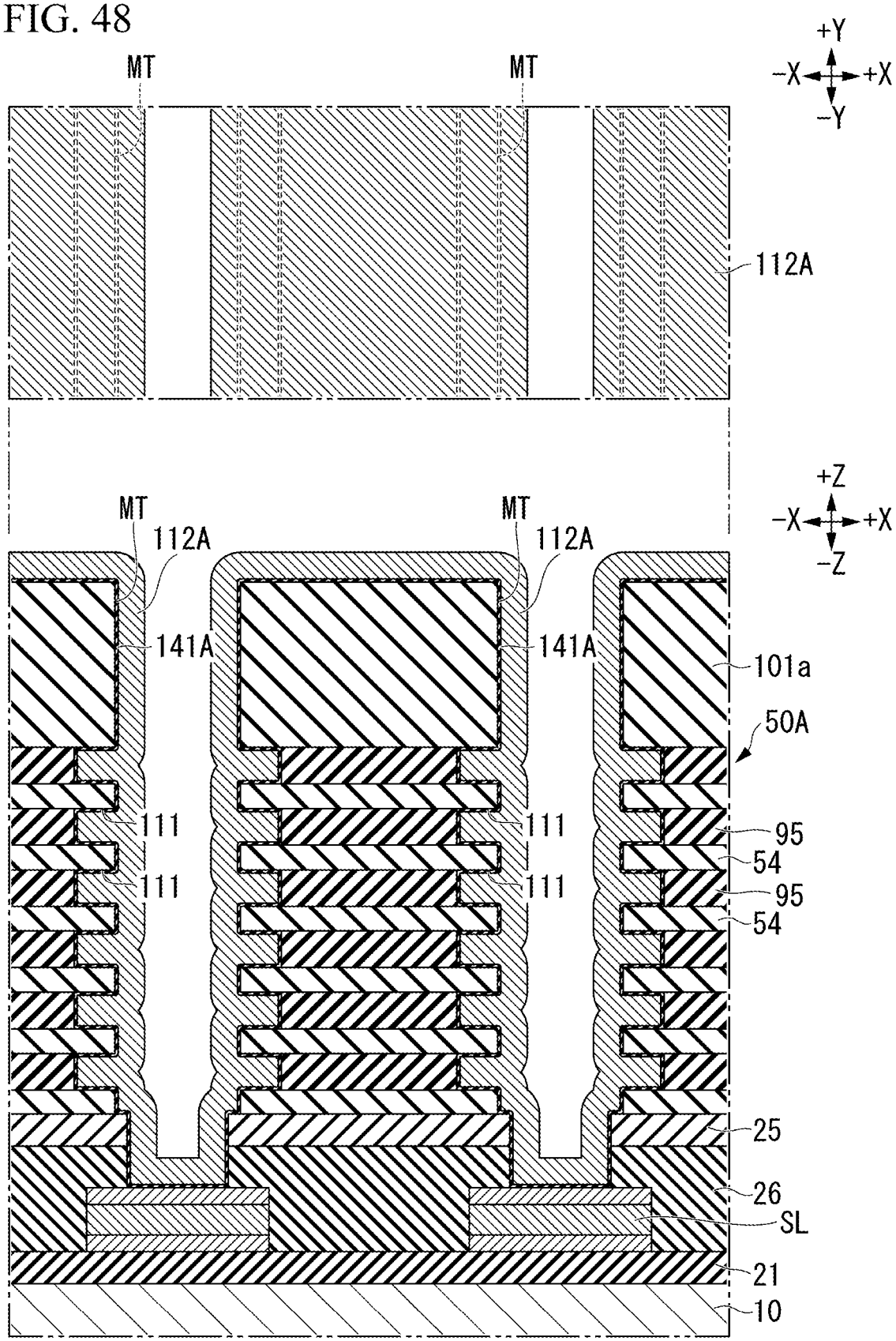
FIG. 48 is a view illustrating a method of fabricating the semiconductor storage device of the third embodiment.
Figure 49:
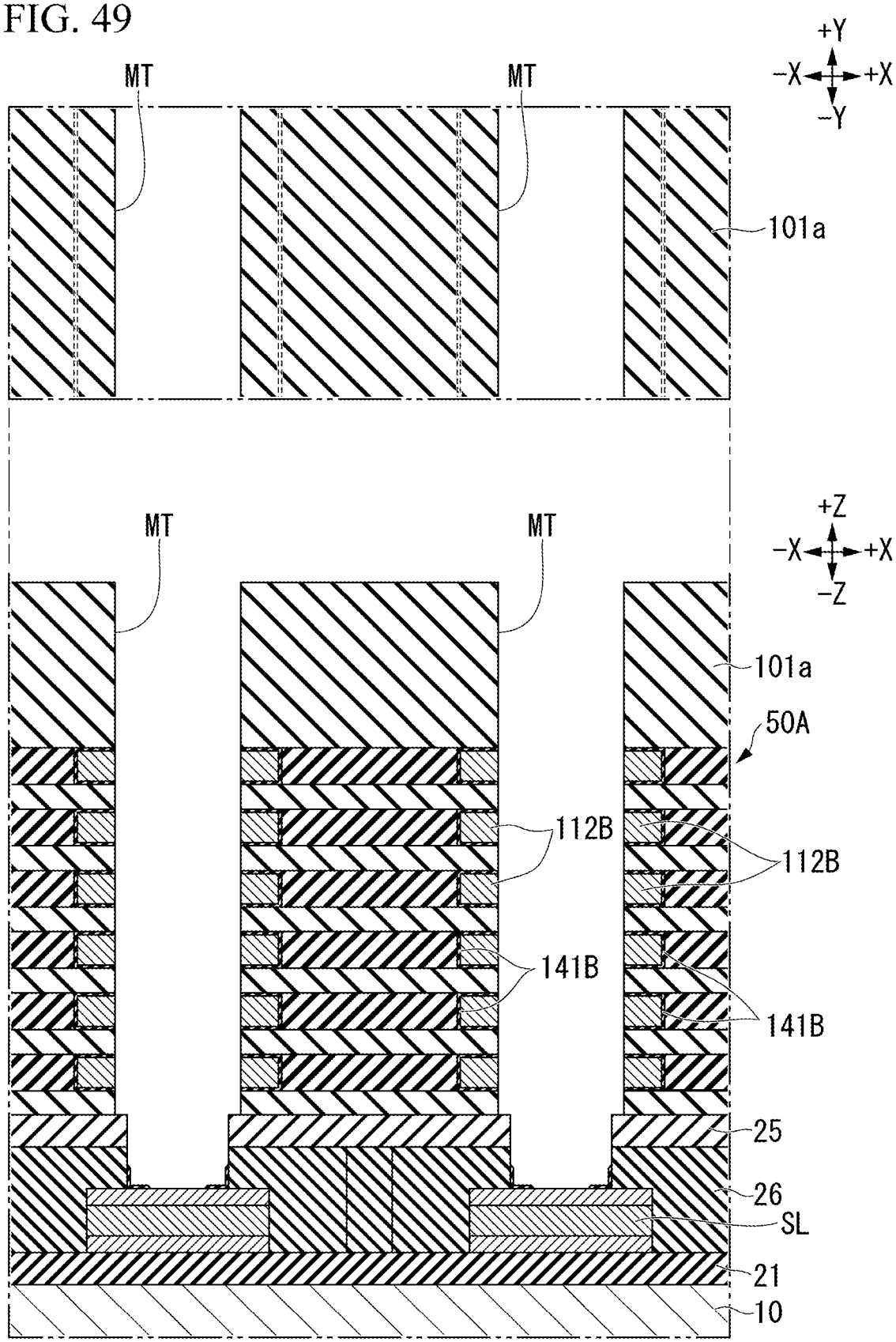
FIG. 49 is a view illustrating a method of fabricating the semiconductor storage device of the third embodiment.

Next, as illustrated in FIG. 48, for example, a block insulating film 141A is formed on inner surfaces of the memory cell trenches MT and inner surfaces of the dents 111. Next, floating gate electrode films 112A are formed on an inner circumferential surfaces of the block insulating films 141A by depositing, for example, polysilicon. Next, as illustrated in FIG. 49, the insulating material and the polysilicon are removed from inner surfaces of the memory cell trenches MT. Thereby, the block insulating film 141A becomes a plurality of block insulating films 141B divided in the Z direction. Further, the floating gate electrode film 112A becomes a plurality of floating gate electrode films 112B divided in the Z direction.

Figure 50:
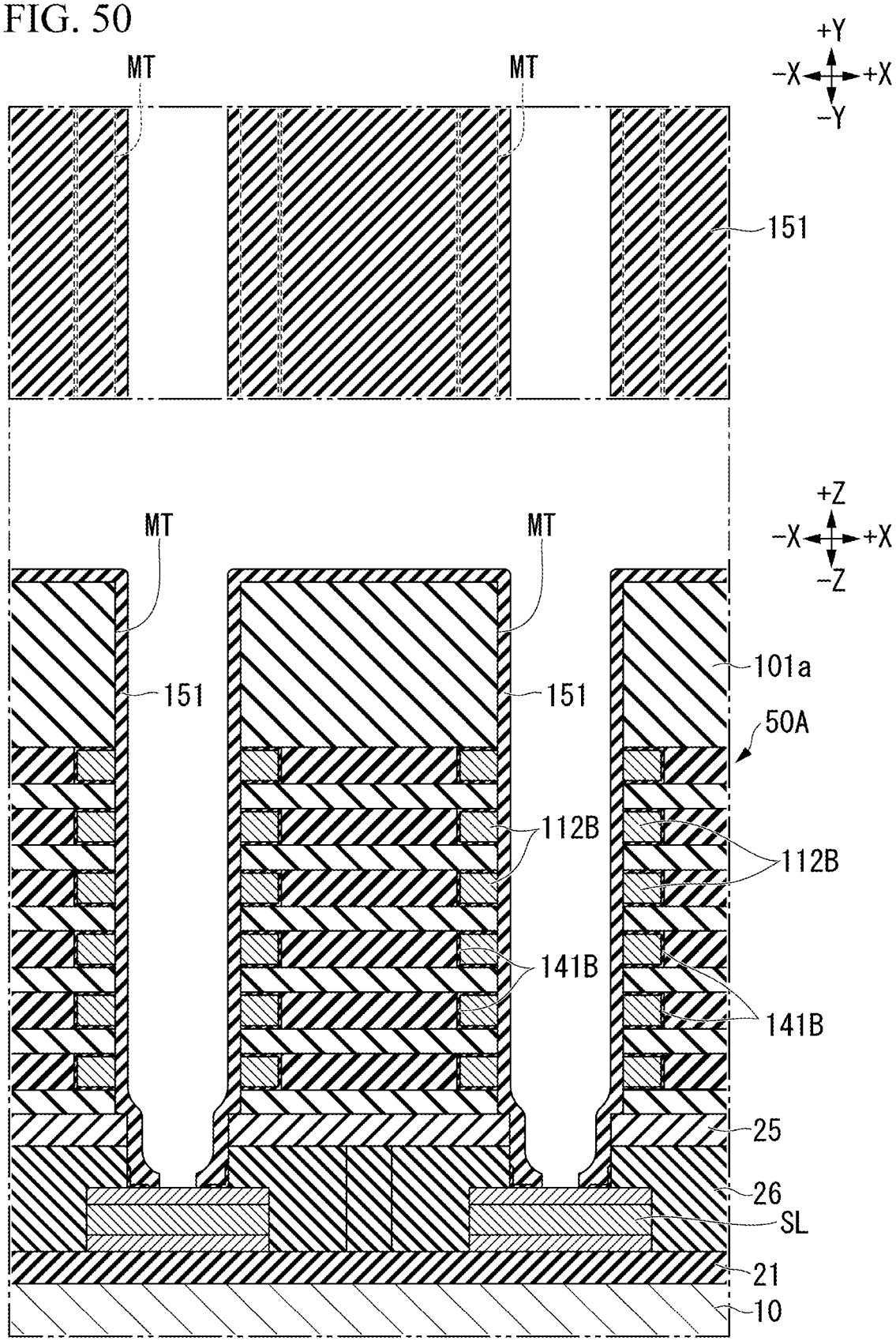
FIG. 50 is a view illustrating a method of fabricating the semiconductor storage device of the third embodiment.
Figure 51:
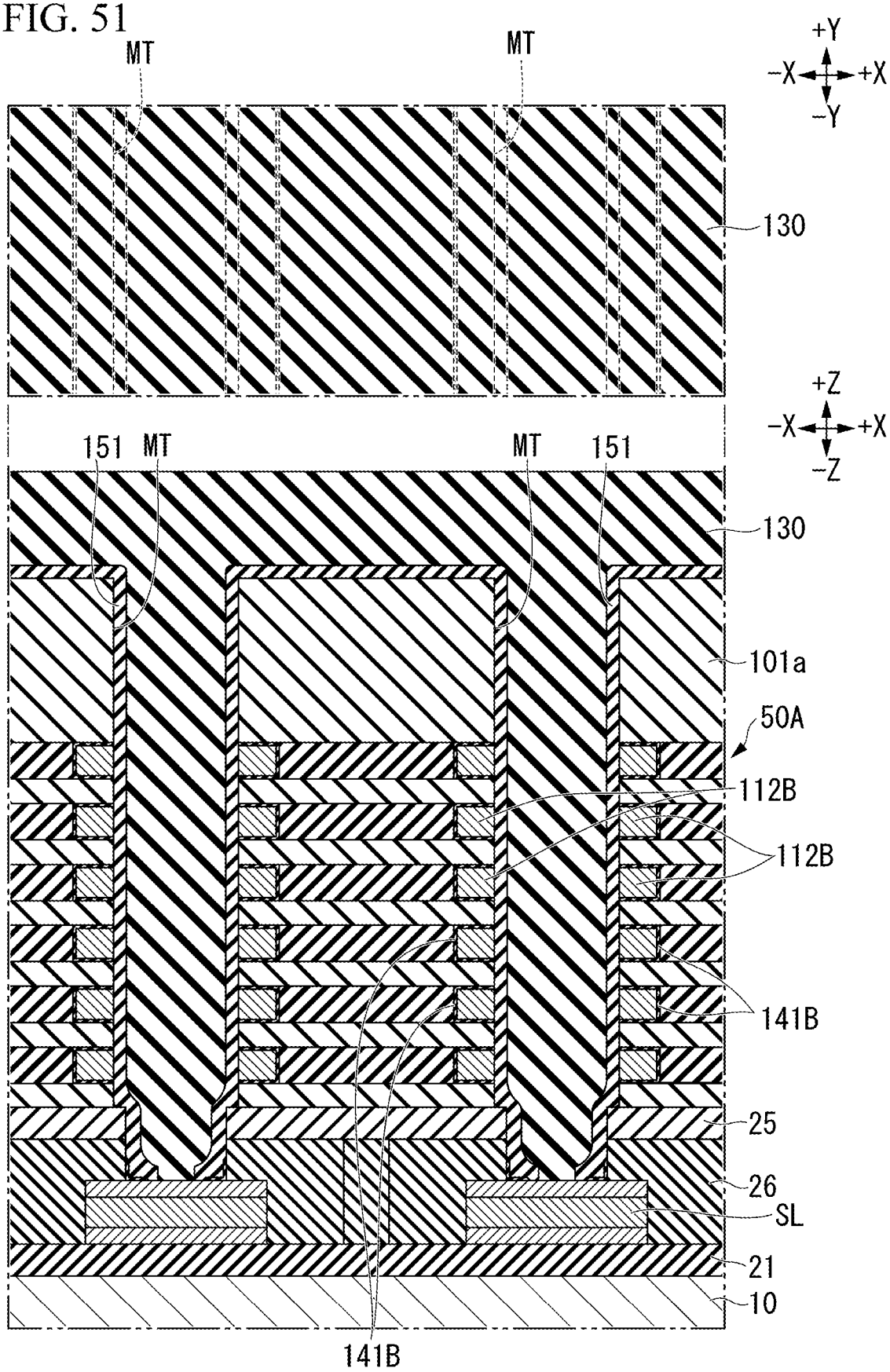
FIG. 51 is a view illustrating a method of fabricating the semiconductor storage device of the third embodiment.

Next, as illustrated in FIG. 50, a tunnel insulating film 151 is formed on the inner surfaces of the memory cell trenches MT by depositing, for example, silicon oxide. Next, as illustrated in FIG. 51, a sacrificial film 130 is formed by depositing an insulating material inside the tunnel insulating film 151.

Figure 52:
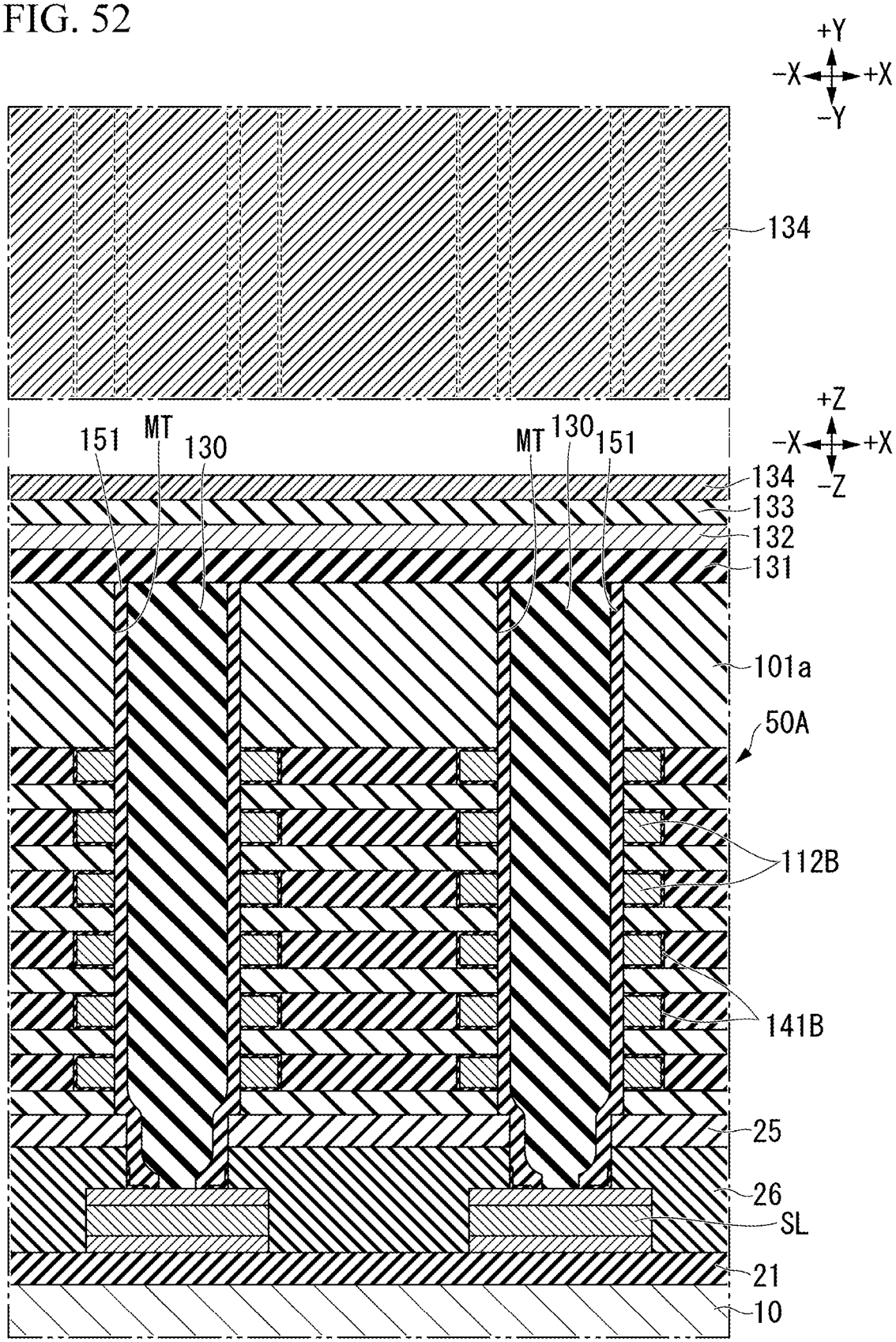
FIG. 52 is a view illustrating a method of fabricating the semiconductor storage device of the third embodiment.

Next, as illustrated in FIG. 52, the sacrificial film 130 is etched (e.g., performing etching-back), and an upper surface thereof is retracted to expose an upper surface of the tunnel insulating film 151 and an upper surface of the mask 101a. Next, silicon oxide ($SiO_2$) is deposited on the tunnel insulating film 151 and the mask 101a by, for example, a CVD method using dTEOS as a raw material, and thus a mask 131 is formed. Next, a pattern film 132, an ARC 133, and a resist film 134 are formed on the mask 131.

Figure 53:
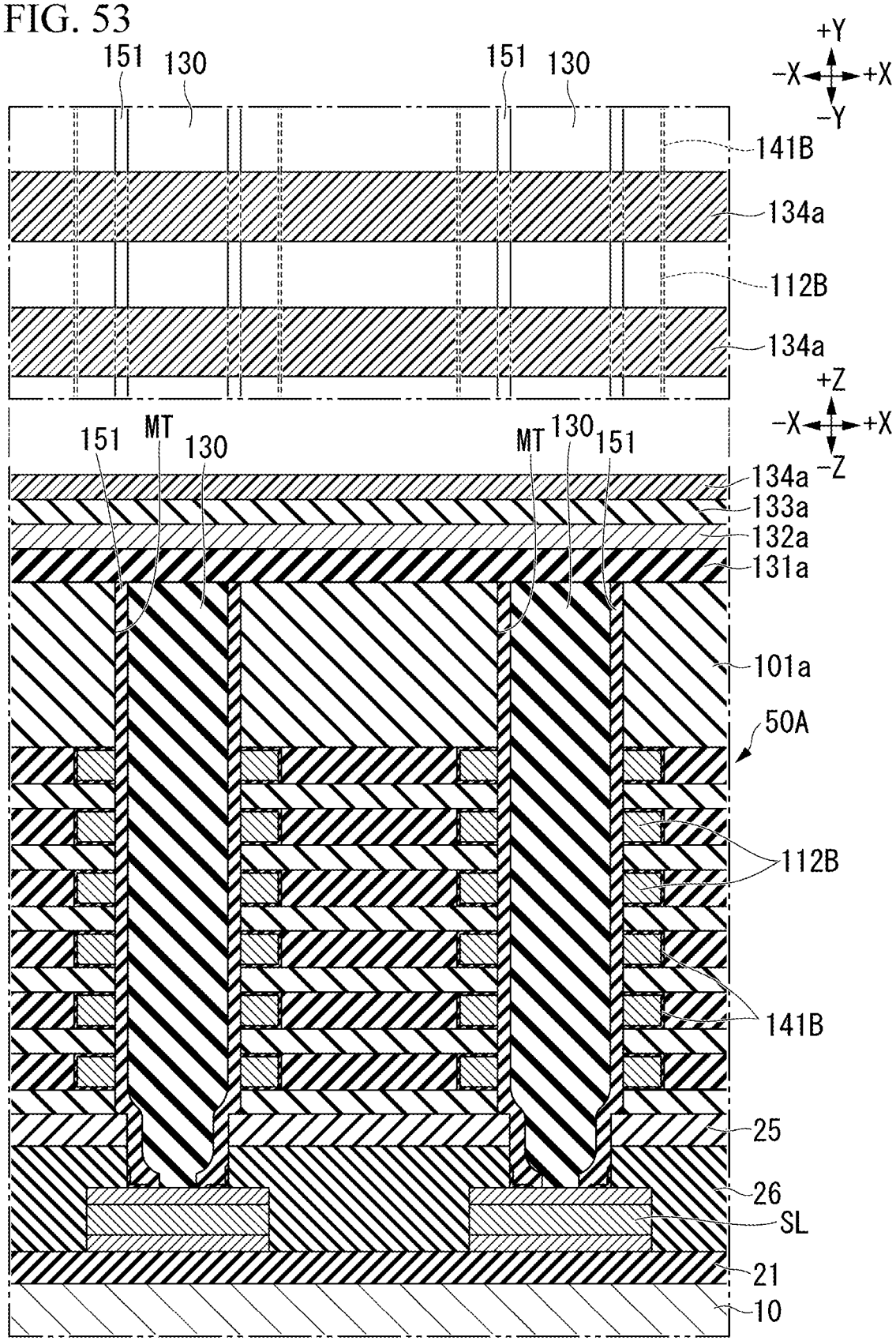
FIG. 53 is a view illustrating a method of fabricating the semiconductor storage device of the third embodiment.

Next, as illustrated in FIG. 53, resist patterns 134a that extend in the X direction and are separated from each other in the Y direction are formed by exposing and developing the resist film 134. Next, etching using the resist patterns 134a as masks is performed. Like the resist patterns 134a, the ARC 133 and the pattern film 132 are also divided into portions in the Y direction, and ARCs 133a and pattern films 132a are formed. Next, the mask 131 is patterned to form masks 131a. The masks 131a extend in the X direction, and are separated from each other in the Y direction. The masks 131a are intermittently arranged on immediate upper regions of the memory cell trenches MT in the Y direction.

Figure 54:
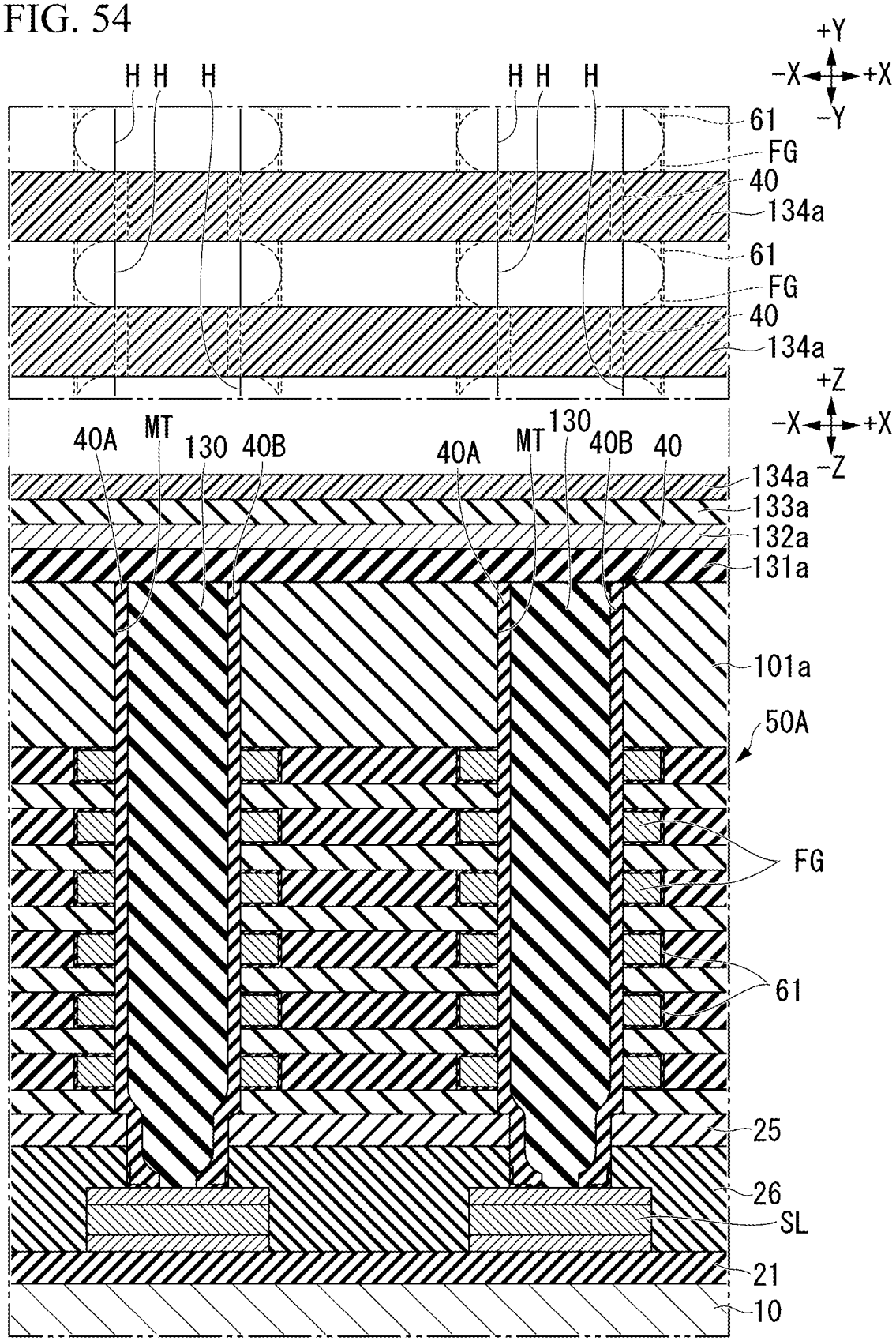
FIG. 54 is a view illustrating a method of fabricating the semiconductor storage device of the third embodiment.

Next, as illustrated in FIG. 54, for example, wet etching is performed using the mask 101a and the masks 131a as masks, and thereby hole parts H are formed to divide the tunnel insulating film 151 and the sacrificial film 130 in the Y direction. Thereby, the tunnel insulating film 151 and the insulating film 130 are divided in the Y direction. Thereby, the tunnel insulating film 151 becomes tunnel insulating films 40 divided in the Y direction.

Figure 55:
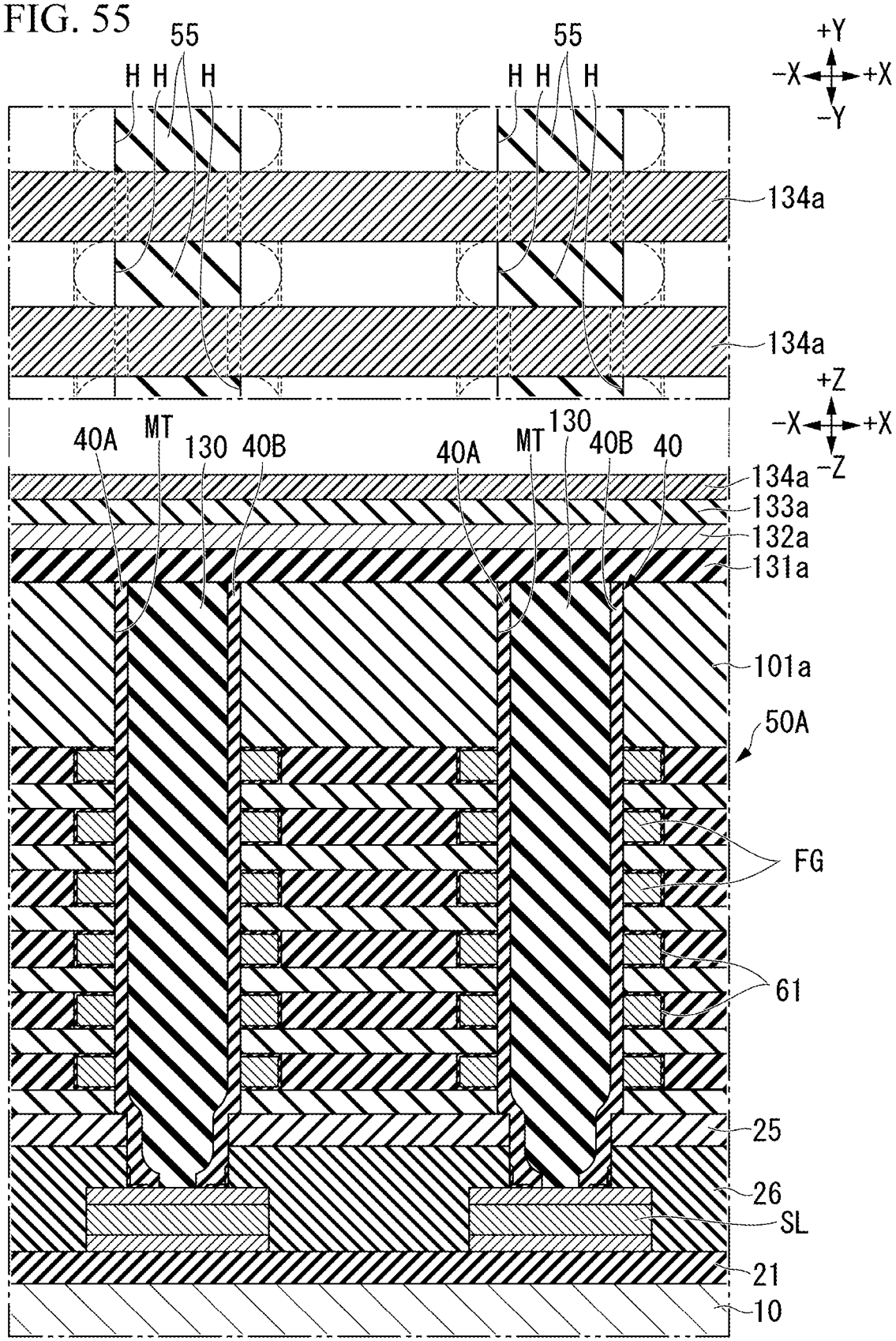
FIG. 55 is a view illustrating a method of fabricating the semiconductor storage device of the third embodiment.

Next, for example, isotropic etching is performed, and thereby the floating gate electrode films 112B and the block insulating films 141B adjacent to the hole parts H are selectively removed via the hole parts H. Thereby, the floating gate electrode films 112B and the block insulating films 141B are divided in the Y direction. Thereby, each floating gate electrode film 112B becomes a plurality of floating gate electrodes FG divided in the Y direction. Each block insulating film 141B becomes a plurality of first block insulating films 61 divided in the Y direction. Next, as illustrated in FIG. 55, an insulating material is deposited inside the hole parts H, and insulating members 55 are formed.

Next, the resist pattern 134a, the ARC 133a, the pattern film 132a, and the masks 131a are removed.

Figure 56:
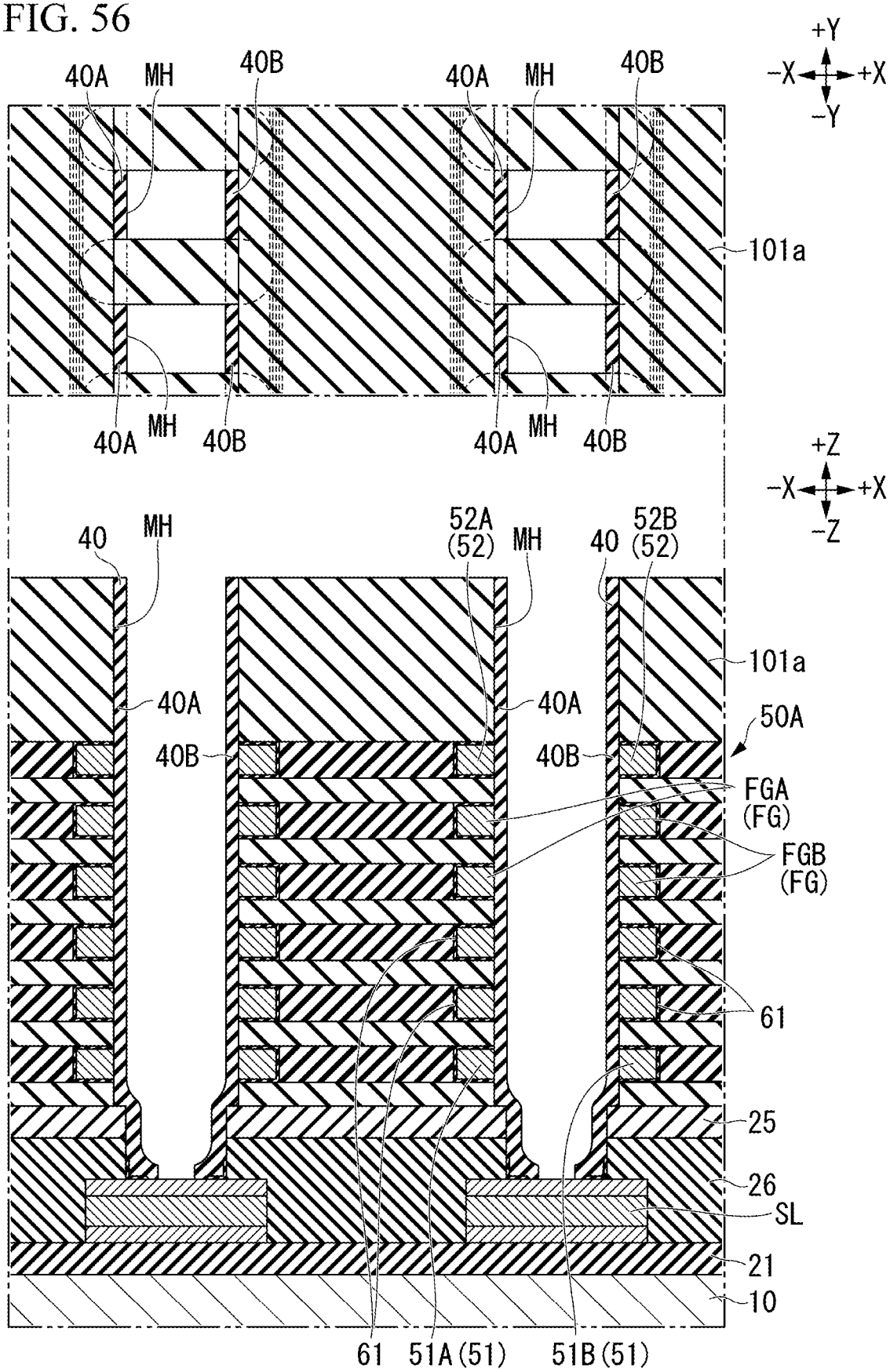
FIG. 56 is a view illustrating a method of fabricating the semiconductor storage device of the third embodiment.

Next, as illustrated in FIG. 56, the sacrificial film 130 that is located directly under the masks 131a and is protected by the masks 131a is removed by, for example, etching-back. Thereby, memory holes MH are formed between the first tunnel insulating films 40A and the second tunnel insulating films 40B. Afterward, processes equivalent to FIGS. 23 to 34 of the first embodiment are performed. In the present embodiment, the second and third block insulating films 62 and 63 are first formed in spaces from which the filling films 95 are removed, and then the word lines WL are formed.

According to this constitution, like the first embodiment, the semiconductor storage device 1B whose electrical characteristics are improved can be provided.

(Modifications of the First to Third Embodiments)

Figure 57:
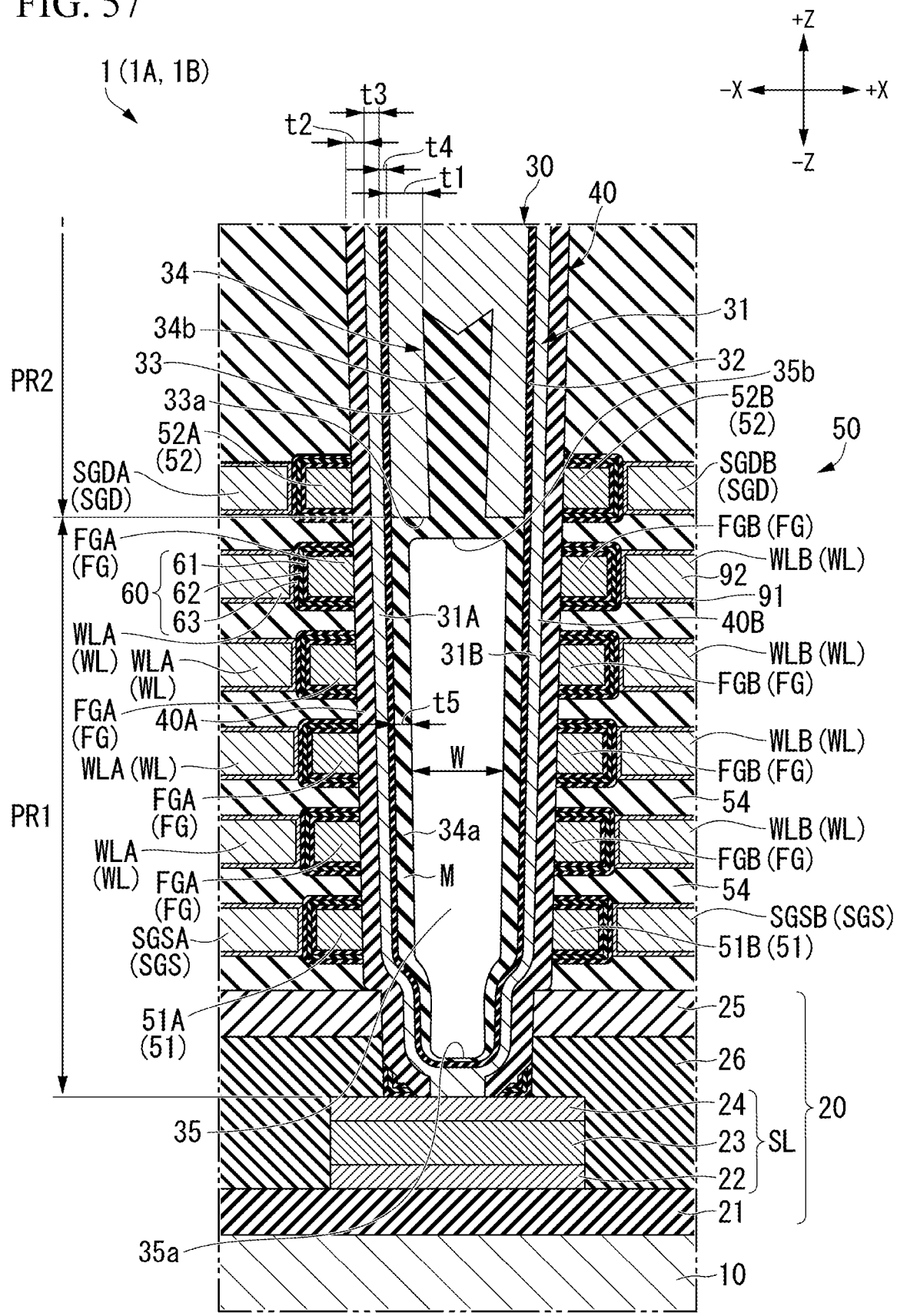
FIG. 57 is a sectional view illustrating modifications of the semiconductor storage devices of the first to third embodiments.

Next, modifications of the first to third embodiments will be described. FIG. 57 is a sectional view illustrating semiconductor storage devices 1, 1A and 1B of these modifications. In these modifications, a width of each pillar 30 in the X direction narrows downward. To be specific, each memory cell trench MT tapers off downward, for example, when the memory cell trench MT is formed. As a result, the width of the pillar 30 in the X direction narrows downward. In these modifications, thicknesses of block insulating films 60, channel parts 31, and insulating films 32 in the X direction are substantially the same at any portions in the Z direction. Similarly, a width of the pillar 30 in the Y direction may narrow downward.

As a result, a width of a hollow part 35 of the pillar 30 in the X direction gradually narrows downward. For example, the hollow part 35 has an inclination at which the width thereof in the X direction gradually narrows downward from an upper end to a lower end thereof. Similarly, a thickness of the hollow part 35 in the Y direction may be reduced downward.

On the other hand, a thickness of a first insulating part 34a of the pillar 30 in the X direction is gradually reduced downward. For example, the first insulating part 34a has an inclination at which the thickness thereof in the X direction is gradually reduced downward from an upper end to a lower end thereof. Similarly, a thickness of the first insulating part 34a in the Y direction may be reduced downward.

The first insulating part 34a can be formed by adjusting a coverage of the first insulating part 34a. In a case where the first insulating part 34a has the inclination as described above, it is easy to greatly secure the hollow part 35 over an entire length (a whole height) of the pillar 30.

While few embodiments and modifications have been described, the embodiments are not limited to the above examples. The aforementioned embodiments and modifications can be realized by a combination thereof. Further, the "charge storage parts" used herein are not limited to the floating gate electrodes FG as described above, and may be films that are formed of a silicon nitride film or another insulating film and have an ability to store electric charges. In this specification, the ordinal numbers such as "first" and "second" are for convenience of description, and may be appropriately added.

According to at least one embodiment described above, since each pillar includes the second portion formed in a hollow shape, the electrical characteristics of the semiconductor storage device can be improved.

Hereinafter, semiconductor storage devices and a method of fabricating semiconductor storage device are appended.

[1] A semiconductor storage device includes:

a first interconnection extending in a first direction;

a second interconnection extending in the first direction, the second interconnection being adjacent to the first interconnection in a second direction, the second direction intersecting the first direction;

a pillar between the first interconnection and the second interconnection, the pillar extending a third direction, the third direction intersecting the first direction and the second direction;

a first charge storage part between the first interconnection and the pillar;

a first insulating part between the first charge storage part and the pillar, a second charge storage part between the second interconnection and the pillar; and a second insulating part between the second charge storage part and the pillar, wherein the pillar includes a channel part and a hollow part, the channel part including a semiconductor material, the channel part faces the first charge storage part with the first insulating part interposed between the channel part and the first charge storage part, and the channel part faces the second charge storage part with the second insulating part interposed between the channel part and the second charge storage part, and the hollow part is on central side of the pillar relative to the channel part in the second direction.

[2] The semiconductor storage device according to [1], wherein the channel part is in an annulation shape, and the hollow part is on an inner circumferential side of the channel part.

[3] The semiconductor storage device according to [1], wherein a width of the hollow part in the second direction is greater than a thickness of the channel part in the second direction.

[4] The semiconductor storage device according to [I], wherein a width of the hollow part in the second direction is greater than a thickness of the first insulating part in the second direction.

[5] The semiconductor storage device according to [1] further includes:

a third interconnection extending in the first direction, the third interconnection being adjacent to the first interconnection in the third direction; and a third charge storage part between the third interconnection and the pillar, wherein the hollow part extends in the third direction at least over a position adjacent to the first charge storage part in the second direction and a position adjacent to the third charge storage part in the second direction.

[6] The semiconductor storage device according to [1] further includes:

a substrate; and a plurality of charge storage parts arranged in the third direction, the plurality of charge storage parts includes the first charge storage part, wherein a first end of the hollow part is closer to the substrate than at least a part of the charge storage part that is closest to the substrate among the plurality of charge storage parts.

[7] The semiconductor storage device according to [6] further includes a first select gate interconnection between the first interconnection and the substrate, wherein a first end of the hollow part is located closer to the substrate than at least a part of the first select gate interconnection.

[8] The semiconductor storage device according to [1] further includes:

a substrate; and a plurality of charge storage parts arranged in the third direction, the plurality of charge storage parts includes the first charge storage part, wherein a second end of the hollow part is farther from the substrate than at least a part of the charge storage part that is farthest from the substrate among the plurality of charge storage parts.

[9] The semiconductor storage device according to [1], wherein the pillar includes a first inner-pillar insulator between the channel part and the hollow part in the second direction, the first inner-pillar insulator including a material different from the semiconductor material.

[10] The semiconductor storage device according to [1] further includes a substrate, wherein the pillar includes a first region in which the hollow part is provided, and a second region located on a side opposite to the substrate with respect to the first region in the third direction, and the second region includes a annulation-shaped sidewall and a second inner-pillar insulator, the annulation-shaped sidewall being on a central side of the pillar relative to the channel part in the second direction, the second inner-pillar insulator including a material different from that of the sidewall, the second inner-pillar insulator being in contact with the sidewall.

[11] The semiconductor storage device according to [10] further includes a second select gate interconnection on a side opposite to the substrate with respect to the first interconnection in the third direction, wherein one end of the sidewall is closer to the substrate than at least a part of the second select gate interconnection.

[12] The semiconductor storage device according to [10], wherein a thickness of the sidewall in the second direction is greater than a thickness of the channel part in the second direction.

[13] The semiconductor storage device according to [10], wherein the pillar has a first inner-pillar insulator between the channel part and the hollow part in the second direction, the first inner-pillar insulator including a material different from the semiconductor material, and the second inner-pillar insulator is formed of the same material as the material of the first inner-pillar insulator.

[14] The semiconductor storage device according to [1] further includes a substrate, wherein the hollow part includes a portion in which a width of the hollow part in the second direction gets greater as a position of the hollow part is closer to the substrate.

[15] The semiconductor storage device according to [14], wherein the pillar has a first inner-pillar insulator between the channel part and the hollow part in the second direction, the first inner-pillar insulator including a material different from the semiconductor material, and the first inner-pillar insulator includes a portion in which a width of the first inner-pillar insulator in the second direction gets thinner as a position of the first inner-pillar insulator is closer to the substrate.

[16] A method of fabricating a semiconductor storage device including:

forming a laminated intermediate on a substrate, the laminated intermediate including a first interconnection region and a second interconnection region;

forming a hole part between the first interconnection region and the second interconnection region;

forming a first film having an insulation property inside the hole part;

forming a second film on an inner circumferential surface of the first film, the second film having a first region and a second region, the second region being on a side opposite to the substrate with respect to the first region, the second film including a semiconductor material;

forming a third film on an inner circumferential side of the second region of the second film; and embedding an inner circumferential side of the third film with a material different from that of the third film while leaving at least a part of a hollow part that is present on an inner circumferential side of the first region of the second film.

[17] The method of fabricating a semiconductor storage device according to [16], wherein the forming the third film is performed in a state in which a sacrificial film is provided on an inner circumferential side of the first region of the second film;

the sacrificial film is removed after the third film is formed; and the material different from that of the third film is embedded on the inner circumferential side of the third film while leaving at least a part of the hollow part on the inner circumferential side of the first region of the second film after the sacrificial film is removed.

[18] The method of fabricating a semiconductor storage device according to [16], wherein the forming the third film is performed in a state in which the hollow part is present on the inner circumferential side of the first region of the second film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a substrate;
   a first interconnection extending in a first direction;
   a second interconnection extending in the first direction, the second interconnection being adjacent to the first interconnection in a second direction, the second direction intersecting the first direction;
   a first channel part between the first interconnection and the second interconnection, the first channel part extending in a third direction, the third direction intersecting the first direction and the second direction;
   a second channel part between the first interconnection and the second interconnection, the second channel part being adjacent to the first channel part in the second direction, the second channel part extending in the third direction;
   a first charge storage part at a first position separated from a surface of the substrate by a first distance in the third direction, the first charge storage part being between the first interconnection and the first channel part;
   a first insulating part between the first charge storage part and the first channel part;
   a second charge storage part between the second interconnection and the second channel part;
   a second insulating part between the second charge storage part and the second channel part;
   a first select transistor at a second position separated from the surface of the substrate by a second distance in the third direction, the second distance being greater than the first distance;
   a second select transistor above the second charge storage part in the third direction; and
   a hollow part between the first channel part and the second channel part,
   wherein the hollow part is up to a third position separated from the surface of the substrate by a third distance in the third direction, the third distance being greater than or equal to the first distance and shorter than or equal to the second distance.

2. The semiconductor storage device according to claim 1, further comprising
   a third insulating part being between the first channel part and the hollow part in the second direction and being between the second channel part and the hollow part in the second direction.

3. The semiconductor storage device according to claim 1, further comprising:
   a sidewall above the third position, the sidewall being between the first channel part and the second channel part; and
   a fourth insulating part including a material different from that of the sidewall, the fourth insulating part being in contact with the sidewall.

4. The semiconductor storage device according to claim 3, wherein
   an end of the sidewall is closer to the substrate than at least a part of the first select transistor.

5. The semiconductor storage device according to claim 1, wherein
   the hollow part is deep to a fourth position separated from the surface of the substrate by a forth distance in the third direction, the forth distance being shorter than the first distance.

6. The semiconductor storage device according to claim 1, further comprising
   a third select transistor between the substrate and the first charge storage part.

7. The semiconductor storage device according to claim 6, further comprising
   a plurality of charge storage parts between the first charge storage part and the third select transistor, the plurality of charge storage parts being arranged in the third direction.

8. The semiconductor storage device according to claim 6, wherein
   the hollow part is deep to a fourth position separated from the surface of the substrate by a forth distance in the third direction, the forth distance being shorter than the first distance, and
   the third select transistor is above the fourth position in the third direction.

9. The semiconductor storage device according to claim 1, wherein
   the hollow part has a first width in the second direction at the third position, the hollow part has a second width in the second direction at a position that is closer to the substrate than the third position, and the first width is greater than the second width.

10. A semiconductor storage device comprising:
    a substrate;
    a first interconnection extending in a first direction;
    a second interconnection extending in the first direction, the second interconnection being adjacent to the first interconnection in a second direction, the second direction intersecting the first direction;
a first channel part between the first interconnection and the second interconnection, the first channel part extending in a third direction, the third direction intersecting the first direction and the second direction;
a second channel part between the first interconnection and the second interconnection, the second channel part being adjacent to the first channel part in the second direction, the second channel part extending in the third direction;
a first charge storage part at a first position separated from a surface of the substrate by a first distance in the third direction, the first charge storage part being between the first interconnection and the first channel part;
a first insulating material between the first charge storage part and the first channel part, the first insulating part having a first insulation property, the first insulating part having a first thickness in the second direction;
a second charge storage part between the second interconnection and the second channel part;
a second insulating material between the second charge storage part and the second channel part, the second insulating material having the first insulation property;
a first select transistor at a second position separated from the surface of the substrate by a second distance in the third direction, the second distance being greater than the first distance;
a second select transistor above the second charge storage part in the third direction; and
a third insulating material between the first channel part and the second channel part, the third insulating material having a second insulation property higher than the first insulation property, the third insulating material having a second thickness in the second direction, the second thickness being greater than the first thickness,
wherein the third insulating material is up to a third position separated from the surface of the substrate by a third distance in the third direction, the third distance being greater than or equal to the first distance and shorter than or equal to the second distance.

11. The semiconductor storage device according to claim 10, wherein
the third insulating material is gas.

12. The semiconductor storage device according to claim 10, further comprising
a fourth insulating material being between the first channel part and the third insulating material in the second direction and being between the second channel part and the third insulating material in the second direction.

13. The semiconductor storage device according to claim 10, further comprising:
a sidewall above the third position, the sidewall being between the first channel part and the second channel part; and
a fifth insulating material including a material different from that of the sidewall, the fifth insulating material having an insulation property lower than the second insulation property, the fifth insulating material being in contact with the sidewall.

14. The semiconductor storage device according to claim 13, wherein
an end of the sidewalls is closer to the substrate than at least a part of the first select transistor.

15. The semiconductor storage device according to claim 10, further comprising
a third select transistor between the substrate and the first charge storage part.

16. The semiconductor storage device according to claim 15, further comprising
a plurality of charge storage parts between the first charge storage part and the third select transistor, the plurality of charge storage parts being arranged in the third direction.

17. The semiconductor storage device according to claim 15, wherein
the third insulating material is deep to a fourth position separated from the surface of the substrate by a forth distance in the third direction, the forth distance being shorter than the first distance, and
the third select transistor is above the fourth position in the third direction.

18. The semiconductor storage device according to claim 10, wherein
the third insulating material has a first width in the second direction at the third position, the third insulating material has a second width in the second direction at a position that is closer to the substrate than the third position, and the first width is greater than the second width.

19. A semiconductor storage device comprising:
a substrate;
a first interconnection extending in a first direction;
a second interconnection extending in the first direction, the second interconnection being adjacent to the first interconnection in a second direction, the second direction intersecting the first direction;
a first channel part between the first interconnection and the second interconnection, the first channel part extending in a third direction, the third direction intersecting the first direction and the second direction;
a second channel part between the first interconnection and the second interconnection, the second channel part being adjacent to the first channel part in the second direction, the second channel part extending in the third direction;
a first charge storage part at a first position separated from a surface of the substrate by a first distance in the third direction, the first charge storage part being between the first interconnection and the first channel part;
a first insulating part between the first charge storage part and the first channel part;
a second charge storage part between the second interconnection and the second channel part;
a second insulating part between the second charge storage part and the second channel part;
a first select transistor at a second position separated from the surface of the substrate by a second distance in the third direction, the second distance being greater than the first distance;
a second select transistor above the second charge storage part in the third direction; and
a hollow part between the first channel part and the second channel part, the hollow part being below the second position.

20. The semiconductor storage device according to claim 19, further comprising
a third select transistor between the substrate and the first charge storage part,
wherein
the hollow part is up to a third position separated from the surface of the substrate by a third distance in the third direction, the third distance being shorter than the first distance, and
the third select transistor is above the third position in the third direction.

* * * * *